(12) United States Patent
Nowatari et al.

(10) Patent No.: US 9,496,505 B2
(45) Date of Patent: Nov. 15, 2016

(54) COMPOSITE MATERIAL, LIGHT-EMITTING ELEMENT, LIGHT-EMITTING DEVICE, ELECTRONIC DEVICE, AND LIGHTING DEVICE

(75) Inventors: Hiromi Nowatari, Kanagawa (JP); Satoshi Seo, Kanagawa (JP); Harue Osaka, Kanagawa (JP); Takako Takasu, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 129 days.

(21) Appl. No.: 13/241,694

(22) Filed: Sep. 23, 2011

(65) Prior Publication Data
US 2012/0080667 A1 Apr. 5, 2012

(30) Foreign Application Priority Data

Oct. 4, 2010 (JP) .................................. 2010-225037
May 31, 2011 (JP) .................................. 2011-122827

(51) Int. Cl.
H01L 51/54 (2006.01)
C09K 11/06 (2006.01)
H01L 51/00 (2006.01)
(Continued)

(52) U.S. Cl.
CPC ........... *H01L 51/0072* (2013.01); *C09K 11/06* (2013.01); *H01L 51/0052* (2013.01); *H01L 51/0073* (2013.01); *H01L 51/0074* (2013.01); *H05B 33/14* (2013.01); *C09K 2211/1007* (2013.01); *C09K 2211/1011* (2013.01); *C09K 2211/1088* (2013.01); *C09K 2211/1092* (2013.01); *H01L 51/5048* (2013.01); *H01L 2251/303* (2013.01)

(58) Field of Classification Search
None
See application file for complete search history.

(56) References Cited

U.S. PATENT DOCUMENTS 5,989,737 A 11/1999 Xie et al.
6,013,384 A 1/2000 Kido et al.
6,172,459 B1 1/2001 Hung et al.
(Continued)

FOREIGN PATENT DOCUMENTS

CN 101627102 A 1/2010
CN 102449800 A 5/2012
(Continued)

OTHER PUBLICATIONS

International Search Report re application No. PCT/JP2011/071165, dated Dec. 13, 2011.
(Continued)

*Primary Examiner* — J. L. Yang
(74) *Attorney, Agent, or Firm* — Husch Blackwell LLP

(57) ABSTRACT

A composite material including an organic compound and an inorganic compound and having a high carrier-transport property is provided. A composite material having a high carrier-injection property to an organic compound is provided. A composite material in which light absorption due to charge transfer interaction is unlikely to occur is provided. A light-emitting element having high emission efficiency is provided by including the composite material. A light-emitting element having a low drive voltage is provided. A light-emitting element having a long lifetime is provided. A composite material including a heterocyclic compound having a dibenzothiophene skeleton or a dibenzofuran skeleton and an inorganic compound exhibiting an electron-accepting property with respect to the heterocyclic compound is provided.

8 Claims, 35 Drawing Sheets

(51) Int. Cl.
H05B 33/14 (2006.01)
H01L 51/50 (2006.01)

(56) References Cited

U.S. PATENT DOCUMENTS

| | | | |
|---|---|---|---|
| 6,486,601 | B1 | 11/2002 | Sakai et al. |
| 6,589,673 | B1 | 7/2003 | Kido et al. |
| 7,462,883 | B2 | 12/2008 | Kumaki et al. |
| 7,598,670 | B2 | 10/2009 | Kumaki et al. |
| 7,605,534 | B2 | 10/2009 | Yamazaki et al. |
| 7,732,808 | B2 | 6/2010 | Ikeda et al. |
| 7,940,002 | B2 | 5/2011 | Kumaki et al. |
| 7,964,891 | B2 | 6/2011 | Kumaki et al. |
| 7,977,865 | B2 | 7/2011 | Suzuki et al. |
| 7,985,974 | B2 | 7/2011 | Nowatari et al. |
| 7,989,802 | B2 | 8/2011 | Nagao et al. |
| 8,007,927 | B2 | 8/2011 | Lin et al. |
| 8,221,905 | B2 | 7/2012 | Lin et al. |
| 8,344,621 | B2 | 1/2013 | Kumaki et al. |
| 8,367,850 | B2 | 2/2013 | Ma et al. |
| 8,580,402 | B2 | 11/2013 | Lin et al. |
| 8,586,197 | B2 | 11/2013 | Yamazaki et al. |
| 8,586,204 | B2 | 11/2013 | Xia et al. |
| 8,618,574 | B2 | 12/2013 | Kumaki et al. |
| 8,652,652 | B2 | 2/2014 | Brooks et al. |
| 8,822,708 | B2 | 9/2014 | Ma et al. |
| 8,866,377 | B2 | 10/2014 | Adamovich et al. |
| 8,922,116 | B2 | 12/2014 | Kumaki et al. |
| 8,993,127 | B2 | 3/2015 | Osaka et al. |
| 9,123,903 | B2 | 9/2015 | Lin et al. |
| 9,153,786 | B2 | 10/2015 | Ma et al. |
| 2001/0046611 | A1 | 11/2001 | Kido et al. |
| 2003/0111666 | A1 | 6/2003 | Nishi et al. |
| 2003/0189401 | A1 | 10/2003 | Kido et al. |
| 2005/0084712 | A1 | 4/2005 | Kido et al. |
| 2005/0084713 | A1 | 4/2005 | Kido et al. |
| 2005/0098207 | A1 | 5/2005 | Matsumoto et al. |
| 2005/0106419 | A1 | 5/2005 | Endoh et al. |
| 2005/0116633 | A1 | 6/2005 | Yamazaki et al. |
| 2005/0170208 | A1 | 8/2005 | Yatsunami et al. |
| 2005/0248267 | A1 | 11/2005 | Gyoutoku et al. |
| 2006/0008740 | A1 | 1/2006 | Kido et al. |
| 2006/0027830 | A1* | 2/2006 | Kumaki et al. ............ 257/103 |
| 2007/0042221 | A1 | 2/2007 | Kawamura |
| 2007/0141387 | A1* | 6/2007 | Nakano et al. ............ 428/690 |
| 2007/0182317 | A1 | 8/2007 | Kido et al. |
| 2007/0290604 | A1 | 12/2007 | Sakanoue et al. |
| 2008/0286607 | A1* | 11/2008 | Nomura ............ C07D 215/38 428/690 |
| 2008/0314965 | A1 | 12/2008 | Roberts et al. |
| 2009/0026922 | A1 | 1/2009 | Iwaki et al. |
| 2009/0153034 | A1 | 6/2009 | Lin et al. |
| 2009/0165854 | A1 | 7/2009 | Yamazaki et al. |
| 2010/0038634 | A1 | 2/2010 | Nagao et al. |
| 2010/0096627 | A1 | 4/2010 | Ikeda et al. |
| 2010/0207518 | A1 | 8/2010 | Ikeda et al. |
| 2010/0301382 | A1 | 12/2010 | Shitagaki et al. |
| 2010/0301383 | A1 | 12/2010 | Shitagaki et al. |
| 2011/0057178 | A1 | 3/2011 | Shitagaki et al. |
| 2011/0114928 | A1 | 5/2011 | Suzuki et al. |
| 2011/0127510 | A1 | 6/2011 | Seo et al. |
| 2012/0061651 | A1 | 3/2012 | Osaka et al. |
| 2012/0061714 | A1* | 3/2012 | Osaka ............ C07C 25/02 257/99 |
| 2012/0071668 | A1 | 3/2012 | Suzuki et al. |
| 2012/0074390 | A1 | 3/2012 | Seo et al. |
| 2012/0091887 | A1 | 4/2012 | Osaka et al. |
| 2012/0104369 | A1 | 5/2012 | Kawata et al. |
| 2014/0042413 | A1 | 2/2014 | Xia et al. |
| 2014/0103327 | A1 | 4/2014 | Brooks et al. |
| 2015/0001524 | A1 | 1/2015 | Brooks et al. |
| 2015/0243899 | A1 | 8/2015 | Osaka et al. |
| 2015/0372243 | A1 | 12/2015 | Ma et al. |

FOREIGN PATENT DOCUMENTS

| | | |
|---|---|---|
| CN | 102484923 A | 5/2012 |
| EP | 1 624 502 A2 | 2/2006 |
| EP | 1 962 354 A1 | 8/2008 |
| EP | 2 128 217 A1 | 12/2009 |
| EP | 2 474 204 | 3/2011 |
| EP | 2428512 A | 3/2012 |
| EP | 2 511 254 A2 | 10/2012 |
| JP | 3-274695 | 12/1991 |
| JP | 9-63771 | 3/1997 |
| JP | 11-307259 | 11/1999 |
| JP | 2003-272860 | 9/2003 |
| JP | 2005-26121 | 1/2005 |
| JP | 2005-190998 | 7/2005 |
| JP | 2006-074022 A | 3/2006 |
| JP | 2006-324650 | 11/2006 |
| JP | 2007-63501 | 3/2007 |
| JP | 2007-126403 A | 5/2007 |
| JP | 2007-335737 | 12/2007 |
| JP | 2010-192465 A | 9/2010 |
| JP | 2010-535809 | 11/2010 |
| JP | 2011-9729 | 1/2011 |
| JP | 2011-77032 | 4/2011 |
| JP | 2011-139044 | 7/2011 |
| JP | 5859780 B2 | 2/2016 |
| KR | 10-2009-0128382 | 12/2009 |
| TW | 201300372 | 1/2013 |
| WO | WO 2005/115060 A1 | 12/2005 |
| WO | WO 2007/069569 A1 | 6/2007 |
| WO | WO 2008/108256 A1 | 9/2008 |
| WO | WO 2009/021107 A1 | 2/2009 |
| WO | WO 2009/021126 A2 | 2/2009 |
| WO | WO 2009/030981 A2 | 3/2009 |
| WO | WO 2009/085344 A2 | 7/2009 |
| WO | WO 2009/086028 A2 | 7/2009 |
| WO | WO 2010/137509 A1 | 12/2010 |
| WO | WO 2011/027653 A1 | 3/2011 |

OTHER PUBLICATIONS

Written Opinion re application No. PCT/JP2011/071165, dated Dec. 13, 2011.
Yang, Y. et al, "Polyaniline as a Transparent Electrode for Polymer Light-Emitting Diodes: Lower Operating Voltage and Higher Efficiency," Applied Physics Letters, vol. 64, No. 10, Mar. 7, 1994, pp. 1245-1247.
Chinese Office Action re Application No. CN 201180048041.2, dated Feb. 7, 2014.
Taiwanese Office Action (Application No. 100134615) Dated Apr. 22, 2015.

* cited by examiner

COMPOSITE MATERIAL, LIGHT-EMITTING ELEMENT, LIGHT-EMITTING DEVICE, ELECTRONIC DEVICE, AND LIGHTING DEVICE

TECHNICAL FIELD

The present invention relates to a composite material including an organic compound and an inorganic compound, a light-emitting element, a light-emitting device, an electronic device, and a lighting device.

BACKGROUND ART

In recent years, research and development have been extensively conducted on light-emitting elements using organic electroluminescence (EL). In a basic structure of such a light-emitting element, a layer containing a light-emitting organic compound is interposed between a pair of electrodes. By applying voltage to this element, light emission from the light-emitting organic compound can be obtained.

Since such a light-emitting element is of self-light-emitting type, it is considered that the light-emitting element has advantages over a liquid crystal display in that visibility of pixels is high, backlight is not required, and so on and is therefore suitable as flat panel display elements. In addition, it is also a great advantage that the light-emitting element can be manufactured as a thin and lightweight element. Furthermore, very high speed response is also one of the features of such elements.

Furthermore, since such light-emitting elements can be formed in a film form, they make it possible to easily form a large-area element. This feature is difficult to obtain with point light sources typified by incandescent lamps and LEDs or linear light sources typified by fluorescent lamps. Thus, light-emitting elements also have great potential as planar light sources applicable to lighting devices and the like.

As described above, application of light-emitting elements using organic EL to light-emitting devices, lighting devices, or the like is expected. On the other hand, there are many issues regarding light-emitting elements using organic EL. One of the issues is a reduction in power consumption. It is important to reduce a drive voltage for the light-emitting element in order to reduce power consumption. Further, the emission intensity of the light-emitting element using organic EL is determined by the amount of electric current flowing therein. Therefore, in order to reduce the drive voltage, it is necessary to feed a large amount of current at low voltage.

Previously, as a method for reducing drive voltage, an approach of providing a buffer layer between an electrode and the layer including a light-emitting organic compound, has been attempted. For example, it is known that a drive voltage can be reduced by providing a buffer layer which includes polyaniline (PANI) doped with camphorsulfonic acid, between indium tin oxide (ITO) and a light-emitting layer (see Non-Patent Document 1, for example). It is explained that this is because of the excellent carrier-injection property of PANI to the light-emitting layer. Note that in Non-Patent Document 1, PANI that is the buffer layer is also considered to be a part of the electrode.

However, as described in Non-Patent Document 1, PANI has a problem that transmittance becomes poor when a film thickness becomes thick. Specifically, it is reported that at a film thickness of about 250 nm, the transmittance is less than 70%. In other words, since the problem is with the transparency of the material itself that is used for the buffer layer, light that is generated within the element cannot be taken out efficiently.

Also, according to Patent Document 1, an approach of serially connecting light-emitting elements (called light-emitting units in Patent Document 1) to improve the luminance per a certain current density, in other words, current efficiency, has been attempted. In Patent Document 1, for a connecting portion of serially connected light-emitting elements, a mixed layer of an organic compound and a metal oxide (specifically, vanadium oxide and rhenium oxide) is used, and it is considered that this layer can inject holes and electrons to light-emitting units.

However, as apparent by looking at an embodiment, for the mixed layer of an organic compound and a metal oxide that is disclosed in Patent Document 1, a high absorption peak is observed not only in the infrared region but also in the visible light region (around 500 nm), and a problem in transparency occurs also. This is due to the effect of an absorption band generated by charge transfer interaction. Therefore, as expected, light that is generated within the element cannot be taken out efficiently, and the light emission efficiency of the element is degraded.

REFERENCES

[Patent Document 1] Japanese Published Patent Application No. 2003-272860
[Non-Patent Document 1] Y. Yang et al., Applied Physics Letters, Vol. 64 (10), 1245-1247 (1994)

DISCLOSURE OF INVENTION

In view of the above description, it is an object of one embodiment of the present invention to provide a composite material including an organic compound and an inorganic compound and having a high carrier-transport property. It is another object to provide a composite material having a high carrier-injection property to an organic compound. It is another object to provide a composite material in which light absorption due to charge transfer interaction is unlikely to occur.

It is an object of one embodiment of the present invention to provide a light-emitting element having high emission efficiency by application of the above-described composite material to the light-emitting element. It is another object to provide a light-emitting element having a low drive voltage. It is another object to provide a light-emitting element having a long lifetime. It is another object to provide a light-emitting device including the light-emitting element, an electronic device including the light-emitting device, or a lighting device including the light-emitting device.

Note that an object of the invention to be disclosed below is to achieve at least one of the above-described objects.

One embodiment of the present invention is a composite material including a heterocyclic compound having a dibenzothiophene skeleton or a dibenzofuran skeleton and an inorganic compound exhibiting an electron-accepting property with respect to the heterocyclic compound.

Thiophene and furan are π-electron-rich heteroaromatic rings and therefore each exhibit a hole-transport property. Thus, the above-described composite material has a high carrier-transport property.

The above-described composite material also has a high carrier-injection property to an organic compound. In the composite material, light absorption due to charge transfer interaction is unlikely to occur, and the composite material has a high visible-light-transmitting property (hereinafter referred to as a light-transmitting property).

Another embodiment of the present invention is a composite material including a heterocyclic compound having a substituent having 6 to 70 carbon atoms bonded to the 4-position of a dibenzothiophene skeleton or a dibenzofuran skeleton, and an inorganic compound exhibiting an electron-accepting property with respect to the heterocyclic compound.

It is preferable to use the heterocyclic compound having a substituent at the 4-position of a dibenzothiophene skeleton or a dibenzofuran skeleton for a composite material because it is possible to suppress the occurrence of light absorption based on charge transfer interaction, and also because it is possible to stabilize the film quality of the composite material.

It is preferable that a ring of the substituent in the above-described composite material be one or a plurality of rings selected from a benzene ring, a naphthalene ring, a phenanthrene ring, a triphenylene ring, a fluorene ring, a dibenzothiophene ring, and a dibenzofuran ring. This makes it possible not only to suppress the occurrence of light absorption based on charge transfer interaction but also to control an absorption peak of the heterocyclic compound itself so as to appear at a shorter wavelength than the visible light region (380 nm to 760 nm); thus, a composite material having a particularly high light-transmitting property can be obtained.

It is particularly preferable that the ring of the substituent be one or a plurality of rings selected from a benzene ring, a fluorene ring, a dibenzothiophene ring, and a dibenzofuran ring. In this case, light absorption based on charge transfer interaction with the inorganic compound hardly occurs.

Another embodiment of the present invention is a composite material including a heterocyclic compound having a phenyl group bonded to the 4-position of a dibenzothiophene skeleton or a dibenzofuran skeleton, in which the phenyl group has one or more substituents and the phenyl group and the one or more substituents have a total of 12 to 70 carbon atoms, and an inorganic compound exhibiting an electron-accepting property with respect to the heterocyclic compound.

It is preferable to use a heterocyclic compound having a phenyl group with small conjugation bonded to the 4-position of the dibenzothiophene skeleton or the dibenzofuran skeleton for a composite material because it is possible to suppress the occurrence of light absorption based on charge transfer interaction, because it is possible to stabilize the film quality of the composite material, and also because it is possible to make conjugation unlikely to extend, which is also effective in terms of improving a light-transmitting property.

It is preferable that a ring of the one or more substituents in the above-described composite material be separately one or a plurality of rings selected from a benzene ring, a naphthalene ring, a phenanthrene ring, a triphenylene ring, a fluorene ring, a dibenzothiophene ring, and a dibenzofuran ring. This makes it possible not only to suppress the occurrence of light absorption based on charge transfer interaction but also to control an absorption peak of the heterocyclic compound itself to appear at a shorter wavelength than the visible light region; thus, a composite material having a particularly high light-transmitting property can be obtained.

It is particularly preferable that the ring of the one or more substituents be separately one or a plurality of rings selected from a benzene ring, a fluorene ring, a dibenzothiophene ring, and a dibenzofuran ring. In this case, light absorption based on charge transfer interaction with the inorganic compound hardly occurs.

Another embodiment of the present invention is a composite material including a heterocyclic compound represented by a general formula (G1) and an inorganic compound exhibiting an electron-accepting property with respect to the heterocyclic compound.

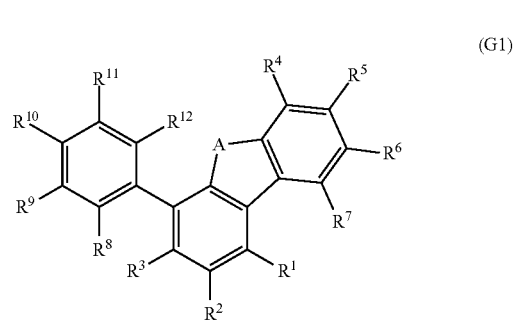

(G1)

In the formula, A represents oxygen or sulfur; $R^1$ to $R^7$ separately represent hydrogen, an alkyl group having 1 to 4 carbon atoms, or an aryl group having 6 to 25 carbon atoms in a ring; $R^8$ to $R^{12}$ separately represent hydrogen, a substituted or unsubstituted phenyl group, a substituted or unsubstituted naphthyl group, a substituted or unsubstituted phenanthryl group, a substituted or unsubstituted triphenylenyl group, a substituted or unsubstituted fluorenyl group, a substituted or unsubstituted dibenzothiophenyl group, or a substituted or unsubstituted dibenzofuranyl group. Note that at least one of $R^8$ to $R^{12}$ represents a substituted or unsubstituted phenyl group, a substituted or unsubstituted naphthyl group, a substituted or unsubstituted phenanthryl group, a substituted or unsubstituted triphenylenyl group, a substituted or unsubstituted fluorenyl group, a substituted or unsubstituted dibenzothiophenyl group, or a substituted or unsubstituted dibenzofuranyl group.

It is particularly preferable that $R^8$ to $R^{12}$ separately represent hydrogen, a substituted or unsubstituted phenyl group, a substituted or unsubstituted fluorenyl group, a substituted or unsubstituted dibenzothiophenyl group, or a substituted or unsubstituted dibenzofuranyl group. Note that at least one of $R^8$ to $R^{12}$ represents a substituted or unsubstituted phenyl group, a substituted or unsubstituted fluorenyl group, a substituted or unsubstituted dibenzothiophenyl group, or a substituted or unsubstituted dibenzofuranyl group.

Another embodiment of the present invention is a composite material including a heterocyclic compound having a dibenzothiophene skeleton or a dibenzofuran skeleton, and a transition metal oxide.

The above-described composite material has a high carrier-transport property. The above-described composite material also has a high carrier-injection property to an organic compound. In the composite material, light absorption due to charge transfer interaction is unlikely to occur, and the composite material has a high light-transmitting property.

Another embodiment of the present invention is a composite material including a heterocyclic compound having a substituent having 6 to 70 carbon atoms bonded to the 4-position of a dibenzothiophene skeleton or a dibenzofuran skeleton, and a transition metal oxide.

It is preferable to use the heterocyclic compound having a substituent at the 4-position of a dibenzothiophene skeleton or a dibenzofuran skeleton for a composite material because it is possible to suppress the occurrence of light absorption based on charge transfer interaction, and also because it is possible to stabilize the film quality of the composite material.

It is preferable that a ring of the substituent in the above-described composite material be one or a plurality of rings selected from a benzene ring, a naphthalene ring, a phenanthrene ring, a triphenylene ring, a fluorene ring, a dibenzothiophene ring, and a dibenzofuran ring. This makes it possible not only to suppress the occurrence of light absorption based on charge transfer interaction but also to control an absorption peak of the heterocyclic compound itself to appear at a shorter wavelength than the visible light region; thus, a composite material having a particularly high light-transmitting property can be obtained.

It is particularly preferable that a ring of the substituent be one or a plurality of rings selected from a benzene ring, a fluorene ring, a dibenzothiophene ring, and a dibenzofuran ring. In this case, light absorption based on charge transfer interaction with the transition metal oxide hardly occurs.

Another embodiment of the present invention is a composite material including a heterocyclic compound having a phenyl group bonded to the 4-position of a dibenzothiophene skeleton or a dibenzofuran skeleton, in which the phenyl group has one or more substituents and the phenyl group and the one or more substituents have a total of 12 to 70 carbon atoms, and a transition metal oxide.

It is preferable to use a heterocyclic compound having a phenyl group with small conjugation bonded to the 4-position of the dibenzothiophene skeleton or the dibenzofuran skeleton for a composite material because it is possible to suppress the occurrence of light absorption based on charge transfer interaction, because it is possible to stabilize the film quality of the composite material, and also because it is possible to make conjugation unlikely to extend, which is also effective in terms of improving a light-transmitting property.

It is preferable that a ring of the one or more substituents in the above-described composite material be separately one or a plurality of rings selected from a benzene ring, a naphthalene ring, a phenanthrene ring, a triphenylene ring, a fluorene ring, a dibenzothiophene ring, and a dibenzofuran ring. This makes it possible not only to suppress the occurrence of light absorption based on charge transfer interaction but also to control an absorption peak of the heterocyclic compound itself to appear at a shorter wavelength than the visible light region; thus, a composite material having a particularly high light-transmitting property can be obtained.

It is particularly preferable that a ring of the one or more substituents be separately one or a plurality of rings selected from a benzene ring, a fluorene ring, a dibenzothiophene ring, and a dibenzofuran ring. In this case, light absorption based on charge transfer interaction with the transition metal oxide hardly occurs.

Another embodiment of the present invention is a composite material including a heterocyclic compound represented by a general formula (G1) and a transition metal oxide.

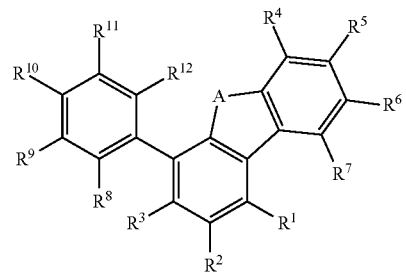

(G1)

In the formula, A represents oxygen or sulfur; $R^1$ to $R^7$ separately represent hydrogen, an alkyl group having 1 to 4 carbon atoms, or an aryl group having 6 to 25 carbon atoms in a ring; $R^8$ to $R^{12}$ separately represent hydrogen, a substituted or unsubstituted phenyl group, a substituted or unsubstituted naphthyl group, a substituted or unsubstituted phenanthryl group, a substituted or unsubstituted triphenylenyl group, a substituted or unsubstituted fluorenyl group, a substituted or unsubstituted dibenzothiophenyl group, or a substituted or unsubstituted dibenzofuranyl group. Note that at least one of $R^8$ to $R^{12}$ represents a substituted or unsubstituted phenyl group, a substituted or unsubstituted naphthyl group, a substituted or unsubstituted phenanthryl group, a substituted or unsubstituted triphenylenyl group, a substituted or unsubstituted fluorenyl group, a substituted or unsubstituted dibenzothiophenyl group, or a substituted or unsubstituted dibenzofuranyl group.

It is particularly preferable that $R^8$ to $R^{12}$ separately represent hydrogen, a substituted or unsubstituted phenyl group, a substituted or unsubstituted fluorenyl group, a substituted or unsubstituted dibenzothiophenyl group, or a substituted or unsubstituted dibenzofuranyl group. Note that at least one of $R^8$ to $R^{12}$ represents a substituted or unsubstituted phenyl group, a substituted or unsubstituted fluorenyl group, a substituted or unsubstituted dibenzothiophenyl group, or a substituted or unsubstituted dibenzofuranyl group.

It is preferable that the transition metal oxide included in the above-described composite material be one or a plurality of oxides selected from titanium oxide, vanadium oxide, molybdenum oxide, tungsten oxide, rhenium oxide, ruthenium oxide, chromium oxide, zirconium oxide, hafnium oxide, tantalum oxide, and silver oxide.

It is preferable that the highest occupied molecular orbital level (HOMO level) of the heterocyclic compound used for the above-described composite material, which is measured by photoelectron spectrometry, be lower than or equal to −5.7 eV.

Another embodiment of the present invention is a light-emitting element including a layer containing a light-emitting substance (hereinafter also referred to as an EL layer) between a pair of electrodes. The layer including a light-emitting substance includes a layer including the above-described composite material.

In the above-described light-emitting element, it is preferable that the layer including the composite material be in contact with one of the pair of electrodes which functions as an anode. It is also preferable that the layer including the composite material be in contact with one of the pair of electrodes which functions as a cathode.

The above-described light-emitting element may include two layers including the composite material, and it is preferable that one of the two layers including the composite material be in contact with one of the pair of electrodes which functions as an anode and the other of the two layers be in contact with the other of the pair of electrodes which functions as a cathode.

Another embodiment of the present invention is a light-emitting element including a plurality of layers including a light-emitting substance between a pair of electrodes, and including a layer including the above-described composite material between the plurality of layers including a light-emitting substance. In other words, the above-described composite material can be used for an intermediate layer (also referred to as a charge-generation layer) in an organic EL light-emitting element including a stack of a plurality of light-emitting units (a tandem organic EL light-emitting element).

Another embodiment of the present invention is a light-emitting device including the above-described light-emitting element. Another embodiment of the present invention is an electronic device including the light-emitting device in a display portion. Another embodiment of the present invention is a lighting device including the light-emitting element in a light-emitting portion.

According to one embodiment of the present invention, it is possible to provide a composite material including an organic compound and an inorganic compound and having a high carrier-transport property. It is also possible to provide a composite material having a high carrier-injection property to an organic compound. It is also possible to provide a composite material in which light absorption due to charge transfer interaction is unlikely to occur.

According to one embodiment of the present invention, it is possible to provide a light-emitting element having high emission efficiency by application of the above-described composite material to the light-emitting element. It is also possible to provide a light-emitting element having a low drive voltage. It is also possible to provide a light-emitting element having a long lifetime. It is also possible to provide a light-emitting device including the light-emitting element, an electronic device including the light-emitting device, or a lighting device including the light-emitting device.

BEST MODE FOR CARRYING OUT THE INVENTION

Figure 1A:
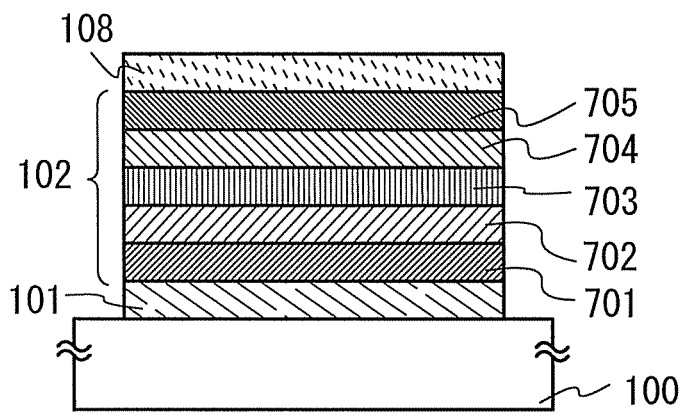
FIGS. 1A to 1C illustrate light-emitting elements of one embodiment of the present invention.

Embodiments and examples will be described in detail with reference to the drawings. Note that the present invention is not limited to the following description and it will be readily appreciated by those skilled in the art that the modes and details of the present invention can be modified in various ways without departing from the spirit and scope thereof. Therefore, the present invention should not be interpreted as being limited to the description in the following embodiments and examples. Note that the same portions or portions having similar functions are commonly denoted by the same reference numerals in different drawings, and repetitive description thereof is omitted.

First, a difference between the background art of the present invention and the present invention will be briefly described. As disclosed in Patent Document 1, it is interpreted that in a composite material including a mixture of an aromatic amine and an electron-accepting inorganic compound, the electron-accepting inorganic compound takes electrons from the aromatic amine, and accordingly, holes and electrons are generated in the aromatic amine and the inorganic compound, respectively. In other words, it is interpreted that in such a composite material, the aromatic amine and the electron-accepting inorganic compound form a charge-transfer complex. Some composite materials utilizing such a phenomenon and having excellent carrier-transport and/or carrier-injection properties have been reported so far.

However, it is generally known that in such a case, an absorption band based on charge transfer interaction is generated. It is said that this absorption band is generated in the deep-red to near-infrared regions; in fact, in many cases, an absorption band is also generated in the visible light region. For example, a composite material including a mixture of 4,4'-bis[N-(1-naphthyl)-N-phenylamino]biphenyl (abbreviation: NPB or α-NPB) and a vanadium oxide, or NPB and a molybdenum oxide, has an absorption band at around 500 nm, in addition to an absorption band at around 1300 nm. This is a great disadvantage for optical devices such as light-emitting elements.

The present inventors have found that a composite material of a heterocyclic compound having a dibenzofuran skeleton or a dibenzothiophene skeleton and an electron-accepting inorganic compound, or the heterocyclic compound and a transition metal oxide, can exhibit excellent carrier-transport and/or carrier-injection properties despite the fact that no light absorption based on charge transfer interaction can be observed (light absorption hardly occurs). It has been considered that holes and electrons generated due to charge transfer interaction are elements for exhibiting carrier-transport and/or carrier-injection properties; therefore, it can be said that the present invention, which can provide excellent carrier-transport and/or carrier-injection properties despite the fact that no clear light absorption due to charge transfer interaction is observed, is inconsistent with the general theory and provides an unexpected, remarkable function.

Furthermore, dibenzothiophene or dibenzofuran has a large energy gap in itself. Therefore, by including a dibenzofuran skeleton or a dibenzothiophene skeleton, the heterocyclic compound can be designed so as not to have an absorption peak in the visible light region. Accordingly, there is a great advantage in terms of improving a light-transmitting property.

Moreover, cyclic voltammetry (CV) measurement shows that the HOMO level of dibenzothiophene or dibenzofuran is lower than or equal to −6 eV which is extremely low. Therefore, it can be considered that a heterocyclic compound including a dibenzofuran skeleton or a dibenzothiophene skeleton by itself has an excellent hole-injection property to another organic compound, but has difficulty receiving holes from a conductive material typified by Al or ITO (having a work function of approximately 3 eV to 5 eV). On the other hand, by formation of such a composite material as in one embodiment of the present invention, it becomes possible to overcome the problem of a hole-injection property from an electrode while maintaining an excellent hole-injection property to another organic compound. Such properties of the composite material contribute to a reduction in drive voltage when the composite material is used for a light-emitting element. Its high light-transmitting property enables emission efficiency to increase. Furthermore, it can be considered that its deep HOMO level prevents carrier accumulation in a light-emitting element; thus, a longer lifetime can be achieved.

Embodiments of the present invention will be described below with specific examples.

Embodiment 1

In this embodiment, a composite material of one embodiment of the present invention will be described.

A composite material of one embodiment of the present invention is a composite material of an organic compound having a particular skeleton and an inorganic compound. There is no limitation for a preparation method of the composite material of one embodiment of the present invention; for example, it can be formed by a co-evaporation method where the organic compound and the inorganic compound are deposited at the same time. The mixing ratio, in mass ratio, of the organic compound to the inorganic compound in the composite material of one embodiment of the present invention is preferably approximately 8:1 to 1:2 (=Organic compound:inorganic compound), and more desirably, 4:1 to 1:1 (=Organic compound:inorganic compound). When the composite material is formed by a co-evaporation method, the mixing ratio can be controlled by separately adjusting the deposition rates for the organic compound and the inorganic compound.

First, an organic compound that can be used for the composite material of one embodiment of the present invention is a heterocyclic compound having a dibenzothiophene skeleton or a dibenzofuran skeleton.

With the use of this heterocyclic compound for a composite material, a material having a high carrier-transport property can be obtained. In addition, a material having a high carrier-injection property to an organic compound can be obtained. Furthermore, a material in which light absorption due to charge transfer interaction with an inorganic compound is unlikely to occur can be obtained. Moreover, with the use of the heterocyclic compound for a composite material, a material having a high light-transmitting property can be obtained.

In particular, it is preferable to use a heterocyclic compound having a substituent having 6 to 70 carbon atoms bonded to the 4-position of a dibenzothiophene skeleton or a dibenzofuran skeleton. This is because the occurrence of light absorption based on charge transfer interaction can be suppressed by use of a heterocyclic compound having a substituent at the 4-position of a dibenzothiophene skeleton or a dibenzofuran skeleton for a composite material. In the case where dibenzothiophene or dibenzofuran has a bulky substituent (for example, having 6 or more carbon atoms) at the 4-position, the molecule as a whole is a steric skeleton due to steric hindrance between dibenzothiophene or dibenzofuran and the substituent. This stabilizes the film quality of the composite material. When the composite material is prepared, it is preferable to co-evaporate the heterocyclic compound and an inorganic compound, in which case it is desirable that the heterocyclic compound easily vaporizes. Therefore, in terms of molecular weight, it is preferable that the number of carbon atoms of the substituent be less than or equal to 70. Note that it is preferable that the molecular weight of the heterocyclic compound be approximately less than or equal to 1200.

Note that as a result of experiments and studies conducted by the present inventors, it has been found that a composite material formed by combining an aromatic hydrocarbon compound (e.g., an anthracene compound) and an inorganic compound is easily crystallized when the mixing ratio of the inorganic compound to the aromatic compound is low. On the contrary, when the mixing ratio of the inorganic compound is high, although crystallization can be suppressed, a slight absorption peak resulting from charge transfer interaction between a skeleton of the aromatic hydrocarbon compound (e.g., an anthracene skeleton) and the inorganic compound is increased in the visible light region. On the other hand, in the case of using a heterocyclic compound having a substituent bonded to the 4-position of a dibenzothiophene skeleton or a dibenzofuran skeleton according to one embodiment of the present invention, crystallization of a composite material can be suppressed and the film quality of the composite material can be stabilized even when the substituent includes an anthracene skeleton and the ratio of the inorganic compound is low, for example. Therefore, in the case of the composite material of one embodiment of the present invention, even when the heterocyclic compound includes an anthracene skeleton, there is no need to increase the ratio of the inorganic compound for the purpose of suppressing crystallization, and it is possible to prevent an absorption peak resulting from charge transfer interaction from being observed in the visible light region.

In addition, as a result of experiments and studies conducted by the present inventors, it has been found that a composite material formed by combining an aryl carbazole compound and an inorganic compound is also easily crystallized when the mixing ratio of the inorganic compound to the aryl carbazole compound is low. On the contrary, when the ratio of the inorganic compound is high, although crystallization can be suppressed, a slight absorption peak resulting from charge transfer interaction between the aryl carbazole skeleton and the inorganic compound is increased in the visible light region. On the other hand, in the case of using a heterocyclic compound having a substituent bonded to the 4-position of a dibenzothiophene skeleton or a dibenzofuran skeleton according to one embodiment of the present invention, crystallization of a composite material can be suppressed and the film quality of the composite material can be stabilized even when the substituent includes an aryl carbazole skeleton and the ratio of the inorganic compound is low, for example. Therefore, in the case of the composite material of one embodiment of the present invention, even when the heterocyclic compound includes an aryl carbazole skeleton, there is no need to increase the ratio of the inorganic compound for the purpose of suppressing crystallization, and it is possible to prevent an absorption peak resulting from charge transfer interaction from being observed in the visible light region.

It is preferable that a ring of the substituent be one or a plurality of rings selected from a benzene ring, a naphthalene ring, a phenanthrene ring, a triphenylene ring, a fluorene ring, a dibenzothiophene ring, and a dibenzofuran ring. Each of these rings is an important conjugate ring for exhibiting a carrier-transport property (especially, a hole-transport property) and is at the same time a conjugate ring having a wide energy gap. Accordingly, when the ring of the substituent is limited to these rings, it is possible not only to suppress the occurrence of light absorption based on charge transfer interaction but also to control an absorption peak of the heterocyclic compound so as to appear at a shorter wavelength than the visible light region. Thus, with the use of the heterocyclic compound, a composite material having a high light-transmitting property can be obtained.

It is particularly preferable that a ring of the substituent be one or a plurality of rings selected from a benzene ring, a fluorene ring, a dibenzothiophene ring, and a dibenzofuran ring. The present inventors have found that in this case, light absorption based on charge transfer interaction with the organic compound hardly occurs. In particular, light absorption due to charge transfer interaction hardly occurs even with a high mixing ratio of the inorganic compound to the heterocyclic compound. Specifically, light absorption based on charge transfer interaction hardly occurs even when the mixing ratio, in mass ratio, of the heterocyclic compound to the inorganic compound is in the range from 4:1 to 1:1 (=heterocyclic compound:inorganic compound). Note that it is preferable that the concentration of the inorganic compound be high because the conductivity of the composite material also becomes high. The present inventors have also found that the composite material of one embodiment of the present invention can exhibit favorable carrier-transport and/or carrier-injection properties, and favorable reliability when used for a light-emitting element despite the fact that light absorption due to charge transfer interaction hardly occurs.

In addition, it is preferable to use a heterocyclic compound having a phenyl group bonded to the 4-position of a dibenzothiophene skeleton or a dibenzofuran skeleton, in which the phenyl group has one or more substituents and the phenyl group and the one or more substituents have a total of 12 to 70 carbon atoms. This is because the occurrence of light absorption based on charge transfer interaction can be suppressed by use of a heterocyclic compound having a phenyl group with small conjugation bonded to the 4-position of a dibenzothiophene skeleton or a dibenzofuran skeleton for a composite material. In addition, since the phenyl group has small conjugation, even when the molecular weight is increased by bonding an additional substituent to the phenyl group, a wide energy gap can be maintained, which is also effective in terms of improving a light-transmitting property. Furthermore, in the case where dibenzothiophene or dibenzofuran has a bulky site (for example, a skeleton having a total of 12 or more carbon atoms including the phenyl group) at the 4-position, the molecule as a whole is a steric skeleton due to steric hindrance between dibenzothiophene or dibenzofuran and the bulky site. This stabilizes the film quality of the composite material. When the composite material is prepared, it is preferable to co-evaporate the heterocyclic compound and an inorganic compound, in which case it is desirable that the heterocyclic compound easily vaporizes. Therefore, in terms of molecular weight, it is preferable that the sum of carbon atoms of the bulky site be less than or equal to 70. Note that it is preferable that the molecular weight of the heterocyclic compound be approximately less than or equal to 1200.

It is preferable that a ring of the one or more substituents be separately one or a plurality of rings selected from a benzene ring, a naphthalene ring, a phenanthrene ring, a triphenylene ring, a fluorene ring, a dibenzothiophene ring, and a dibenzofuran ring. Each of these rings is an important conjugate ring for exhibiting a carrier-transport property (especially, a hole-transport property), and in addition, it is a conjugate ring having a wide energy gap. Accordingly, when the ring of the one or more substituents is limited to these rings, it is possible not only to suppress the occurrence of light absorption based on charge transfer interaction but also to control an absorption peak of the heterocyclic compound so as to appear at a shorter wavelength than the visible light region. Thus, with the use of the heterocyclic compound, a composite material having a high light-transmitting property can be obtained.

It is particularly preferable that a ring of the one or more substituents be separately one or a plurality of rings selected from a benzene ring, a fluorene ring, a dibenzothiophene ring, and a dibenzofuran ring. The present inventors have found that in this case, light absorption based on charge transfer interaction with the organic compound hardly occurs. In particular, light absorption due to charge transfer interaction hardly occurs even with a high mixing ratio of the inorganic compound to the heterocyclic compound. Specifically, light absorption based on charge transfer interaction hardly occurs even when the mixing ratio, in mass ratio, of the heterocyclic compound to the inorganic compound is in the range from 4:1 to 1:1 (=heterocyclic compound:inorganic compound). Note that it is preferable that the concentration of the inorganic compound be high because the conductivity of the composite material also becomes high. The present inventors have also found that the composite material of one embodiment of the present invention can exhibit favorable carrier-transport and/or carrier-injection properties, and favorable reliability when used for a light-emitting element despite the fact that light absorption due to charge transfer interaction hardly occurs.

Another organic compound that can be used for the composite material of one embodiment of the present invention is a heterocyclic compound represented by a general formula (G1).

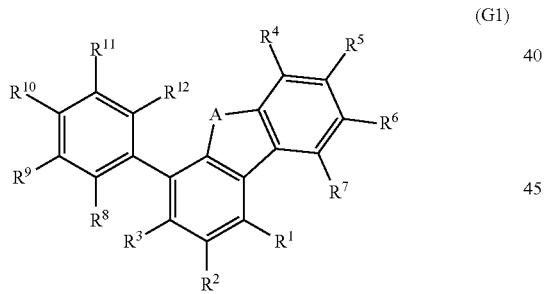

(G1)

In the general formula (G1), A represents oxygen or sulfur; $R^1$ to $R^7$ separately represent hydrogen, an alkyl group having 1 to 4 carbon atoms, or an aryl group having 6 to 25 carbon atoms in a ring; $R^8$ to $R^{12}$ separately represent hydrogen, a substituted or unsubstituted phenyl group, a substituted or unsubstituted naphthyl group, a substituted or unsubstituted phenanthryl group, a substituted or unsubstituted triphenylenyl group, a substituted or unsubstituted fluorenyl group, a substituted or unsubstituted dibenzothiophenyl group, or a substituted or unsubstituted dibenzofuranyl group. Note that at least one of $R^8$ to $R^{12}$ represents a substituted or unsubstituted phenyl group, a substituted or unsubstituted naphthyl group, a substituted or unsubstituted phenanthryl group, a substituted or unsubstituted triphenylenyl group, a substituted or unsubstituted fluorenyl group, a substituted or unsubstituted dibenzothiophenyl group, or a substituted or unsubstituted dibenzofuranyl group.

It is particularly preferable that $R^8$ to $R^{12}$ separately represent hydrogen, a substituted or unsubstituted phenyl group, a substituted or unsubstituted fluorenyl group, a substituted or unsubstituted dibenzothiophenyl group, or a substituted or unsubstituted dibenzofuranyl group. Note that at least one of $R^8$ to $R^{12}$ represents a substituted or unsubstituted phenyl group, a substituted or unsubstituted fluorenyl group, a substituted or unsubstituted dibenzothiophenyl group, or a substituted or unsubstituted dibenzofuranyl group.

Examples of organic compounds that can be used for the composite material of one embodiment of the present invention are represented by the following structural formulae (100) to (128).

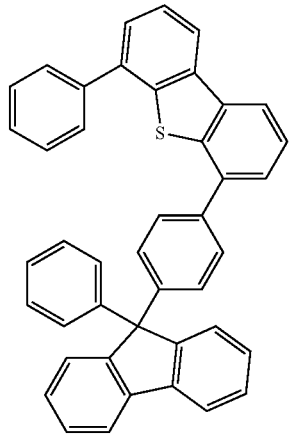

(100)

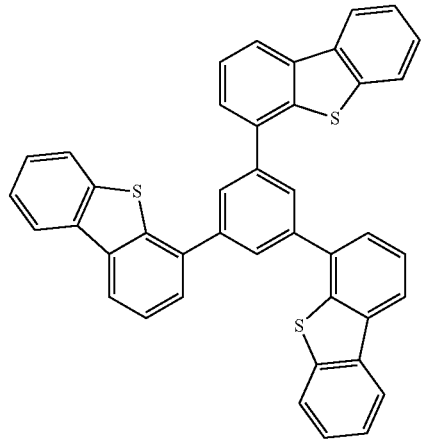

(101)

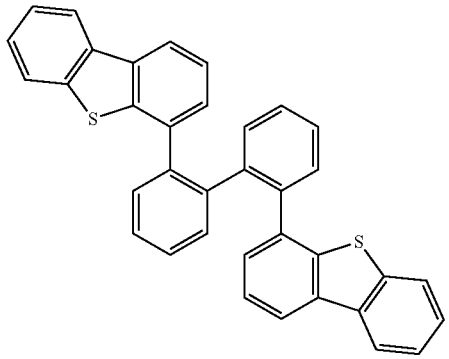

(102)

(103)
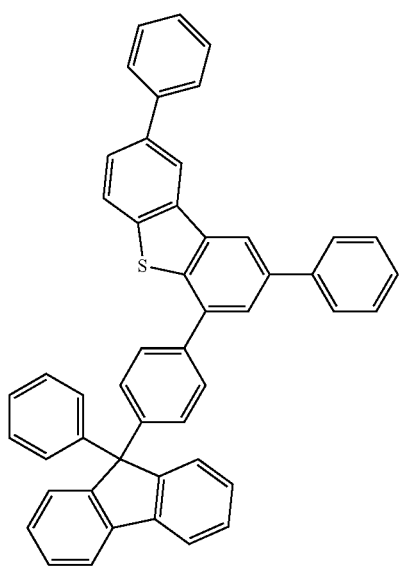
(104)
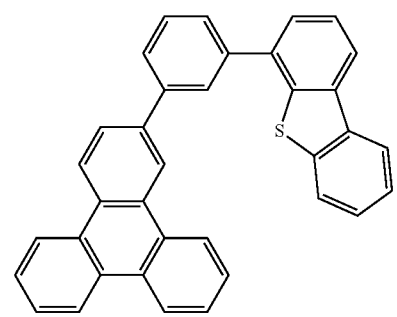
(105)
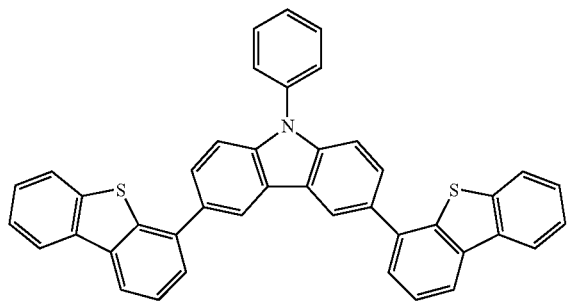
(106)
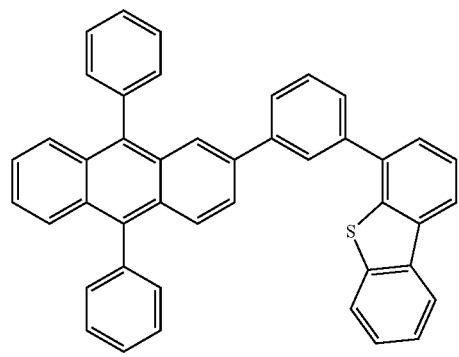
(107)
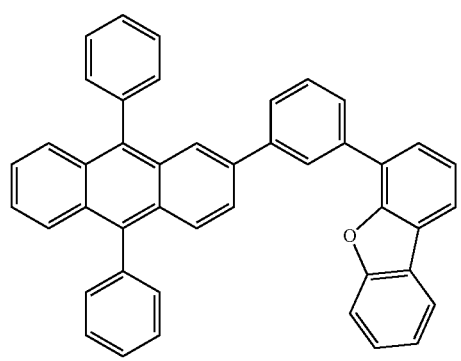
(108)
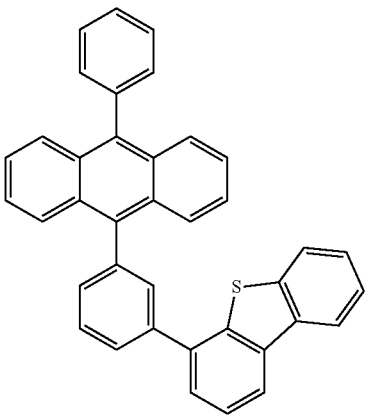
(109)
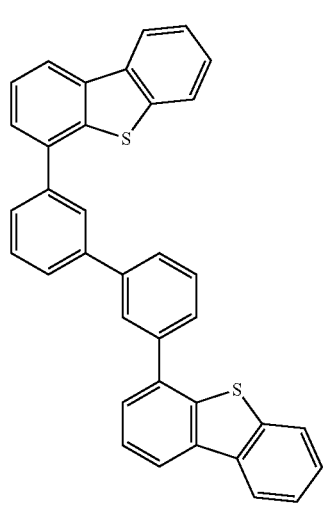

(110)
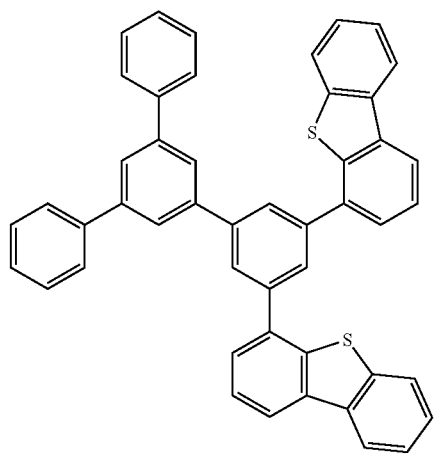
(111)
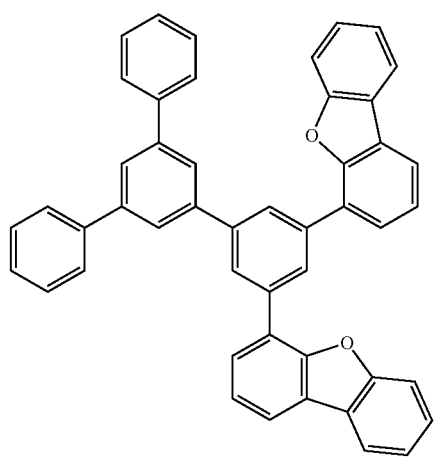
(112)
(113)
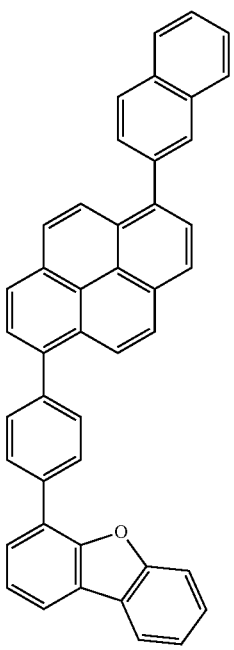
(114)
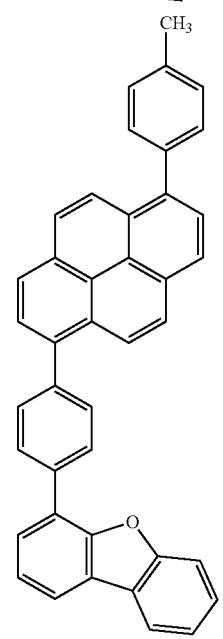
(115)
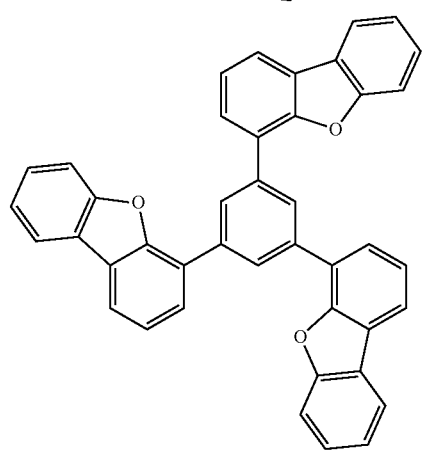

-continued
(116)
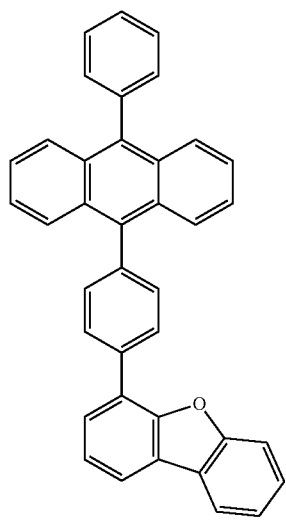
(117)
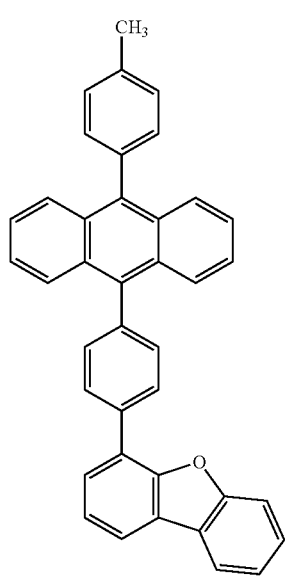
-continued
(118)
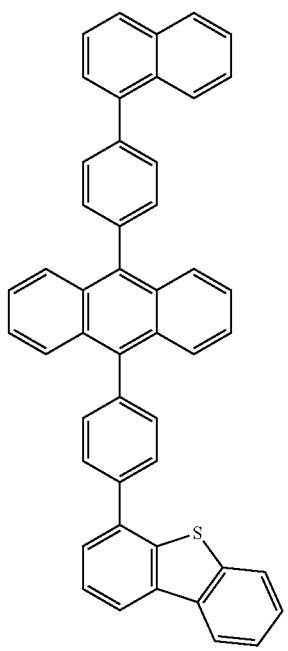
(119)
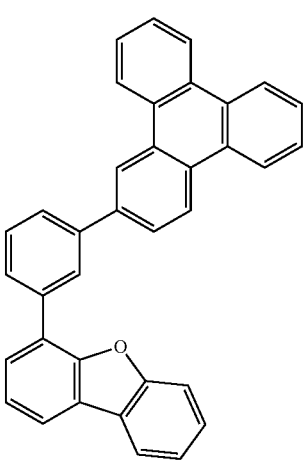
(120)
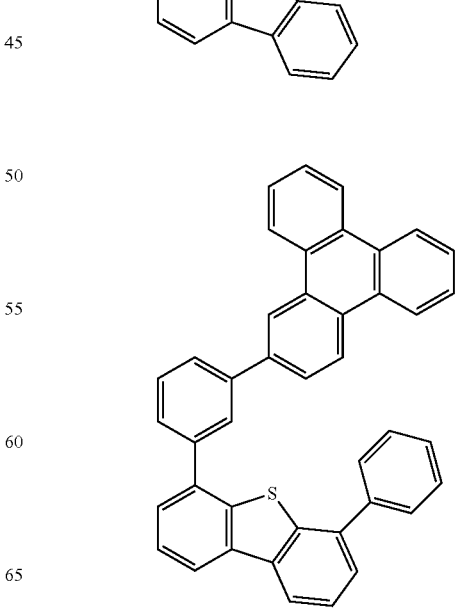

(121)
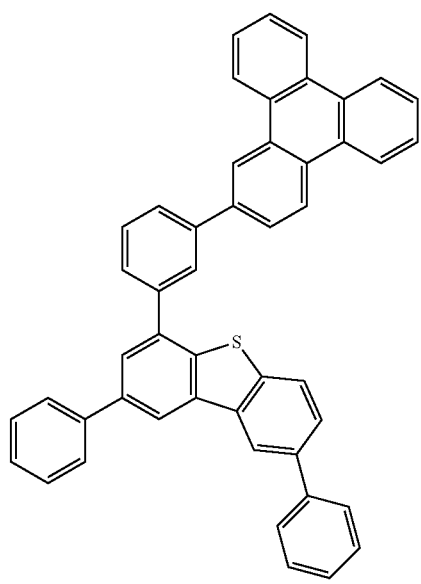
(122)
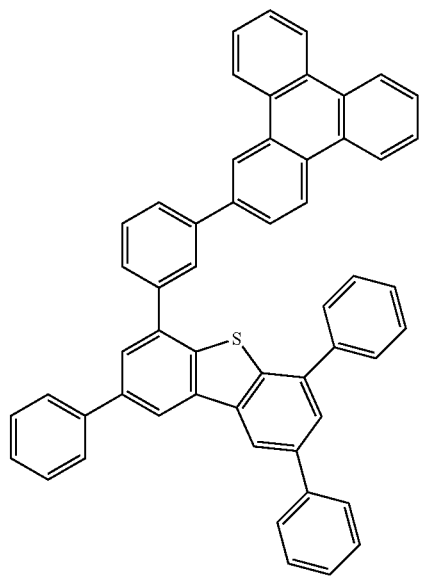
(123)
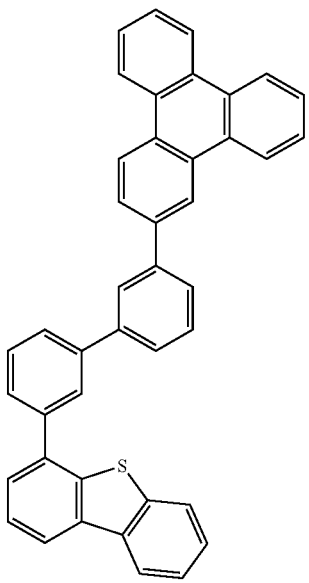
(124)
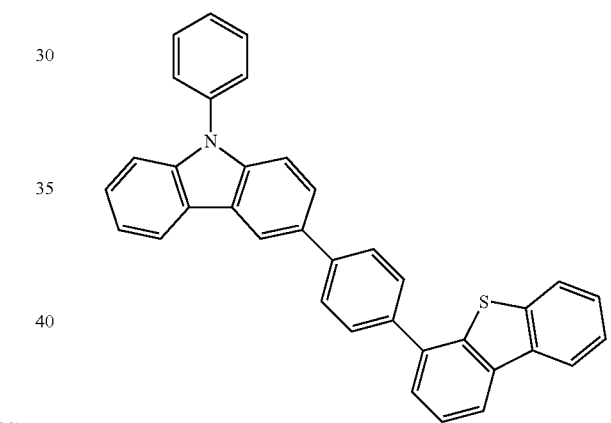
(125)
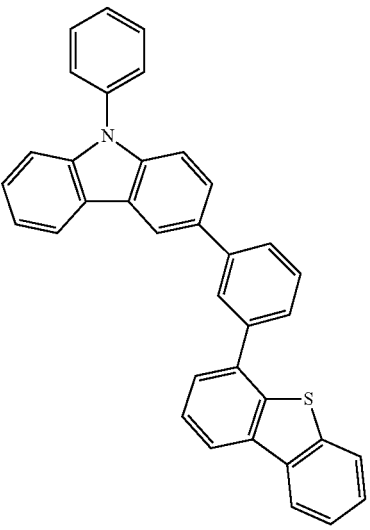

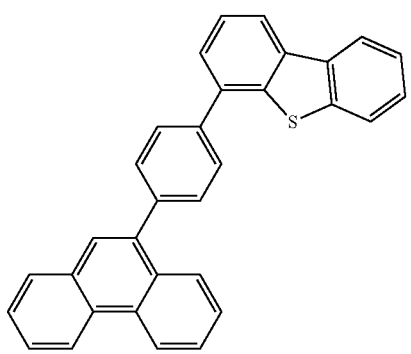
(126)

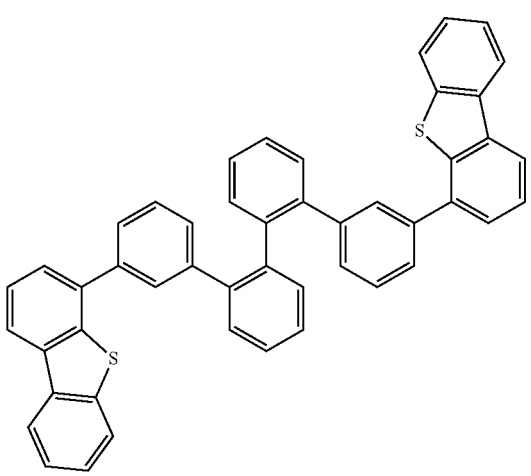
(127)

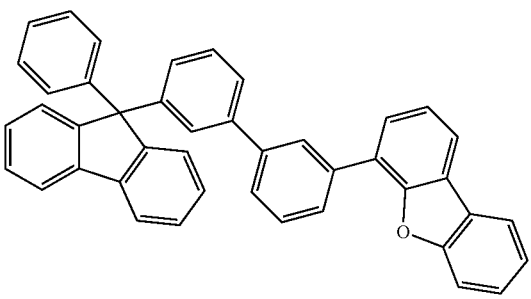
(128)

Next, an inorganic compound that can be used for the composite material of one embodiment of the present invention will be described.

An inorganic compound exhibiting an electron-accepting property with respect to the heterocyclic compound used for the composite material of one embodiment of the present invention can be used. Iron(III) chloride, aluminum chloride, and the like are examples of inorganic compounds having a high electron-accepting property.

Alternatively, a transition metal oxide can be used as an inorganic compound for the composite material of one embodiment of the present invention. It is preferable to use an oxide of a metal belonging to any of Groups 4 to 8 of the periodic table. It is particularly preferable to use titanium oxide, vanadium oxide, tantalum oxide, molybdenum oxide, tungsten oxide, rhenium oxide, ruthenium oxide, chromium oxide, zirconium oxide, hafnium oxide, or silver oxide. Molybdenum oxide is particularly easy to handle among them, because it is easily deposited, has a low hygroscopic property, and is stable.

A transition metal oxide is considered not to have a very high electron-accepting property (considered to have low reactivity), as compared to a strong Lewis acid such as iron(III) chloride mentioned above. In the composite material of one embodiment of the present invention, as described above, the occurrence of light absorption based on charge transfer interaction is suppressed (or light absorption hardly occurs). It is difficult to prove from these that a transition metal oxide acts as an electron acceptor in a general sense in the present invention. On the other hand, as described in the following examples, there is an experimental fact that the composite material of one embodiment of the present invention conducts a larger amount of current than the heterocyclic compound alone can do, when an electric field is applied. Thus, when a transition metal oxide is used in the composite material of one embodiment of the present invention, it can be considered that carriers are easily generated at least with an assistance of application of an electric field. Therefore, in this specification, an inorganic compound (such as a transition metal oxide mentioned above) in the composite material is regarded as having an electron-accepting property as long as carriers are generated at least with an assistance of application of an electric field.

It is preferable that the HOMO level of the heterocyclic compound included in the above-described composite material of one embodiment of the present invention, which is measured by photoelectron spectrometry, be lower than or equal to −5.7 eV. As described above, CV measurement shows that the HOMO level of dibenzothiophene or dibenzofuran is lower than or equal to −6 eV which is extremely low. Therefore, the HOMO level of a heterocyclic compound alone including a dibenzofuran skeleton or a dibenzothiophene skeleton can easily be made as low as or lower than −5.7 eV.

In the case where the heterocyclic compound has a low HOMO level, it can be considered that the heterocyclic compound has an excellent hole-injection property to another organic compound, but has difficulty receiving holes from a conductive material typified by Al or ITO (having a work function of approximately 3 eV to 5 eV). On the other hand, by formation of such a composite material as in one embodiment of the present invention, it is possible to overcome the problem of a hole-injection property from an electrode while maintaining an excellent hole-injection property to another organic compound. Such properties of the composite material contribute to a reduction in drive voltage when the composite material is used for a light-emitting element. Its high light-transmitting property enables emission efficiency to increase. Furthermore, its deep HOMO level can prevent carrier accumulation; thus, a longer lifetime can be achieved.

As described above, the composite material of one embodiment of the present invention is a material having a low HOMO level and a high carrier-transport property. In addition, the composite material of one embodiment of the present invention is a material having an excellent carrier-injection property to an organic compound. Furthermore, the composite material of one embodiment of the present invention is a material in which light absorption based on charge transfer interaction is unlikely to occur.

Therefore, the composite material of one embodiment of the present invention can be used for a light-emitting element or a semiconductor element such as a photoelectric conversion element or a transistor.

Furthermore, the composite material of one embodiment of the present invention has an excellent carrier-transport property and an excellent carrier-injection property to an organic compound and can therefore reduce drive voltage when used for a light-emitting element or the like.

The composite material of one embodiment of the present invention has a light-transmitting property and can therefore realize high emission efficiency when used for a light-emitting element or the like.

The composite material of one embodiment of the present invention suppresses charge accumulation and can therefore realize an element having a long lifetime when used for a light-emitting element or the like.

Note that this embodiment can be implemented in appropriate combination with any of the other embodiments.

Embodiment 2

In this embodiment, a light-emitting element of one embodiment of the present invention will be described with reference to FIGS. 1A to 1C.

In a light-emitting element of this embodiment, an EL layer (a layer containing a light-emitting substance) is interposed between a pair of electrodes. The EL layer includes at least a layer containing the composite material of one embodiment of the present invention described in Embodiment 1 and a light-emitting layer. The EL layer may additionally include another layer. For example, the EL layer may include a layer containing a substance having a high carrier-injection property or a layer containing a substance having a high carrier-transport property so that a light-emitting region is formed in a region away from the electrodes, that is, so that carriers recombine in a region away from the electrodes. In this specification, the layer containing a substance having a high carrier-injection or a high carrier-transport property is also called a functional layer which functions, for instance, to inject or transport carriers. As a functional layer, a hole-injection layer, a hole-transport layer, an electron-injection layer, an electron-transport layer, or the like can be used. Note that in this embodiment, the layer containing the composite material of one embodiment of the present invention is used as a hole-injection layer.

It is preferable that one or more layers (such as a hole-transport layer) be provided between the layer containing the composite material of one embodiment of the present invention and the light-emitting layer. Accordingly, it is possible to suppress quenching (a decrease in efficiency) caused by transfer of excitation energy generated in the light-emitting layer to the layer containing the composite material, and it is possible to obtain a more efficient element.

In the light-emitting element illustrated in FIG. 1A, an EL layer 102 is provided between a first electrode 101 and a second electrode 108. In the EL layer 102, a hole-injection layer 701, a hole-transport layer 702, a light-emitting layer 703, an electron-transport layer 704, and an electron-injection layer 705 are stacked in this order over the first electrode 101. Note that, in the light-emitting element described in this embodiment, the first electrode 101 functions as an anode and the second electrode 108 functions as a cathode.

As a support of the light-emitting element (see a substrate 100 in FIG. 1A), a glass substrate, a quartz substrate, a plastic substrate, or the like can be used, for example. Furthermore, a flexible substrate may be used. The flexible substrate is a substrate that can be bent, such as a plastic substrate made of polycarbonate, polyarylate, or polyether sulfone, for example. A film (made of polypropylene, polyester, vinyl, polyvinyl fluoride, vinyl chloride, or the like), an inorganic film formed by evaporation, or the like can also be used. Note that materials other than these can be used as long as they can function as a support of the light-emitting element.

For the first electrode 101, any of a variety of metals, alloys, conductive compounds, mixtures thereof, and the like can be used. Examples include indium oxide-tin oxide (ITO: indium tin oxide), indium oxide-tin oxide containing silicon or silicon oxide, indium oxide-zinc oxide (IZO: indium zinc oxide), indium oxide containing tungsten oxide and zinc oxide (IWZO), and the like. Films of these conductive metal oxides are usually formed by sputtering, but may be formed by application of a sol-gel method or the like. For example, an IZO film can be formed by a sputtering method using a target obtained by adding 1 wt % to 20 wt % of zinc oxide to indium oxide. Further, an IWZO film can be formed by a sputtering method using a target obtained by adding 0.5 wt % to 5 wt % of tungsten oxide and 0.1 wt % to 1 wt % of zinc oxide to indium oxide. Other examples are gold, platinum, nickel, tungsten, chromium, molybdenum, iron, cobalt, copper, palladium, nitrides of metal materials (e.g., titanium nitride), and the like.

As a material of the first electrode 101, it is preferable to use a material having a high work function (a work function higher than or equal to 4.0 eV). Note that in a light-emitting element having a structure where the first electrode 101 and the layer containing the composite material of one embodiment of the present invention are in contact with each other, a material used for the first electrode 101 is not limited to a material having a high work function and can be a material having a low work function. For example, aluminum, silver, an alloy including aluminum (e.g., Al—Si), or the like can also be used.

The hole-injection layer 701 is a layer that contains the composite material of one embodiment of the present invention.

The heterocyclic compound (see Embodiment 1) used for the composite material of one embodiment of the present invention has a low HOMO level and an excellent hole-injection property to the hole-transport layer 702 and the light-emitting layer 703. On the other hand, an injection barrier is generated between the first electrode 101 and the heterocyclic compound, and holes are not easily injected from the first electrode 101.

However, in the light-emitting element of one embodiment of the present invention, the composite material of one embodiment of the present invention (a material including the heterocyclic compound and an inorganic compound exhibiting an electron-accepting property with respect to the heterocyclic compound) is used for the hole-injection layer 701; thus, the injection barrier between the first electrode 101 and the hole-injection layer 701 can be reduced. Therefore, it is possible to realize an element having a low injection barrier from the first electrode 101 to the light-emitting layer 703 and a high carrier-injection property, and it is possible to provide a light-emitting element having a low drive voltage.

Furthermore, the composite material of one embodiment of the present invention has high carrier-generation efficiency and a high carrier-transport property. Therefore, with the use of the composite material of one embodiment of the present invention, it is possible to realize a light-emitting element having high emission efficiency.

In addition, with the heterocyclic compound, a high absorption peak is not generated in the visible light region. Furthermore, the heterocyclic compound has a low HOMO level, and light absorption based on charge transfer interaction with the inorganic compound is unlikely to occur. Thus, in the composite material of one embodiment of the present invention, an absorption peak in the visible light region is unlikely to be generated, and the composite material has a high light-transmitting property. Therefore, this also shows that with the use of the composite material of one embodiment of the present invention, it is possible to realize a light-emitting element having high emission efficiency.

The composite material of one embodiment of the present invention can suppress charge accumulation; therefore, a light-emitting element having a long lifetime can be provided.

The hole-transport layer 702 is a layer that contains a substance having a high hole-transport property. As a material of the hole-transport layer 702, the heterocyclic compound used for the composite material of one embodiment of the present invention may be used. Other examples of the substance having a high hole-transport property are aromatic amine compounds such as 4,4'-bis[N-(1-naphthyl)-N-phenylamino]biphenyl (abbreviation: NPB or α-NPB), N,N'-bis(3-methylphenyl)-N,N'-diphenyl-[1,1'-biphenyl]-4,4'-diamine (abbreviation: TPD), 4-phenyl-4'-(9-phenylfluoren-9-yl)triphenylamine (abbreviation: BPAFLP), 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances mentioned here are mainly substances that have a hole mobility of $10^{-6}$ cm$^2$/Vs or more. Note that other than these substances, any substance that has a property of transporting more holes than electrons may be used. Note that the layer containing a substance having a high hole-transport property is not limited to a single layer, and may be a stack of two or more layers containing any of the above substances.

For the hole-transport layer 702, a carbazole derivative such as 4,4'-di(N-carbazolyl)biphenyl (abbreviation: CBP), 9-[4-(10-phenyl-9-anthryl)phenyl]-9H-carbazole (abbreviation: CzPA), or 9-phenyl-3-[4-(10-phenyl-9-anthryl)phenyl]-9H-carbazole (abbreviation: PCzPA) or an anthracene derivative such as 2-tert-butyl-9,10-di(2-naphthyl)anthracene (abbreviation: t-BuDNA), 9,10-di(2-naphthyl)anthracene (abbreviation: DNA), or 9,10-diphenylanthracene (abbreviation: DPAnth) may be used.

In particular, the heterocyclic compound in the composite material of one embodiment of the present invention has a low HOMO level; therefore, a material having a low HOMO level can be used also for the hole-transport layer. With such a structure, it is possible to prevent charge accumulation at the interface between the light-emitting layer and the hole-transport layer, and it is possible to extend the lifetime of the light-emitting element. Specifically, it is preferable that the HOMO level of the hole-transport layer be lower than or equal to −5.6 eV. From such a point of view, a carbazole derivative, a dibenzothiophene derivative, a dibenzofuran derivative, an anthracene derivative, or the like is preferable as a compound that is used for the hole-transport layer.

Note that for the hole-transport layer 702, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl)methacrylamide] (abbreviation: PTPDMA), or poly[N,N'-bis(4-butylphenyl)-N,N'-bis(phenyl)benzidine] (abbreviation: Poly-TPD) can also be used.

The light-emitting layer 703 is a layer that contains a light-emitting organic compound. As the light-emitting organic compound, for example, a fluorescent compound which emits fluorescence or a phosphorescent compound which emits phosphorescence can be used.

Examples of a fluorescent compound that can be used for the light-emitting layer 703 are the following light-emitting materials, for example: materials that emit blue light, such as N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl)triphenylamine (abbreviation: PCBAPA); materials that emit green light, such as N-(9,10-diphenyl-2-anthryl)-N,9-diphenyl-9H-carbazol-3-amine (abbreviation: 2PCAPA), N-[9,10-bis(1,1-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA); materials that emit yellow light, such as rubrene and 5,12-bis(1,1'-biphenyl-4-yl)-6,11-diphenyltetracene (abbreviation: BPT); and materials that emit red light, such as N,N,N',N'-tetrakis(4-methylphenyl)tetracene-5,11-diamine (abbreviation: p-mPhTD) and 7,14-diphenyl-N,N,N',N'-tetrakis(4-methylphenyl)acenaphtho[1,2-a]fluoranthene-3,10-d famine (abbreviation: p-mPhAFD).

Examples of a phosphorescent compound that can be used for the light-emitting layer 703 are the following light-emitting materials, for example: materials that emit blue light, such as bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis{2-[3',5'-bis(trifluoromethyl)phenyl]pyridinato-N,C$^{2'}$}iridium(III)picolinate (abbreviation: Ir(CF$_3$ ppy)$_2$(pic)), and bis[2-(4',6'-difluorophenyl)pyridinato-N,C$^{2'}$]iridium(III)acetylacetonate (abbreviation: FIr(acac)); materials that emit green light, such as tris(2-phenylpyridinato-N,C$^{2'}$)iridium(III) (abbreviation: Ir(ppy)$_3$), bis(2-phenylpyridinato-N,C$^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and tris(benzo[h]quinolinato)iridium(III) (abbreviation: Ir(bzq)$_3$); materials that emit yellow light, such as bis(2,4-diphenyl-1,3-oxazolato-N,C$^{2'}$)iridium(III)acetylacetonate (abbreviation: Ir(dpo)$_2$(acac)), bis[2-(4'-(perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), and (acetylacetonato)bis{2-(4-methoxyphenyl)-3,5-dimethylpyrazinato}iridium(III) (abbreviation: Ir(dmmoppr)$_2$(acac)); materials that emit orange light, such as tris(2-phenylquinolinato-N,C$^{2'}$)iridium(III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), and (acetylacetonato)bis(5-isopropyl-3-methyl-2-phenylpyrazinato)iridium(III) (abbreviation: Ir(mppr-iPr)$_2$(acac)); and materials that emit red light, for example, organometallic complexes, such as bis[2-(2'-benzo[4,5-α]thienyl)pyridinato-N,C$^{3'}$)iridium(III) acetylacetonate (abbreviation: Ir(btp)$_2$(acac)), bis(1-phenylisoquinolinato-N,C$^{2'}$)iridium(III) acetylacetonate (abbreviation: Ir(piq)$_2$(acac), (acetylacetonato)bis[2,3-bis(4- fluorophenyl)quinoxalinato]iridium(III) (abbreviation: Ir(Fdpq)₂(acac)), (acetylacetonato)bis(2,3,5-triphenylpyrazinato)iridium(III) (abbreviation: Ir(tppr)₂(acac)), (dipivaloylmethanato)bis(2,3,5-triphenylpyrazinato)iridium (III) (abbreviation: Ir(tppr)₂(dpm)), and (2,3,7,8,12,13,17,18-octaethyl-21H,23H-porphyrin)platinum(II) (abbreviation: PtOEP). Any of the following rare earth metal complexes can be used as a phosphorescent compound: tris(acetylacetonato)(monophenanthroline)terbium(III) (abbreviation: Tb(acac)₃(Phen)); tris(1,3-diphenyl-1,3-propanedionato)(monophenanthroline) europium(II) (abbreviation: Eu(DBM)₃(Phen)); and tris[1-(2-thenoyl)-3,3,3-trifluoroacetonato](monophenanthroline)europium(III) (abbreviation: Eu(TTA)₃(Phen)), because their light emission is from a rare earth metal ion (electronic transition between different multiplicities) in such a rare earth metal complex.

Note that the light-emitting layer 703 may have a structure in which any of the above-described light-emitting organic compounds (a guest material) is dispersed into another substance (a host material). A variety of substances can be used as the host material, and it is preferable to use a substance having a lowest unoccupied molecular orbital level (LUMO level) higher than that of a light-emitting substance and having a HOMO level lower than that of the light-emitting substance.

Specific examples of the host material that can be used are the following materials: metal complexes, such as tris(8-quinolinolato)aluminum(III) (abbreviation: Alq), tris(4-methyl-8-quinolinolato)aluminum(III) (abbreviation: Almq₃), bis(10-hydroxybenzo quinolinato)beryllium(II) (abbreviation: BeBq₂), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds, such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), and bathocuproine (BCP); condensed aromatic compounds, such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyeanthracene (abbreviation: DNA), 2-tert-butyl-9,10-di(2-naphthyl)anthracene, (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), and 6,12-dimethoxy-5,11-diphenylchrysene; aromatic amine compounds, such as N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, and BSPB; and the like.

Plural kinds of host materials can also be used. For example, in order to suppress crystallization, a substance such as rubrene which suppresses crystallization, may be further added. In addition, NPB, Alq, or the like may be further added in order to efficiently transfer energy to the guest material.

With a structure in which a guest material is dispersed in a host material, crystallization of the light-emitting layer 703 can be suppressed. In addition, concentration quenching due to high concentration of the guest material can also be suppressed.

For the light-emitting layer 703, a high molecular compound can be used. Specific examples of blue light-emitting materials are poly(9,9-dioctylfluorene-2,7-diyl) (abbreviation: PFO), poly[(9,9-dioctylfluorene-2,7-diyl)-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), and the like. Specific examples of green light-emitting materials are poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly[(9,9-dioctyl-2,7-divinylenefluorenylene)-alt-co-(2-methoxy-5-(2-ethylhexyloxy)-1,4-phenylene)], and the like. Specific examples of orange to red light-emitting materials are poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenylamino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), and the like.

Further, by providing a plurality of light-emitting layers and making emission colors of the light-emitting layers different, light emission of a desired color can be obtained from the light-emitting element as a whole. For example, the emission colors of first and second light-emitting layers are complementary in a light-emitting element having the two light-emitting layers, so that the light-emitting element can be made to emit white light as a whole. Note that the term "complementary" means color relationship in which an achromatic color is obtained when colors are mixed. That is, emission of white light can be obtained by mixture of light emitted from substances whose emission colors are complementary colors. Further, the same applies to a light-emitting element having three or more light-emitting layers.

The electron-transport layer 704 is a layer that contains a substance having a high electron-transport property. Examples of the substance having a high electron-transport property are metal complexes having a quinoline skeleton or a benzoquinoline skeleton, such as tris(8-quinolinolato)aluminum (abbreviation: Alq), tris(4-methyl-8-quinolinolato) aluminum (abbreviation: Almq₃), bis(10-hydroxybenzo[h]quinolinato)beryilium (abbreviation: BeBq₂), and bis(2-methyl-8-quinolinolato)(4-phenylphenolato)aluminum (abbreviation: BAlq). Other examples are metal complexes having an oxazole-based or thiazole-based ligand, such as bis[2-(2-hydroxyphenyl)benzoxazolato]zinc (abbreviation: Zn(BOX)₂) and bis[2-(2-hydroxyphenyl)benzothiazolato]zinc (abbreviation: Zn(BTZ)₂). Other than metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. The substances described here are mainly substances having an electron mobility of $10^{-6}$ cm$^2$/Vs or more. Further, the electron-transport layer is not limited to a single layer, and may be a stack of two or more layers containing any of the above substances.

The electron-injection layer 705 is a layer that contains a substance having a high electron-injection property. Examples of the substance that can be used for the electron-injection layer 705 are alkali metals, alkaline earth metals, and compounds thereof, such as lithium, cesium, calcium, lithium fluoride, cesium fluoride, calcium fluoride, and lithium oxide, rare earth metal compounds, such as erbium fluoride, and the above-mentioned substances for forming the electron-transport layer 704.

Note that the hole-injection layer 701, the hole-transport layer 702, the light-emitting layer 703, the electron-transport layer 704, and the electron-injection layer 705 which are described above can each be formed by a method, such as an evaporation method (e.g., a vacuum evaporation method), an inkjet method, or a coating method.

Figure 2A:
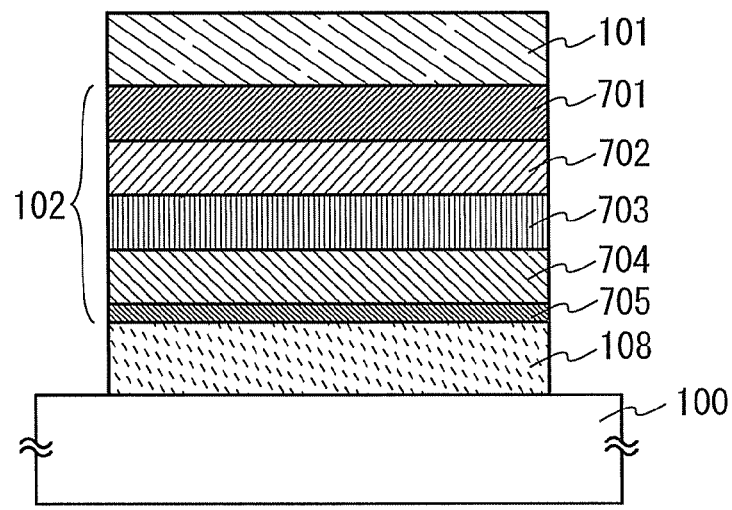
FIGS. 2A and 2B illustrate light-emitting elements of one embodiment of the present invention.

In a light-emitting element illustrated in FIG. 2A, the EL layer 102 is provided between a pair of electrodes, the first electrode 101 and the second electrode 108, over the substrate 100. The EL layer 102 includes the hole-injection layer 701, the hole-transport layer 702, the light-emitting layer 703, the electron-transport layer 704, and the electron-injection layer 705. The light-emitting element in FIG. 2A includes the second electrode 108 serving as a cathode over the substrate 100, the electron-injection layer 705, the electron-transport layer 704, the light-emitting layer 703, the hole-transport layer 702, and the hole-injection layer 701 which are stacked over the second electrode 108 in this order, and the first electrode 101 provided thereover which serves as an anode.

Furthermore, by making emission colors of EL layers different, light of a desired color can be obtained from the light-emitting element as a whole. For example, the emission colors of first and second EL layers are complementary in a light-emitting element having the two EL layers, so that the light-emitting element can be made to emit white light as a whole. Further, the same applies to a light-emitting element having three or more EL layers.

Figure 1B:
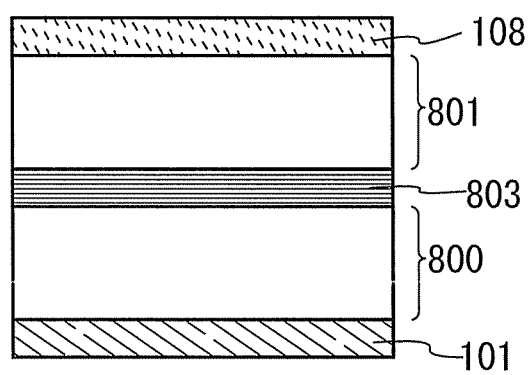

A plurality of EL layers may be stacked between the first electrode 101 and the second electrode 108 as illustrated in FIG. 1B. In that case, a charge-generation layer 803 is preferably provided between a first EL layer 800 and a second EL layer 801 which are stacked. The charge-generation layer 803 can be formed using the composite material of one embodiment of the present invention. The composite material of one embodiment of the present invention has high carrier generation efficiency and a high hole-transport property at the time of voltage application. Therefore, with the use of the composite material of one embodiment of the present invention, it is possible to realize a light-emitting element having a low drive voltage. In addition, it is possible to realize a light-emitting element having high emission efficiency.

In addition, with the heterocyclic compound, an absorption peak in the visible light region is unlikely to be generated. Furthermore, the heterocyclic compound has a low HOMO level, and light absorption based on charge transfer interaction with the inorganic compound is unlikely to occur. Thus, in the composite material of one embodiment of the present invention, an absorption peak in the visible light region is unlikely to be generated, and the composite material has a high light-transmitting property. Therefore, this also shows that with the use of the composite material of one embodiment of the present invention, it is possible to realize a light-emitting element having high emission efficiency.

Further, the charge-generation layer 803 may have a stacked structure including a layer containing the composite material of one embodiment, of the present invention and a layer containing another material. In that case, as the layer containing another material, a layer containing an electron-donating substance and a substance with a high electron-transport property, a layer formed of a transparent conductive film, or the like can be used. As for a light-emitting element having such a structure, problems such as energy transfer and quenching hardly occur, and a light-emitting element which has both high emission efficiency and a long lifetime can be easily obtained due to expansion in the choice of materials. Moreover, a light-emitting element which provides phosphorescence from one of the EL layers and fluorescence from the other of the EL layers can be readily obtained. Note that this structure can be combined with the above-described structures of the EL layer.

Figure 2B:
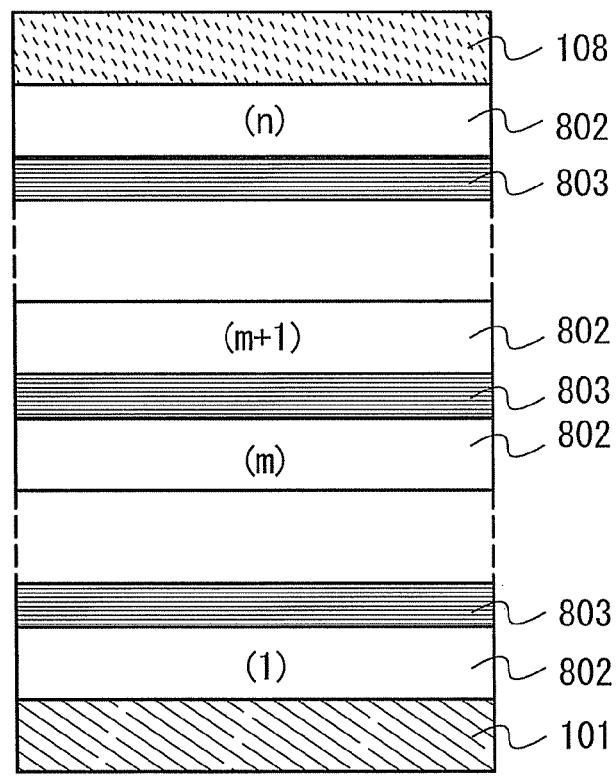

Similarly, a light-emitting element in which three or more EL layers 802 are stacked as illustrated in FIG. 2B can also be employed. A plurality of EL layers with a charge-generation layer interposed therebetween is provided between a pair of electrodes, as in the light-emitting element according to this embodiment, whereby it is possible to realize an element having a long lifetime which can emit light at a high luminance while current density is kept low.

Figure 1C:
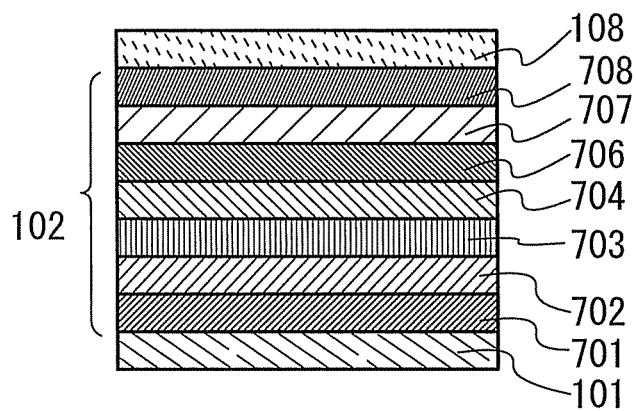

As illustrated in FIG. 1C, the EL layer may include the hole-injection layer 701, the hole-transport layer 702, the light-emitting layer 703, the electron-transport layer 704, an electron-injection buffer layer 706, an electron-relay layer 707, and a composite material layer 708 which is in contact with the second electrode 108, between the first electrode 101 and the second electrode 108.

It is preferable to provide the composite material layer 708 which is in contact with the second electrode 108, in which case damage caused to the EL layer 102 particularly when the second electrode 108 is formed by a sputtering method can be reduced. The composite material layer 708 can be formed using the composite material of one embodiment of the present invention.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

A substance having a high electron-injection property, such as an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), or a rare earth metal compound (e.g., an oxide, a halide, and a carbonate), can be used for the electron-injection buffer layer 706.

Further, in the case where the electron-injection buffer layer 706 contains a substance having a high electron-transport property and a donor substance, the donor substance is preferably added so that the mass ratio of the donor substance to the substance having a high electron-transport property ranges from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide of lithium oxide or the like, a halide, and a carbonate such as lithium carbonate or cesium carbonate), an alkaline earth metal compound (including an oxide, a halide, and a carbonate), and a rare earth metal compound (including an oxide, a halide, and a carbonate). Note that as the substance having a high electron-transport property, a material similar to the material for the electron-transport layer 704 described above can be used.

Furthermore, it is preferable that the electron-relay layer 707 be formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other, and thus their functions hardly interfere with each other. Therefore, an increase in drive voltage can be suppressed.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor substance contained in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably higher than or equal to −5.0 eV, more preferably higher than or equal to −5.0 eV and lower than or equal to −3.0 eV.

As the substance having a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, for example, any of CuPc, a phthalocyanine tin(II) complex (SnPc), a phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc), is preferably used.

As the metal complex having a metal-oxygen bond and an aromatic ligand, which is contained in the electron-relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex having a metal-oxygen double bond is considered stable. Thus, the use of the metal complex having the metal-oxygen double bond enables the light-emitting element to be driven more stably at low voltage.

As the metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is likely to act on another molecular in terms of a molecular structure and an acceptor property is high.

Note that as the phthalocyanine-based materials described above, a phthalocyanine-based material having a phenoxy group is preferable. Specifically, a phthalocyanine derivative having a phenoxy group, such as PhO-VOPc, is preferable. The phthalocyanine derivative having a phenoxy group is soluble in a solvent; thus, the phthalocyanine derivative has an advantage of being easily handled during formation of a light-emitting element and an advantage of facilitating maintenance of an apparatus used for film formation.

The electron-relay layer 707 may further contain a donor substance. As the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron-relay layer 707, electrons can be transferred easily and the light-emitting element can be driven at lower voltage.

In the case where a donor substance is contained in the electron-relay layer 707, other than the materials described above as the substance having a high electron-transport property, a substance having a LUMO level higher than the acceptor level of the acceptor substance contained in the composite material layer 708 can be used. Specifically, it is preferable to use a substance having a LUMO level higher than or equal to −5.0 eV, preferably higher than or equal to −5.0 eV and lower than or equal to −3.0 eV. As examples of such a substance, a perylene derivative, a nitrogen-containing condensed aromatic compound, and the like are given. Note that a nitrogen-containing condensed aromatic compound is preferably used for the electron-relay layer 707 because of its stability.

Specific examples of the perylene derivative are 3,4,9,10-perylenetetracarboxylic dianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (abbreviation: Hex PTC), and the like.

Specific examples of the nitrogen-containing condensed aromatic compound are pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylic dianhydride (abbreviation: NTCDA), perfluoropentacene, copper hexadecafluorophthalocyanine (abbreviation: F$_{16}$CuPc), N,N'-bis(2,2,3,3,4,4,5,5,6,6,7,7,8,8-pentadecafluorooctyl-1,4,5,8-naphthalenetetracarboxylic diimide (abbreviation: NTCDI-C8F), 3',4'-dibutyl-5,5"-bis(dicyanomethylene)-5, 5"-dihydro-2,2':5',2"-terthiophen (abbreviation: DCMT), methanofullerene (e.g., [6,6]-phenyl $C_{61}$ butyric acid methyl ester), or the like can be used.

Note that in the case where a donor substance is contained in the electron-relay layer 707, the electron-relay layer 707 may be formed by a method such as co-evaporation of the substance having a high electron-transport property and the donor substance.

The hole-injection layer 701, the hole-transport layer 702, the light-emitting layer 703, and the electron-transport layer 704 may each be formed using any of the above-described materials.

Note that this embodiment can be implemented in appropriate combination with any of the other embodiments.

Embodiment 3

In this embodiment, a light-emitting device including a light-emitting element of one embodiment of the present invention will be described with reference to FIGS. 3A and 3B. Note that FIG. 3A is a top view illustrating the light-emitting device, and FIG. 3B is a cross-sectional view taken along lines A-B and C-D of FIG. 3A.

Figure 3A:
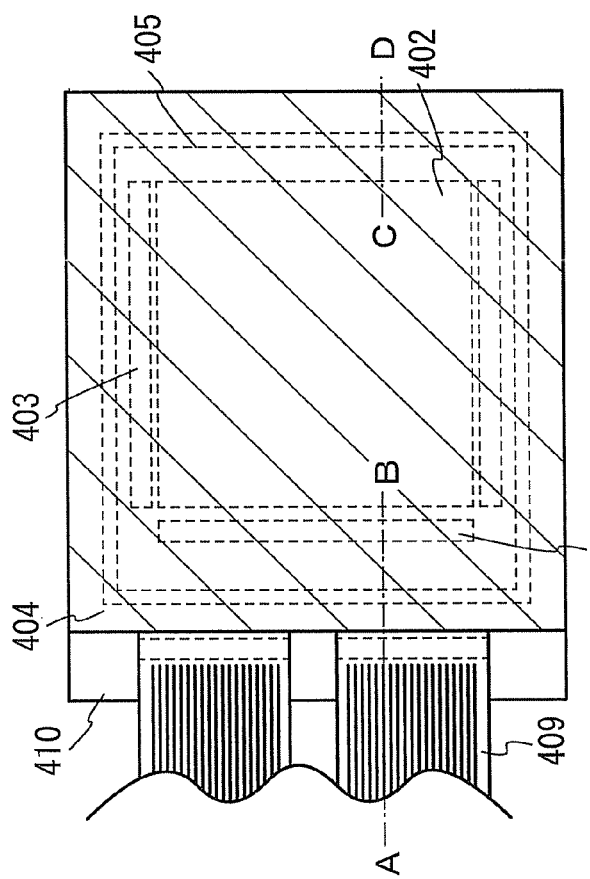
FIGS. 3A and 3B illustrate a light-emitting device of one embodiment of the present invention.
Figure 3B:
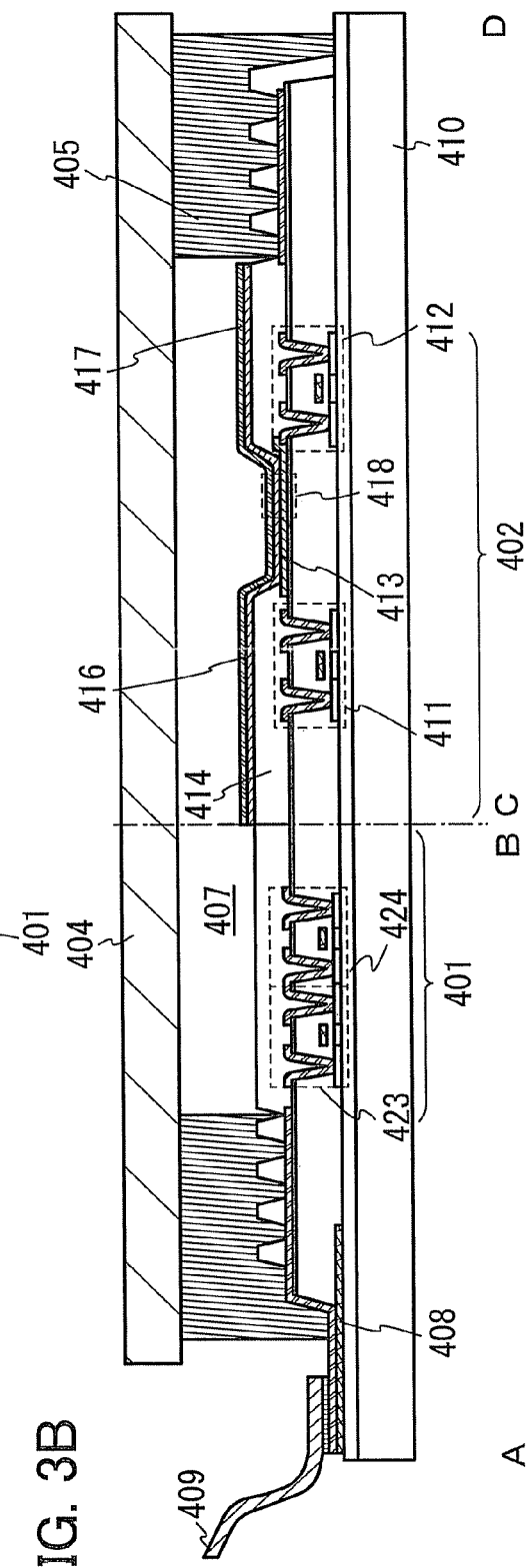

In FIG. 3A, reference numeral 401 denotes a driver circuit portion (a source side driver circuit), reference numeral 402 denotes a pixel portion, and reference numeral 403 denotes a driver circuit portion (a gate side driver circuit), which are each indicated by dotted lines. Reference numeral 404 denotes a sealing substrate, reference numeral 405 denotes a sealing material, and a portion enclosed by the sealing material 405 is a space 407.

Note that a lead wiring 408 is a wiring for transmitting signals that are to be input to the source side driver circuit 401 and the gate side driver circuit 403, and receives a video signal, a clock signal, a start signal, a reset signal, and the like from a flexible printed circuit (FPC) 409 which serves as an external input terminal. Although only the FPC is illustrated here, a printed wiring board (PWB) may be attached to the FPC. The light-emitting device in this specification includes not only a light-emitting device itself but also a light-emitting device to which an FPC or a PWB is attached.

Next, a cross-sectional structure will be described with reference to FIG. 3B. The driver circuit portion and the pixel portion are formed over an element substrate 410. Here, the source side driver circuit 401 which is the driver circuit portion and one pixel in the pixel portion 402 are illustrated.

Note that as the source side driver circuit 401, a CMOS circuit which includes an n-channel TFT 423 and a p-channel TFT 424 is formed. The driver circuit may be any of a variety of circuits formed with TFTs, such as a CMOS circuit, a PMOS circuit, or an NMOS circuit. Although a driver-integrated type in which a driver circuit is formed over the substrate is described in this embodiment, the present invention is not limited to this type, and the driver circuit can be formed outside the substrate.

The pixel portion 402 includes a plurality of pixels having a switching TFT 411, a current control TFT 412, and a first electrode 413 electrically connected to a drain of the current control TFT 412. Note that an insulator 414 is formed to cover an end portion of the first electrode 413. Here, the insulator 414 is formed by using a positive type photosensitive acrylic resin film.

In order to improve coverage, the insulator 414 is provided such that either an upper end portion or a lower end portion of the insulator 414 has a curved surface with a curvature. For example, when positive photosensitive acrylic is used as a material for the insulator 414, it is preferable that only an upper end portion of the insulator 414 have a curved surface with a radius of curvature (0.2 μm to 3 μm). For the insulator 414, it is also possible to use either a negative type that becomes insoluble in an etchant by light irradiation or a positive type that becomes soluble in an etchant by light irradiation.

An EL layer 416 and a second electrode 417 are formed over the first electrode 413. Here, as a material for forming the first electrode 413 functioning as the anode, a material having a high work function is preferably used. For example, it is possible to use a single layer of an ITO film, an indium tin oxide film that includes silicon, an indium oxide film that includes 2 wt % to 20 wt % of zinc oxide, a titanium nitride film, a chromium film, a tungsten film, a Zn film, a Pt film, or the like, a stacked layer of a titanium nitride film and a film that mainly includes aluminum, a three-layer structure of a titanium nitride film, a film that mainly includes aluminum, and a titanium nitride film, or the like. Note that, when a stacked layer structure is employed, resistance of a wiring is low and an excellent ohmic contact is obtained.

In addition, the EL layer 416 is formed by any of various methods such as an evaporation method using an evaporation mask, a droplet discharging method like an inkjet method, a printing method, and a spin coating method. The EL layer 416 includes the composite material described in Embodiment 1. Further, another material included in the EL layer 416 may be a low molecular material, an oligomer, a dendrimer, a high molecular material, or the like.

As a material used for the second electrode 417 which is formed over the EL layer 416 and serves as a cathode, it is preferable to use a material having a low work function (e.g., Al, Mg, Li, Ca, or an alloy or a compound thereof such as Mg—Ag, Mg—In, or Al—Li). In order that light generated in the EL layer 416 be transmitted through the second electrode 417, a stack of a metal thin film having a reduced thickness and a transparent conductive film (e.g., ITO, indium oxide containing 2 wt % to 20 wt % of zinc oxide, indium oxide-tin oxide that includes silicon or silicon oxide, or zinc oxide) is preferably used for the second electrode 417.

Further, the sealing substrate 404 is attached to the element substrate 410 with the sealing material 405, so that a light-emitting element 418 is provided in the space 407 enclosed by the element substrate 410, the sealing substrate 404, and the sealing material 405. The space 407 is filled with a filler, and may be filled with an inert gas (such as nitrogen or argon) or the sealing material 405.

Note that an epoxy-based resin is preferably used as the sealing material 405. Such a material preferably allows as little moisture and oxygen as possible to penetrate. As a material used for the sealing substrate 404, a plastic substrate formed of fiberglass-reinforced plastics (FRP), polyvinyl fluoride (PVF), polyester, acrylic, or the like can be used other than a glass substrate or a quartz substrate.

As described above, the active matrix light-emitting device including the light-emitting element of one embodiment of the present invention can be obtained.

Figure 4A:
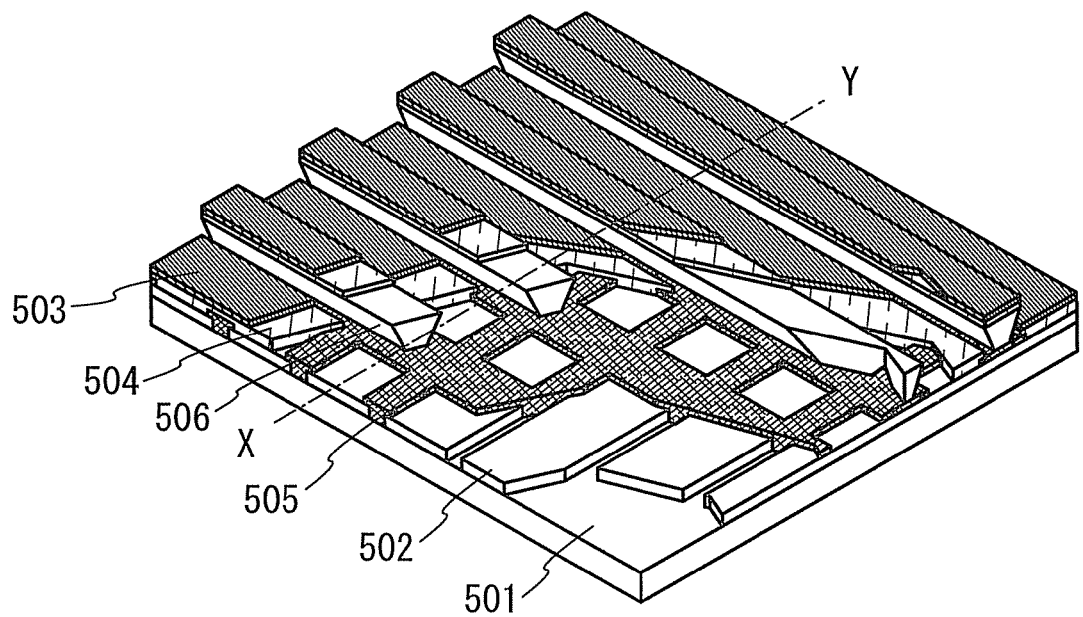
FIGS. 4A and 4B illustrate a light-emitting device of one embodiment of the present invention.
Figure 4B:
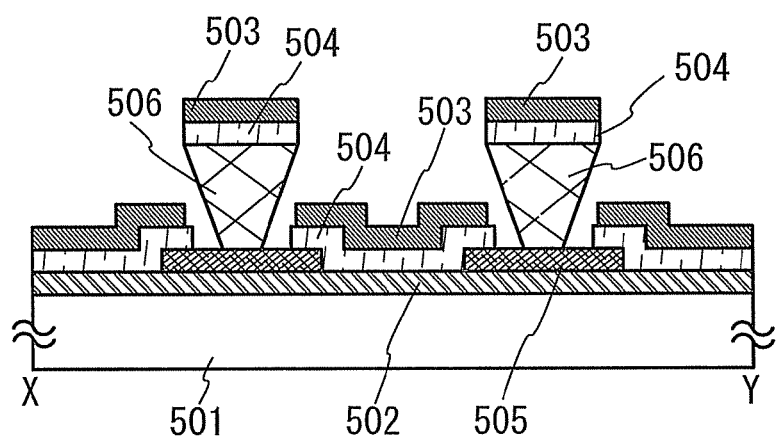

Further, a light-emitting element of the present invention can be used for a passive matrix light-emitting device as well as the above active matrix light-emitting device. FIGS. 4A and 4B illustrate a perspective view and a cross-sectional view of a passive matrix light-emitting device including a light-emitting element of the present invention. Note that FIG. 4A is a perspective view of the light-emitting device, and FIG. 4B is a cross-sectional view taken along line X-Y of FIG. 4A.

In FIGS. 4A and 4B, an EL layer 504 is provided between a first electrode 502 and a second electrode 503 over a substrate 501. An end portion of the first electrode 502 is covered with an insulating layer 505. In addition, a partition layer 506 is provided over the insulating layer 505. The sidewalls of the partition layer 506 slope so that a distance between both the sidewalls is gradually narrowed toward the surface of the substrate. In other words, a cross section taken along the direction of the short side of the partition layer 506 is trapezoidal, and the base (side in contact with the insulating layer 505) is shorter than the upper side (side not in contact with the insulating layer 505). With the partition layer 506 provided in such a way, a defect of a light-emitting element due to crosstalk or the like can be prevented.

Thus, the passive matrix light-emitting device including a light-emitting element of one embodiment of the present invention can be obtained.

The light-emitting devices described in this embodiment (the active matrix light-emitting device and the passive matrix light-emitting device) are both formed using a light-emitting element of one embodiment of the present invention, and accordingly, the light-emitting devices have low power consumption.

Note that this embodiment can be implemented in appropriate combination with any of the other embodiments.

Embodiment 4

In this embodiment, with reference to FIGS. 5A to 5E and FIG. 6, description is given of examples of a variety of electronic devices and lighting devices that are each completed by using a light-emitting device which is one embodiment of the present invention.

Examples of the electronic devices to which the light-emitting device is applied are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like. Specific examples of these electronic devices and a lighting device are illustrated in FIGS. 5A to 5E.

Figure 5A:
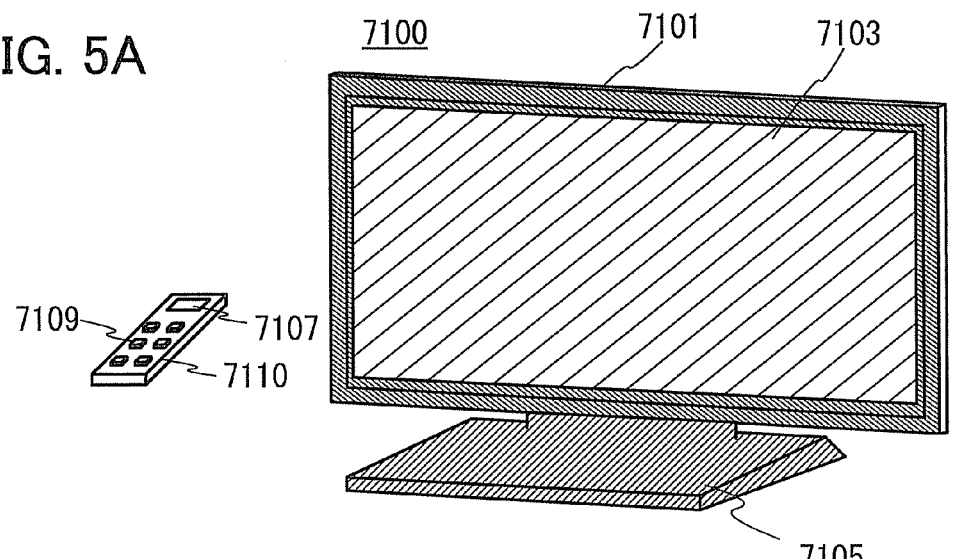
FIGS. 5A to 5E each illustrate an electronic device of one embodiment of the present invention.

FIG. 5A illustrates an example of a television device. In the television device 7100, a display portion 7103 is incorporated in a housing 7101. The display portion 7103 is capable of displaying images, and a light-emitting device can be used for the display portion 7103. In addition, here, the housing 7101 is supported by a stand 7105.

The television device 7100 can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the receiver, general television broadcasting can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

Figure 5B:
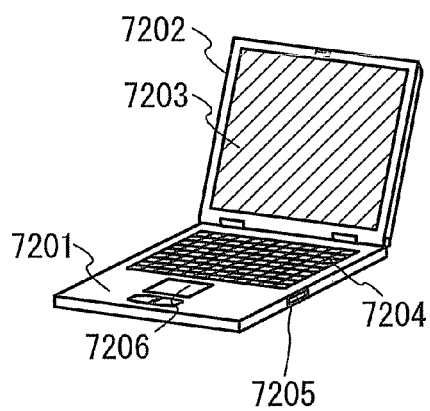

FIG. 5B illustrates a computer, which includes a main body 7201, a housing 7202, a display portion 7203, a keyboard 7204, an external connection port 7205, a pointing device 7206, and the like. This computer is manufactured by using a light-emitting device for the display portion 7203.

Figure 5C:
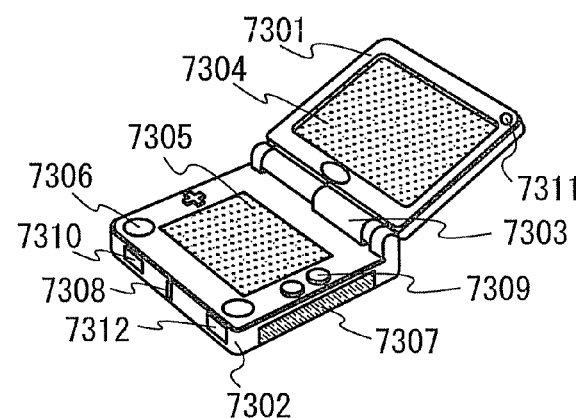

FIG. 5C illustrates a portable game machine, which includes two housings, a housing 7301 and a housing 7302, connected with a joint portion 7303 so that the portable game machine can be opened or closed. A display portion 7304 is incorporated in the housing 7301 and a display portion 7305 is incorporated in the housing 7302. In addition, the portable game machine illustrated in FIG. 5C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. It is needless to say that the structure of the portable game machine is not limited to the above as long as a light-emitting device is used for at least either the display portion 7304 or the display portion 7305, or both, and may include other accessories as appropriate. The portable game machine illustrated in FIG. 5C has a function of reading out a program or data stored in a storage medium to display it on the display portion, and a function of sharing information with another portable game machine by wireless communication. The portable game machine illustrated in FIG. 5C can have a variety of functions without limitation to the above.

Figure 5D:
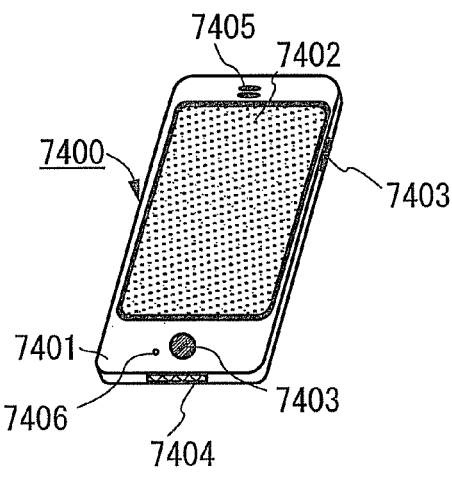

FIG. 5D illustrates an example of a cellular phone. The cellular phone 7400 is provided with a display portion 7402 incorporated in a housing 7401, operation buttons 7403, an external connection port 7404, a speaker 7405, a microphone 7406, and the like. Note that the cellular phone 7400 is manufactured using a light-emitting device for the display portion 7402.

When the display portion 7402 of the cellular phone 7400 illustrated in FIG. 5D is touched with a finger or the like, data can be input to the cellular phone 7400. Further, operations such as making a call and creating e-mail can be performed by touch on the display portion 7402 with a finger or the like.

There are mainly three screen modes of the display portion 7402. The first mode is a display mode mainly for displaying an image. The second mode is an input mode mainly for inputting information such as characters. The third mode is a display-and-input mode in which two modes of the display mode and the input mode are mixed.

For example, in the case of making a call or creating e-mail, a character input mode mainly for inputting characters is selected for the display portion 7402 so that characters displayed on a screen can be input. In this case, it is preferable to display a keyboard or number buttons on almost the entire screen of the display portion 7402.

When a detection device including a sensor for detecting inclination, such as a gyroscope or an acceleration sensor, is provided inside the cellular phone 7400, display on the screen of the display portion 7402 can be automatically changed by determining the orientation of the cellular phone 7400 (whether the cellular phone is placed horizontally or vertically for a landscape mode or a portrait mode).

The screen modes are switched by touch on the display portion 7402 or operation with the operation buttons 7403 of the housing 7401. Alternatively, the screen modes can be switched depending on kinds of images displayed on the display portion 7402. For example, when a signal for an image to be displayed on the display portion is data of moving images, the screen mode is switched to the display mode. When the signal is text data, the screen mode is switched to the input mode.

Moreover, in the input mode, if a signal detected by an optical sensor in the display portion 7402 is detected and the input by touch on the display portion 7402 is not performed during a certain period, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal identification can be performed. Furthermore, by provision of a backlight or a sensing light source emitting near-infrared light for the display portion, an image of a finger vein, a palm vein, or the like can also be taken.

Figure 5E:
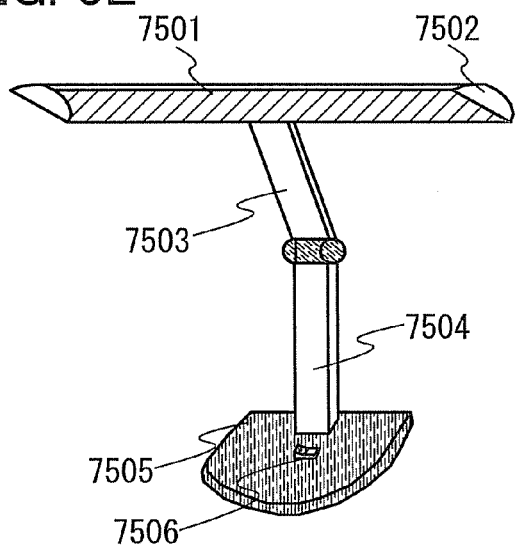

FIG. 5E illustrates a desk lamp, which includes a lighting portion 7501, a shade 7502, an adjustable arm 7503, a support 7504, a base 7505, and a power switch 7506. The desk lamp is manufactured using a light-emitting device for the lighting portion 7501. Note that the "lighting device" also includes ceiling lights, wall lights, and the like.

Figure 6:
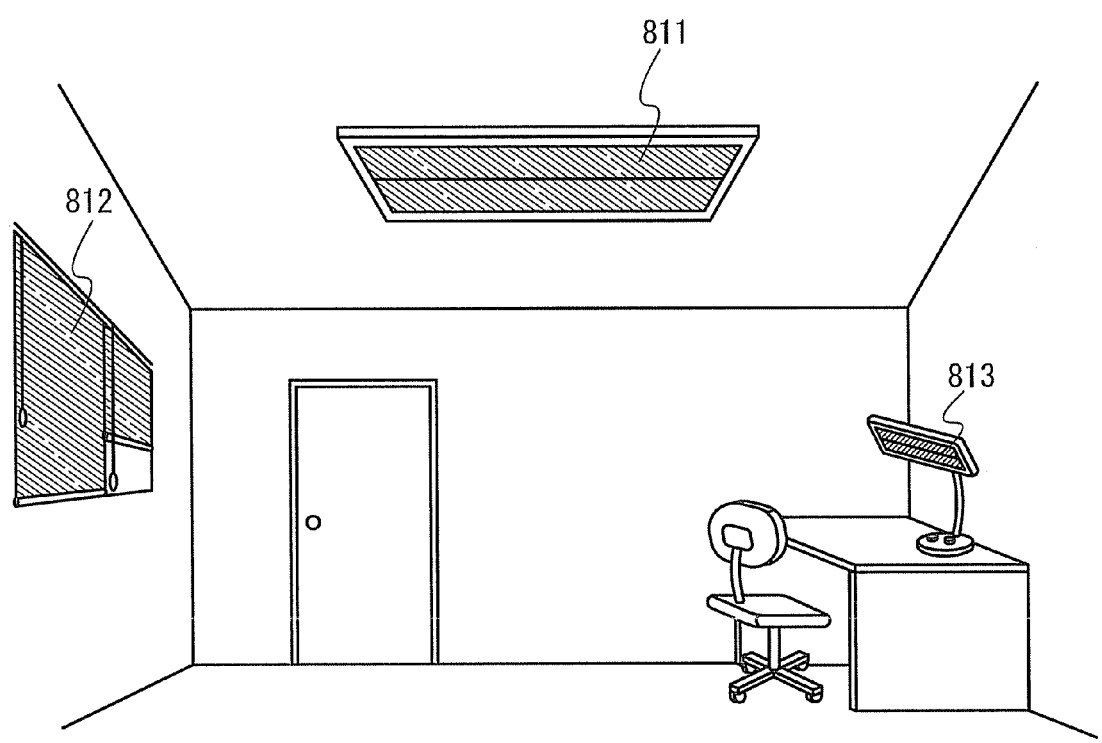
FIG. 6 illustrates a lighting device of one embodiment of the present invention.

FIG. 6 illustrates an example in which a light-emitting device is used for an interior lighting device 811. Since the light-emitting device can have a larger area, it can be used as a lighting device having a large area. Furthermore, the light-emitting device can be used as a roll-type lighting device 812. As illustrated in FIG. 6, a desk lamp 813 described with reference to FIG. 5E may also be used in a room provided with the interior lighting device 811.

In the above-described manner, electronic devices or lighting devices can be obtained by application of a light-emitting device. Application range of the light-emitting device is so wide that the light-emitting device can be applied to electronic devices in a variety of fields.

Note that the structure described in this embodiment can be combined with any of the structures described in Embodiments 1 to 3 as appropriate.

Example 1

In this example, specific examples of the composite material of one embodiment of the present invention will be described. The composite material of one embodiment of the present invention includes a heterocyclic compound having a dibenzothiophene skeleton or a dibenzofuran skeleton and an inorganic compound exhibiting an electron-accepting property with respect to the heterocyclic compound. Table 1 shows heterocyclic compounds used in Composition Examples 1 to 9 of this example and the HOMO levels of the heterocyclic compounds (measured by photoelectron spectrometry). In addition, structural formulae of the heterocyclic compounds are illustrated below.

TABLE 1

| | heterocyclic compound | HOMO level |
|---|---|---|
| Composition Example 1 | DBTFLP-IV | −6.0 |
| Composition Example 2 | DBT3P-II | −6.0 |
| Composition Example 3 | oDBTBP-II | −5.9 |
| Composition Example 4 | DBTFLP-III | −5.9 |
| Composition Example 5 | mDBTPTp-II | −5.9 |
| Composition Example 6 | DBT2PC-II | −5.7 |
| Composition Example 7 | 2mDBTPPA-II | −5.7 |
| Composition Example 8 | 2mDBFPPA-II | −5.7 |
| Composition Example 9 | mDBTPA-II | −5.7 |

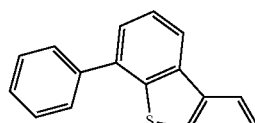

DBTFLP-IV

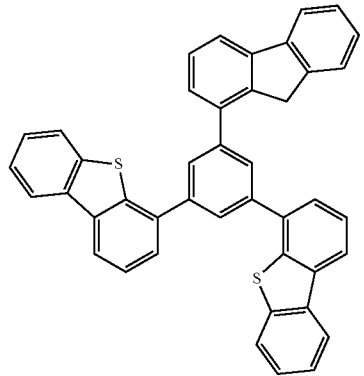

DBT3P-II

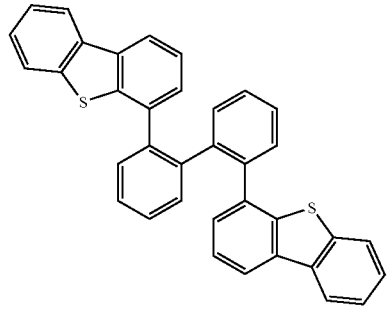

oDBTBP-II

TABLE 1-continued

| heterocyclic compound | HOMO level |
|---|---|

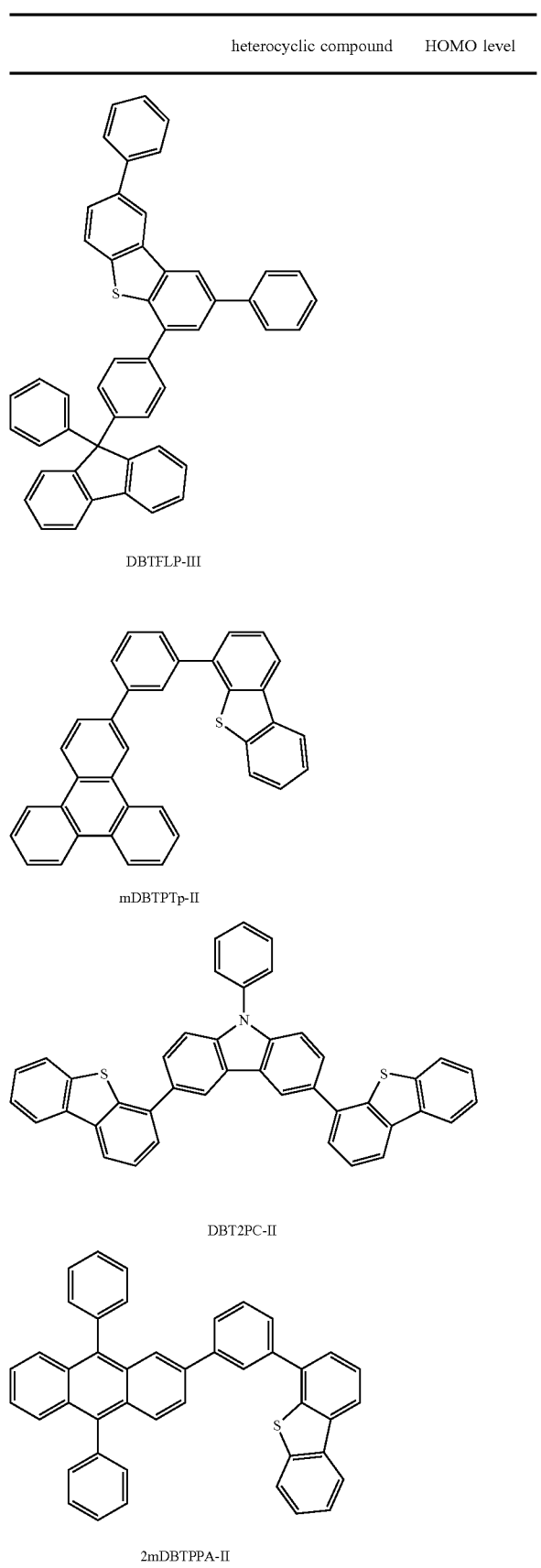

DBTFLP-III mDBTPTp-II

DBT2PC-II

2mDBTPPA-II

TABLE 1-continued

| heterocyclic compound | HOMO level |
|---|---|

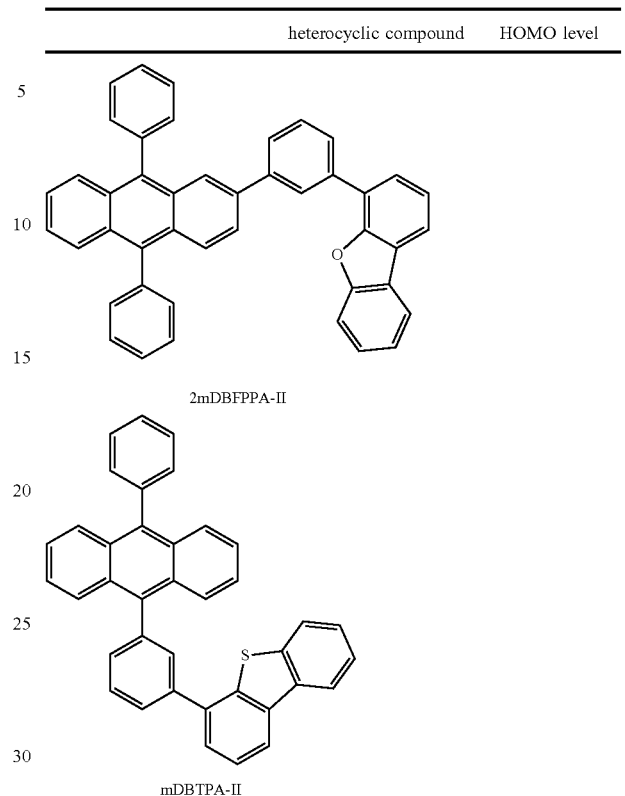

2mDBFPPA-II mDBTPA-II

In each of Composition Examples 1 to 9, molybdenum oxide was used as the inorganic compound.

A method for preparing the composite material of one embodiment of the present invention will be described using Composition Example 1 as an example. Composition Examples 2 to 9 were prepared in a manner similar to that of Composition Example 1; thus, the description thereof is omitted.

Composition Example 1

First, a glass substrate was fixed to a substrate holder inside a vacuum evaporation apparatus. Then, 4-[4-(9-phenyl-9H-fluoren-9-yl)phenyl]-6-phenyldibenzothiophene (abbreviation: DBTFLP-IV) and molybdenum(VI) oxide were separately put in respective resistance-heating evaporation sources, and in a vacuum state, films containing DBTFLP-IV and molybdenum oxide were formed by a co-evaporation method. At this time, DBTFLP-IV and molybdenum(VI) oxide were co-evaporated such that the mass ratios of DBTFLP-IV to molybdenum(VI) oxide were 4:2, 4:1, and 4:0.5 (=DBTFLP-IV: molybdenum oxide). Further, the thickness of each film was set to 50 nm.

Figure 7A:
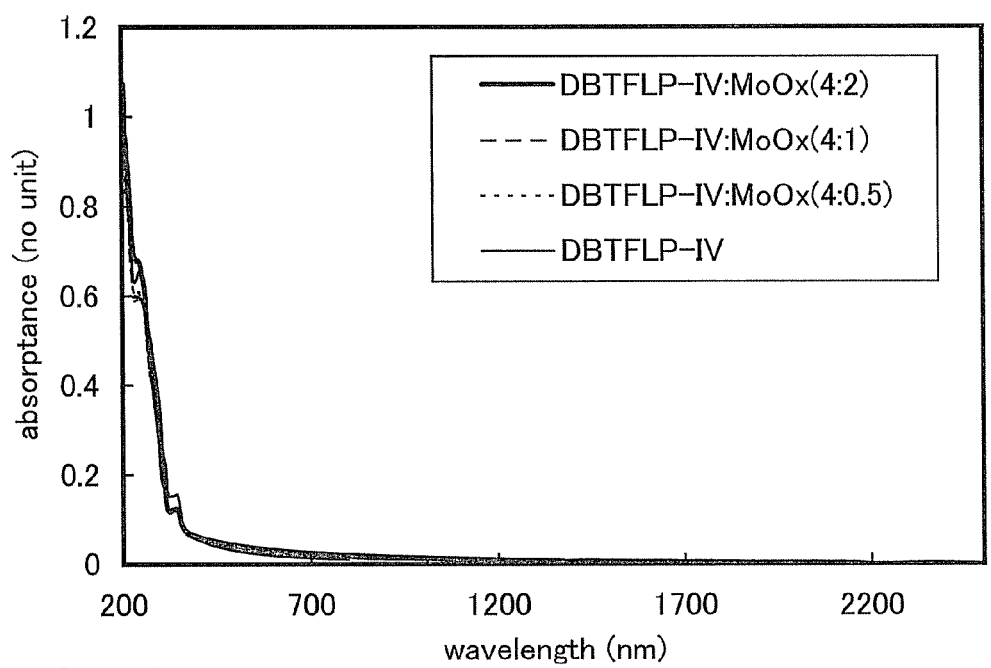
FIGS. 7A and 7B show absorptance of a composite material of one embodiment of the present invention.
Figure 7B:
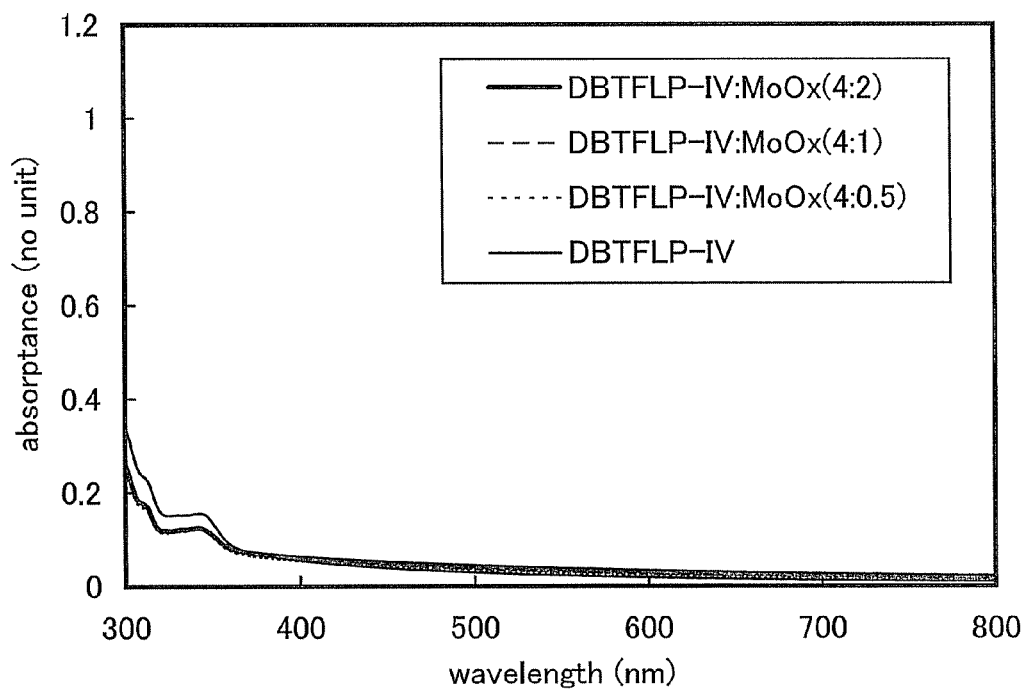

FIGS. 7A and 7B show results of measurement of absorption spectra of the thus formed composite films of DBTFLP-IV and molybdenum oxide (Composition Example 1). In addition, for comparison, an absorption spectrum of a film of only DBTFLP-IV (50 nm thick) is also shown. Note that as for Composition Examples 2 to 9, an absorption spectrum of a film of only the heterocyclic compound used in each composition example is also shown for comparison.

Figure 8A:
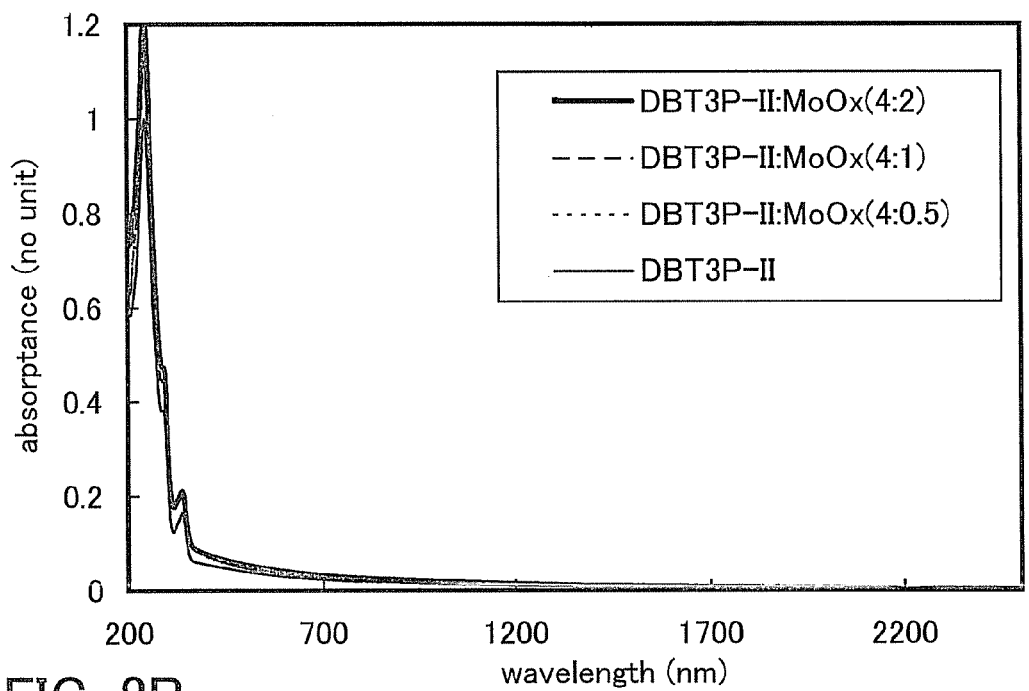
FIGS. 8A and 8B show absorptance of a composite material of one embodiment of the present invention.
Figure 8B:
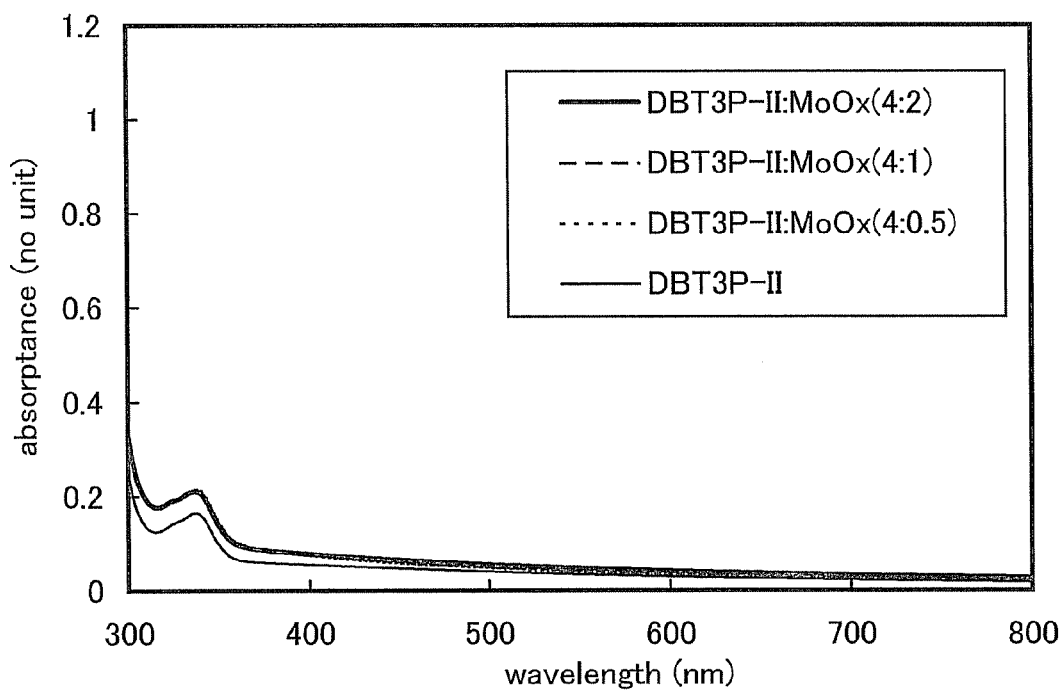

Similarly, FIGS. 8A and 8B show results of measurement of absorption spectra of composite films of 1,3,5-tri(dibenzothiophen-4-yl)-benzene (abbreviation: DBT3P-II) and molybdenum oxide (Composition Example 2). Note that the thickness of each film was set to 50 nm.

Figure 9A:
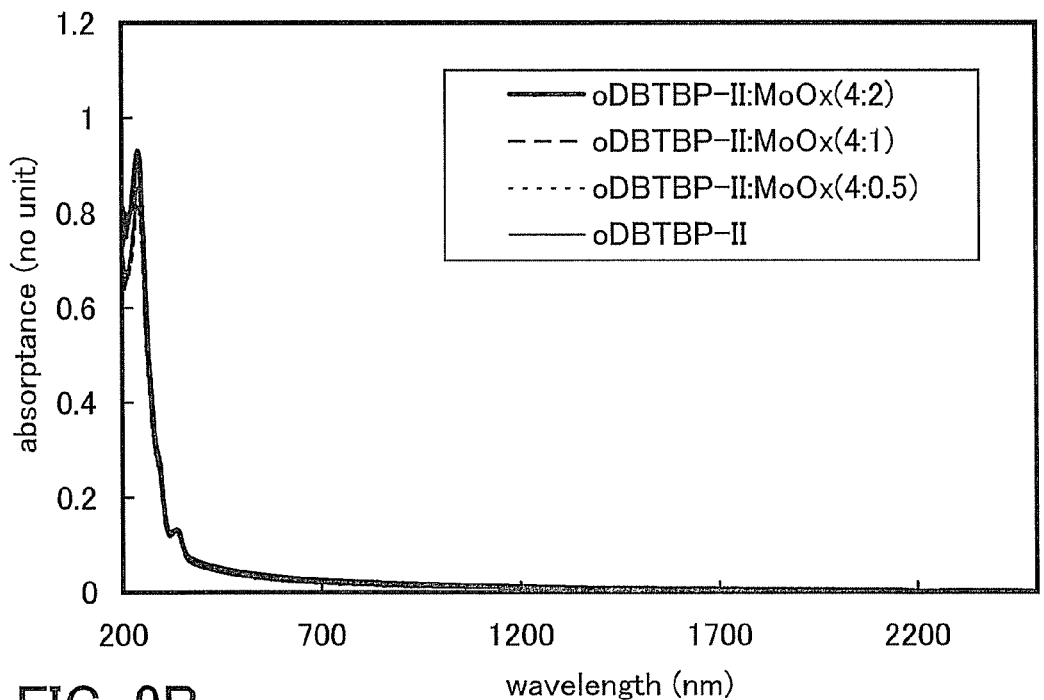
FIGS. 9A and 9B show absorptance of a composite material of one embodiment of the present invention.
Figure 9B:
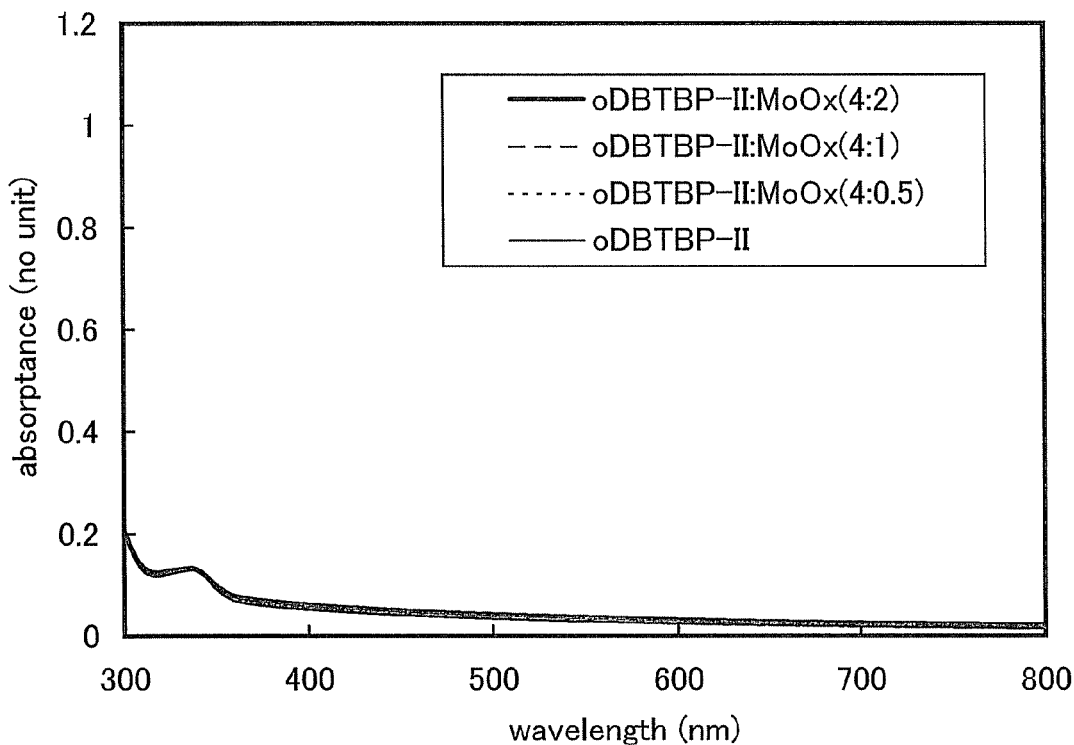

FIGS. 9A and 9B show results of measurement of absorption spectra of composite films of 4,4'-(biphenyl-2,2'-diyl)-bis-dibenzothiophene (abbreviation: oDBTBP-II) and molybdenum oxide (Composition Example 3). Note that the thickness of only a film of oDBTBP-II and molybdenum(VI) oxide at a mass ratio of 4:1 (=oDBTBP-II:molybdenum oxide) was 47 nm. The thickness of the other films was set to 50 nm.

Figure 10A:
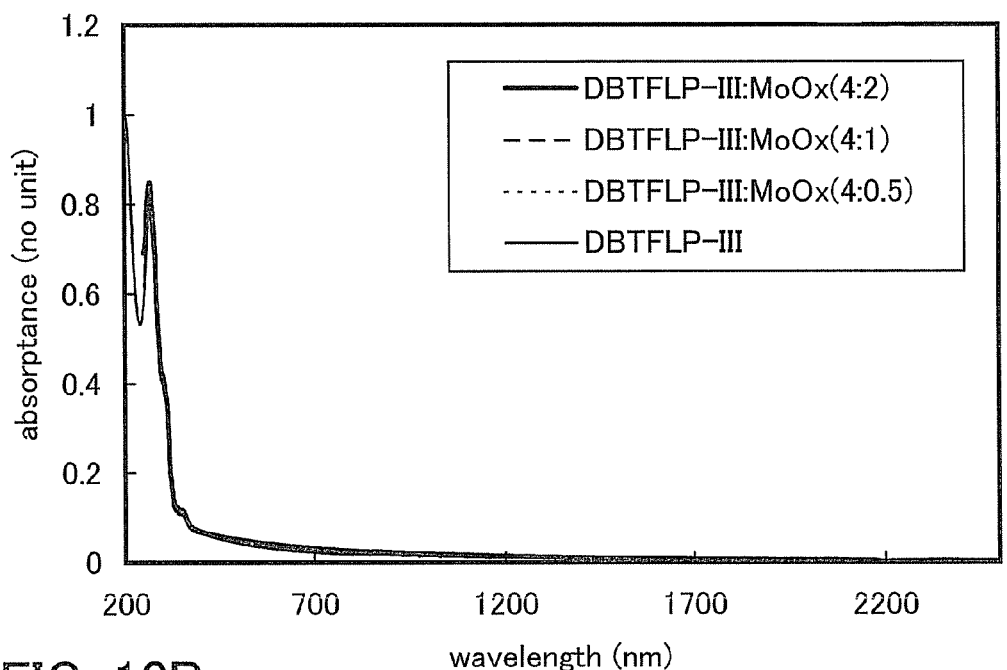
FIGS. 10A and 10B show absorptance of a composite material of one embodiment of the present invention.
Figure 10B:
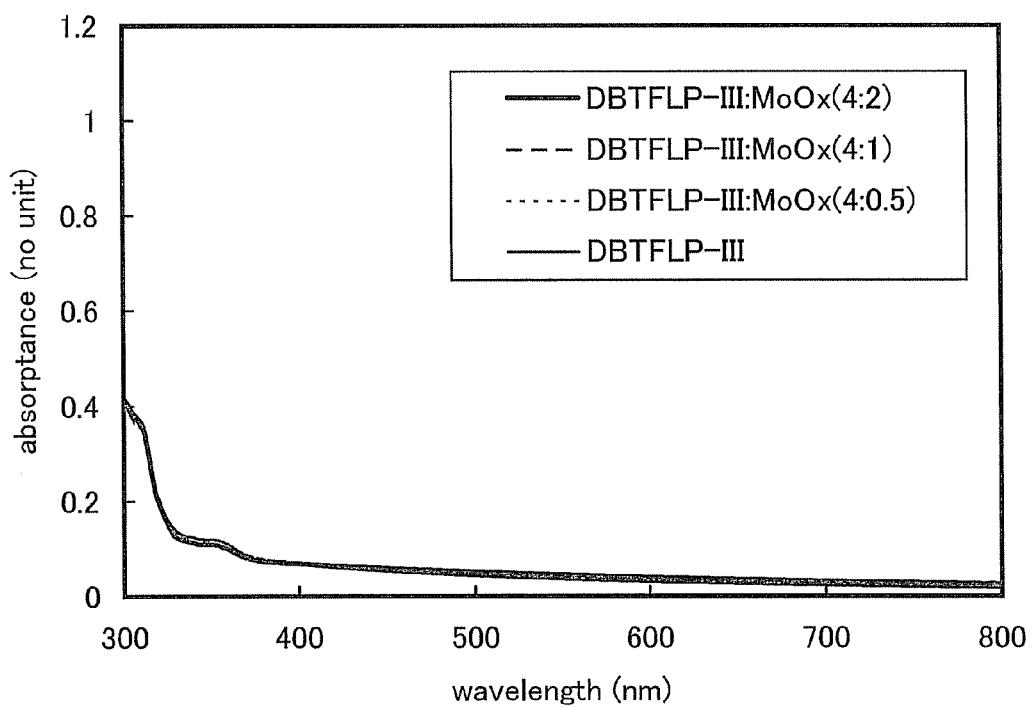

FIGS. 10A and 10B show results of measurement of absorption spectra of composite films of 2,8-diphenyl-4-[4-(9-phenyl-9H-fluoren-9-yl)phenyl]dibenzothiophene (abbreviation: DBTFLP-III) and molybdenum oxide (Composition Example 4). Note that the thickness of each film was set to 50 nm.

Figure 11A:
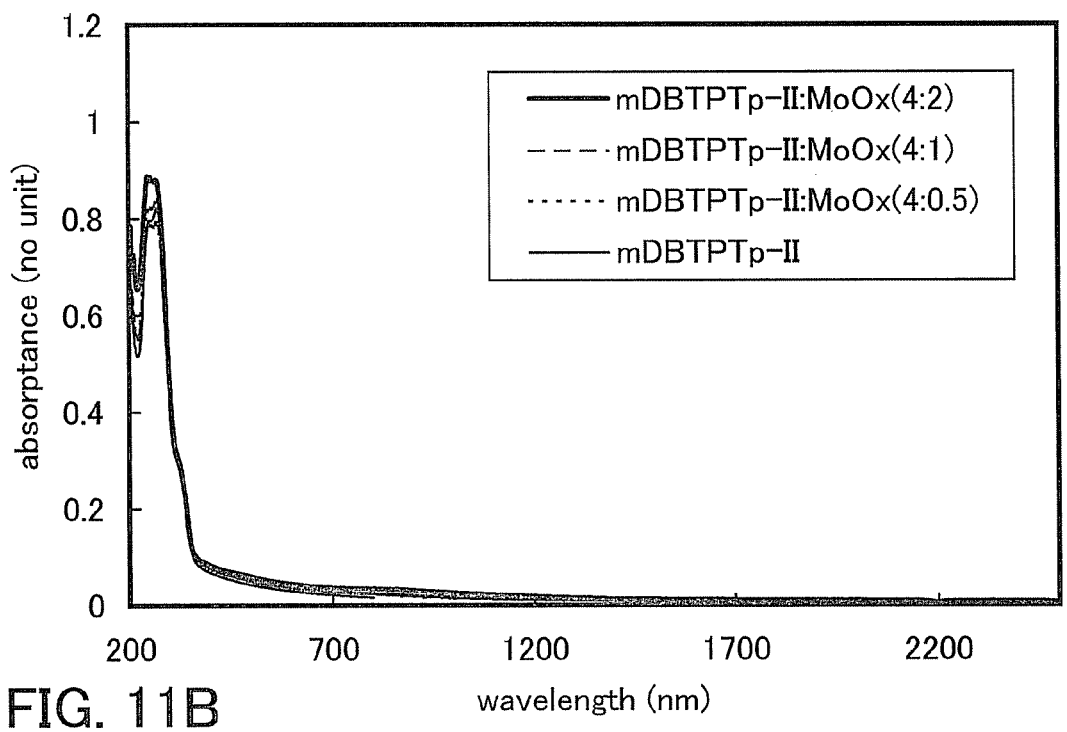
FIGS. 11A and 11B show absorptance of a composite material of one embodiment of the present invention.
Figure 11B:
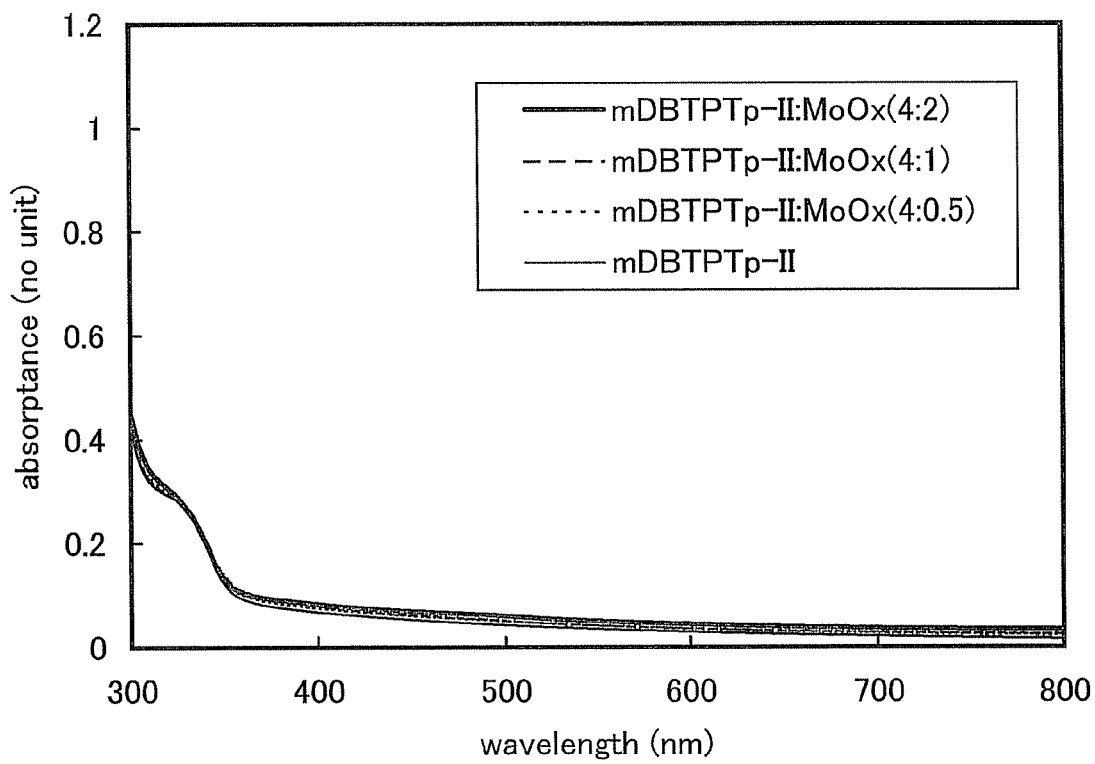

FIGS. 11A and 11B show results of measurement of absorption spectra of composite films of 4-[3-(triphenylen-2-yl)phenyl]dibenzothiophene (abbreviation: mDBTPTp-II) and molybdenum oxide (Composition Example 5). Note that the thickness of each film was set to 50 nm.

Figure 12A:
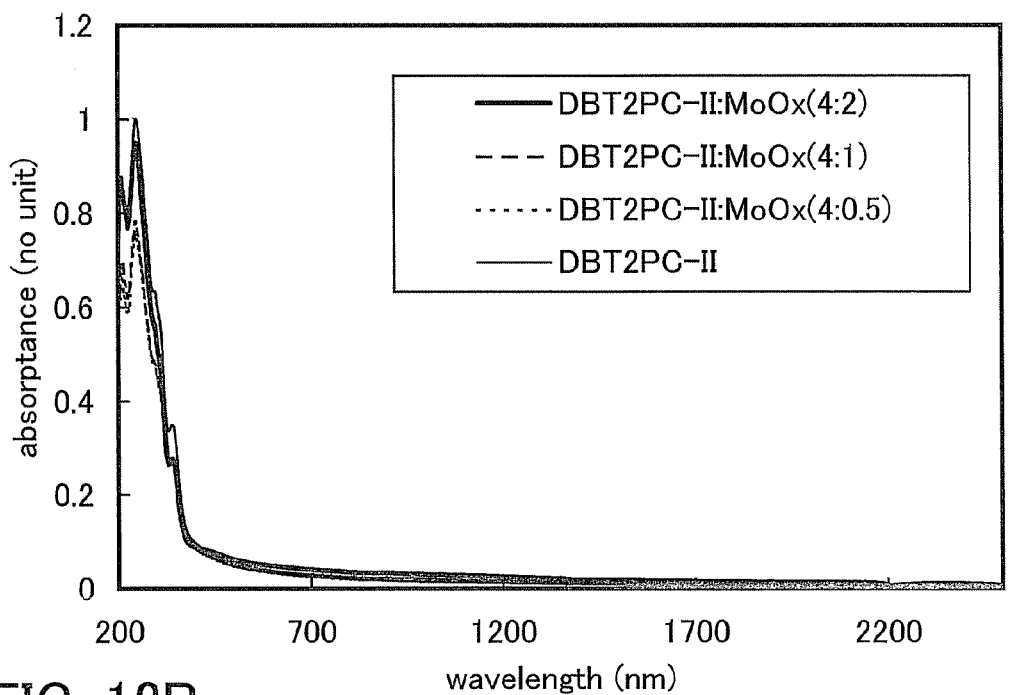
FIGS. 12A and 12B show absorptance of a composite material of one embodiment of the present invention.
Figure 12B:
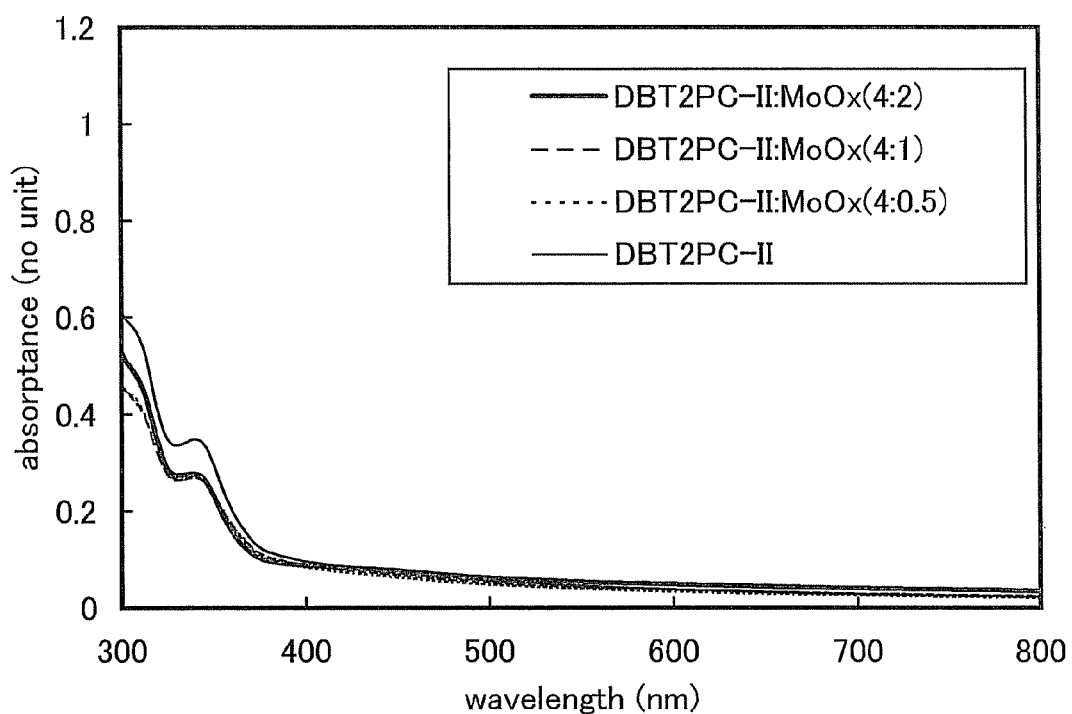

FIGS. 12A and 12B show results of measurement of absorption spectra of composite films of 3,6-di-(dibenzothiophen-4-yl)-9-phenyl-9H-carbazole (abbreviation: DBT2PC-II) and molybdenum oxide (Composition Example 6). Note that the thickness of each film was set to 50 nm.

Figure 13A:
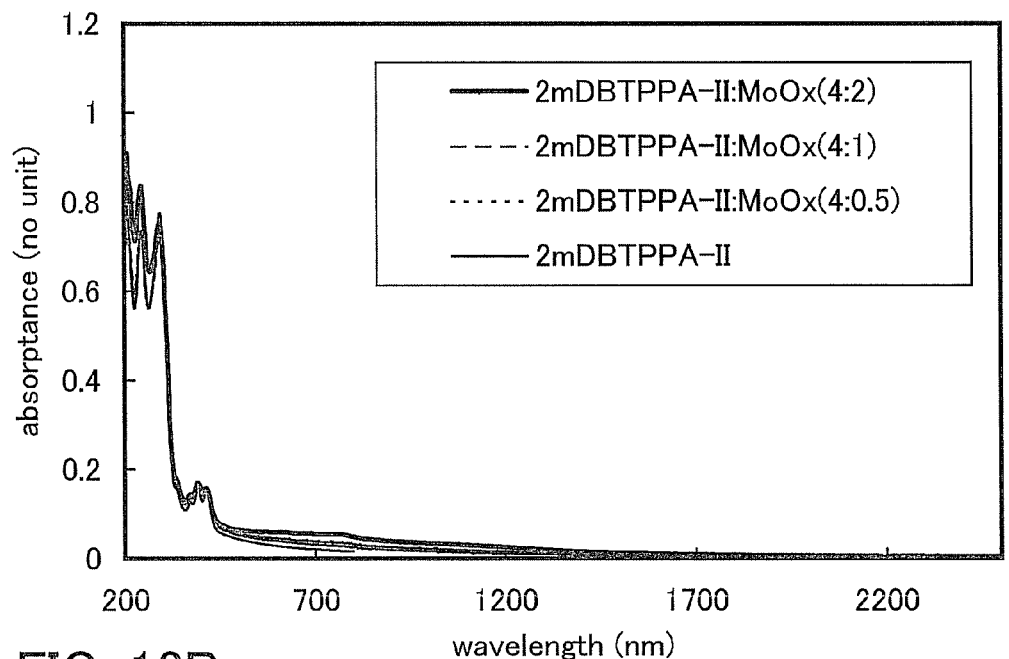
FIGS. 13A and 13B show absorptance of a composite material of one embodiment of the present invention.
Figure 13B:
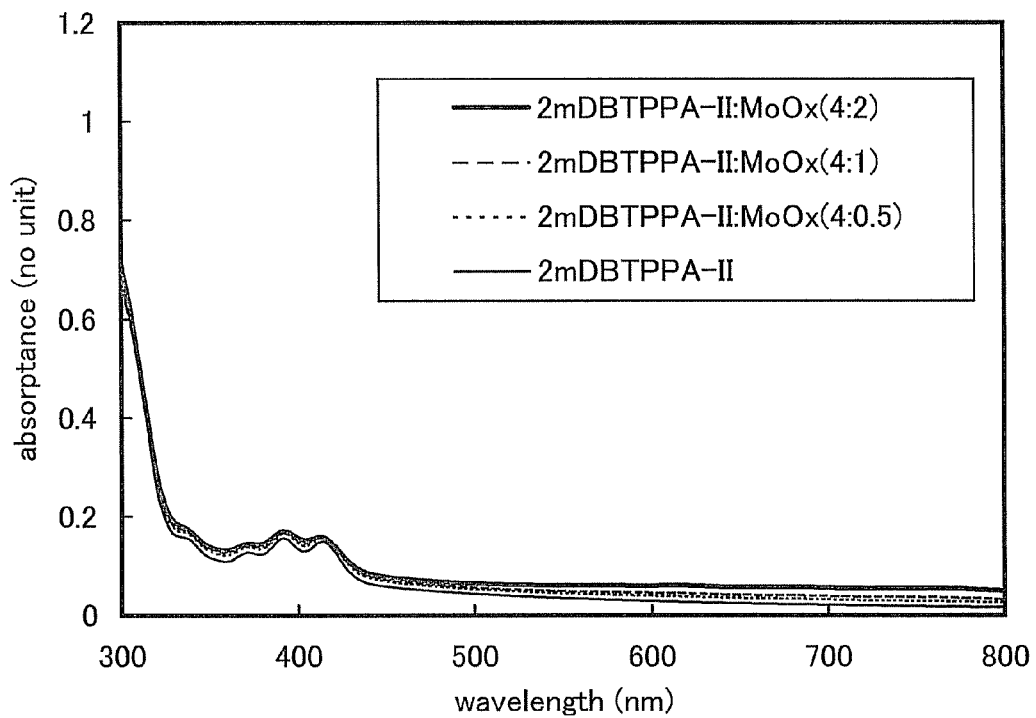

FIGS. 13A and 13B show results of measurement of absorption spectra of composite films of 4-[3-(9,10-diphenyl-2-anthryl)phenyl]dibenzothiophene (abbreviation: 2mDBTPPA-II) and molybdenum oxide (Composition Example 7). Note that the thickness of each film was set to 50 nm.

Figure 14A:
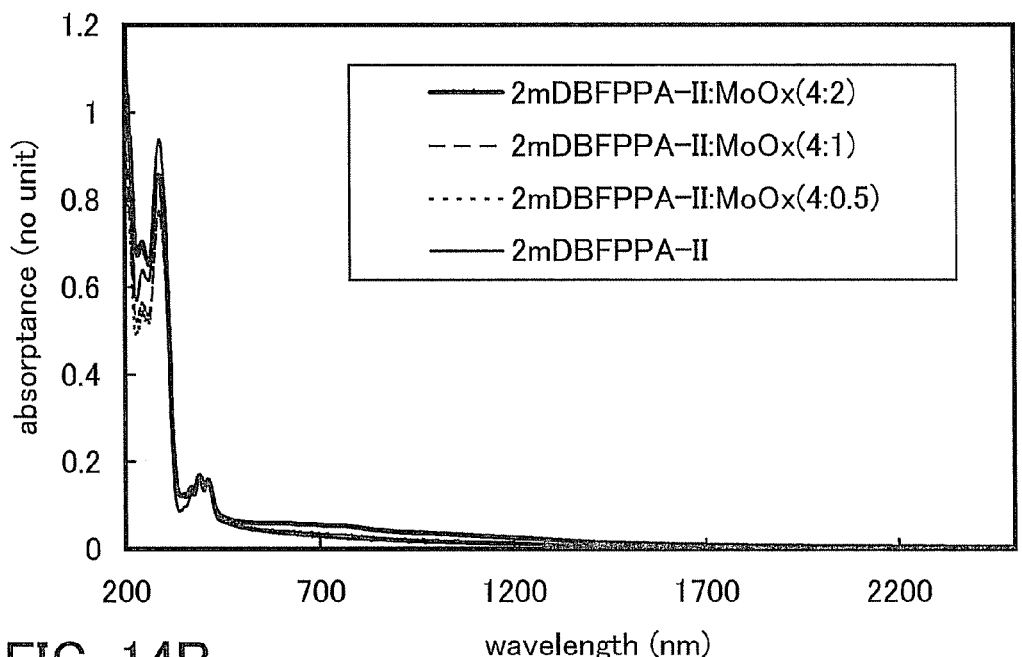
FIGS. 14A and 14B show absorptance of a composite material of one embodiment of the present invention.
Figure 14B:
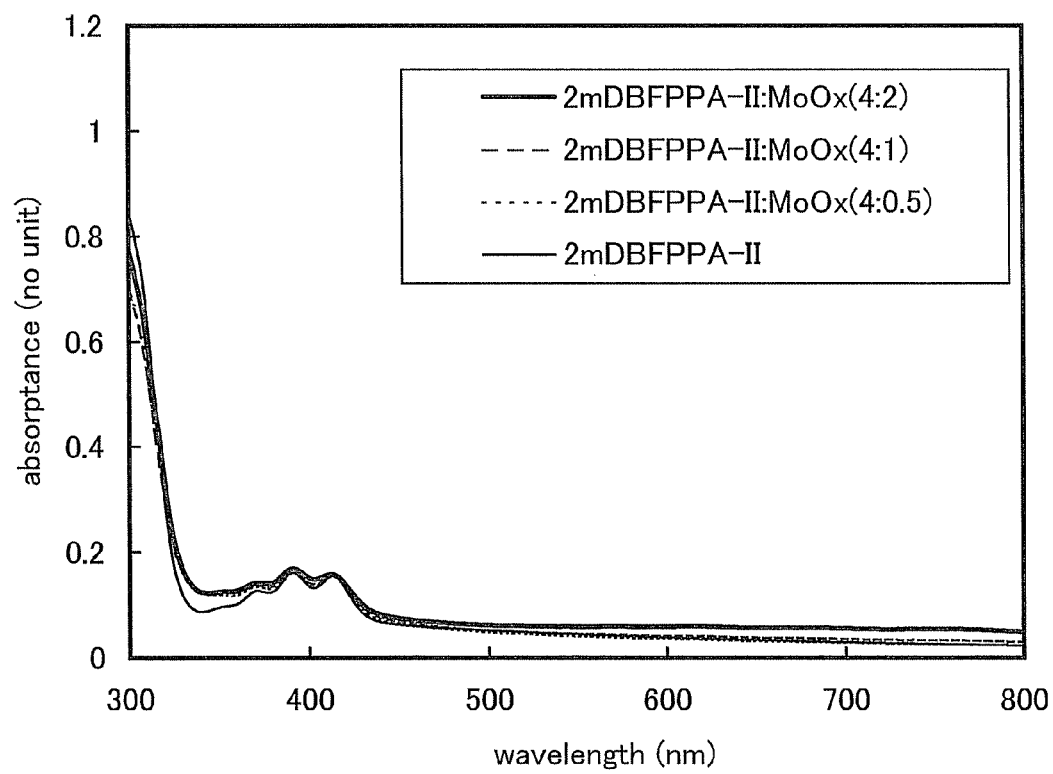

FIGS. 14A and 14B show results of measurement of absorption spectra of composite films of 4-[3-(9,10-diphenyl-2-anthryl)phenyl]dibenzofuran (abbreviation: 2mDBF-PPA-II) and molybdenum oxide (Composition Example 8). Note that the thickness of each film was set to 50 nm.

Figure 15A:
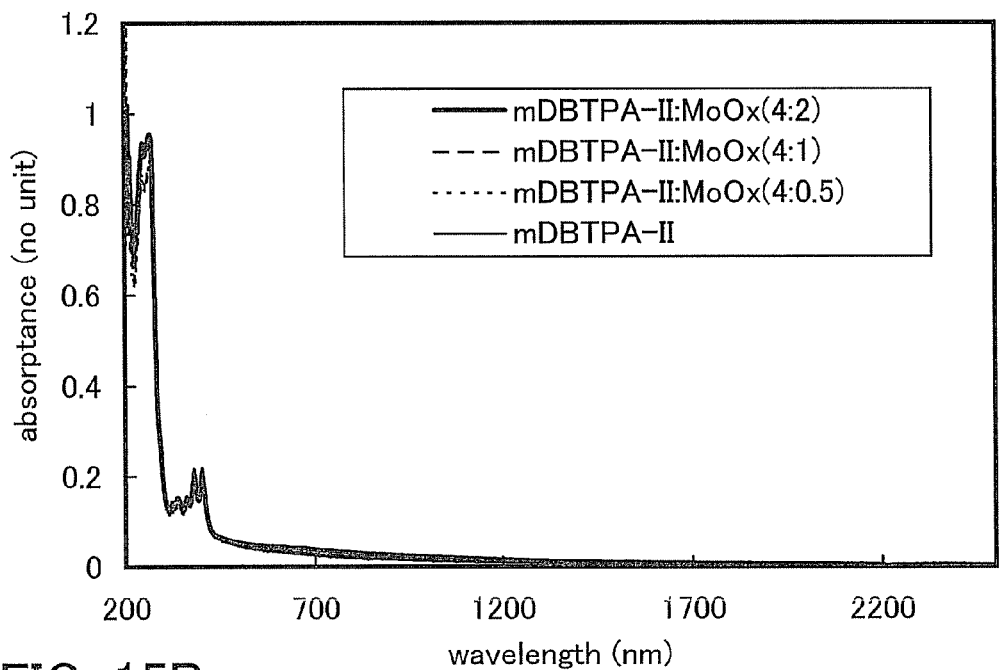
FIGS. 15A and 15B show absorptance of a composite material of one embodiment of the present invention.
Figure 15B:
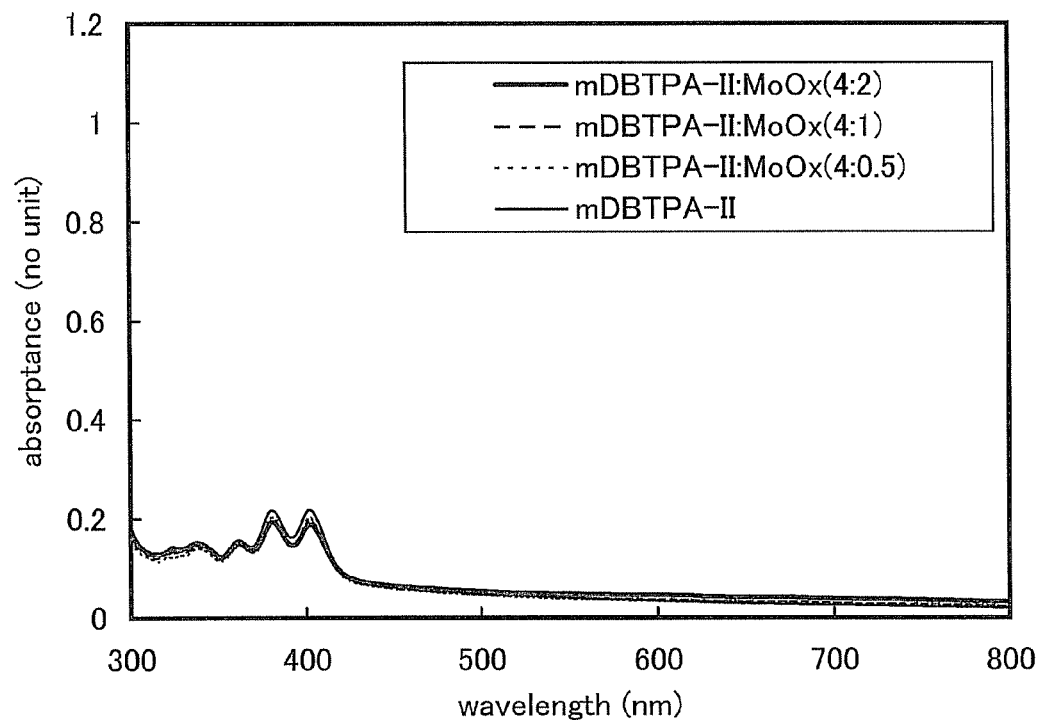

FIGS. 15A and 15B show results of measurement of absorption spectra of composite films of 4-[4-(9-phenylanthracen-10-yl)phenyl]dibenzothiophene (abbreviation: mDBTPA-II) and molybdenum oxide (Composition Example 9). Note that the thickness of each film was set to 50 nm.

In each of FIGS. 7A to 15B, the horizontal axis represents wavelength (nm) and the vertical axis represents absorptance (no unit).

FIGS. 7A to 15B show that the composite materials of one embodiment of the present invention given in Composition Examples 1 to 9 are materials that have almost no significant absorption peak in the visible light region and have a high light-transmitting property. Composition Examples 7 to 9 each have an anthracene skeleton. When the composite material of one embodiment of the present invention includes a heterocyclic compound having an anthracene skeleton, a tetracene skeleton, a perylene skeleton, or the like and the thickness thereof is large, a slight absorption peak originating from the skeleton is observed in the visible light region. On the other hand, it is found that Composition Examples 1 to 6 are materials that have no significant absorption peak in a region of wavelengths of 360 nm and more and have a particularly high light-transmitting property.

The composite materials of one embodiment of the present invention given in Composition Examples 1 to 9 have almost no significant absorption peak also in the infrared region (a region of wavelengths of 700 nm and more).

The absorption spectrum of the composite material of one embodiment of the present invention including the heterocyclic compound and molybdenum oxide has substantially the same shape as the absorption spectrum of the heterocyclic compound. A film having a high concentration of molybdenum oxide (specifically, the film of the heterocyclic compound and molybdenum oxide at a mass ratio of 4:2 of each composition example) also has almost no significant absorption peak in a range from the visible light region to the infrared region. This indicates that in the composite material of one embodiment of the present invention, light absorption due to charge transfer interaction is unlikely to occur.

Example 2

Figure 16A:
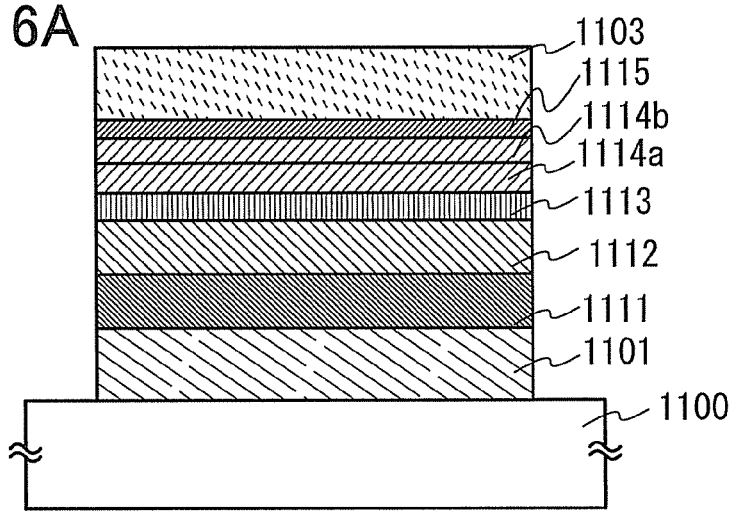
FIGS. 16A and 16B each illustrate a light-emitting element of an example.

In this example, a light-emitting element of one embodiment of the present invention will be described with reference to FIG. 16A. Structural formulae of materials used in this example are illustrated below.

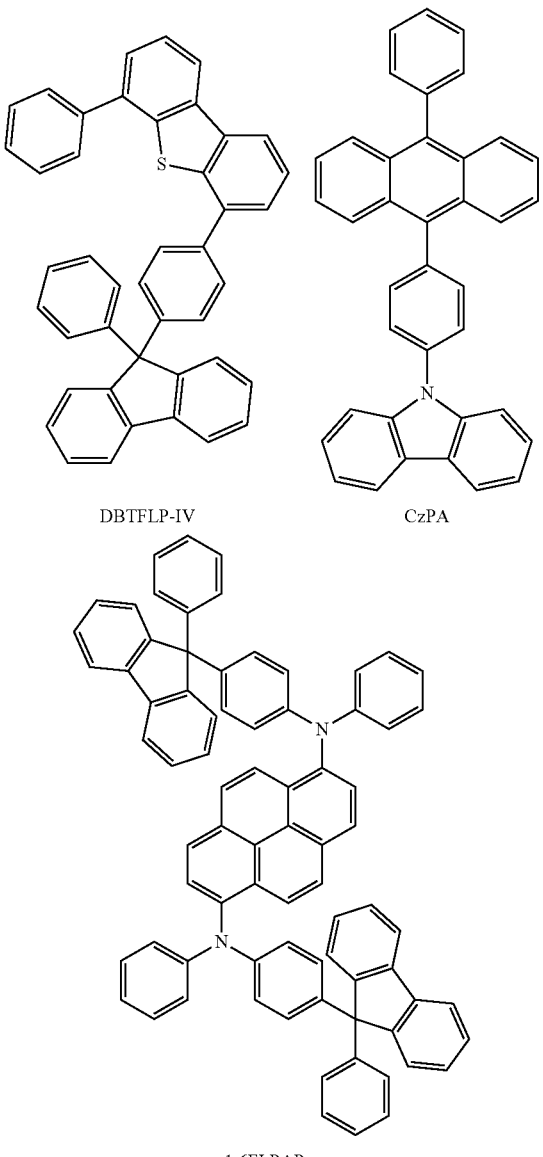

DBTFLP-IV          CzPA 1,6FLPAPrn

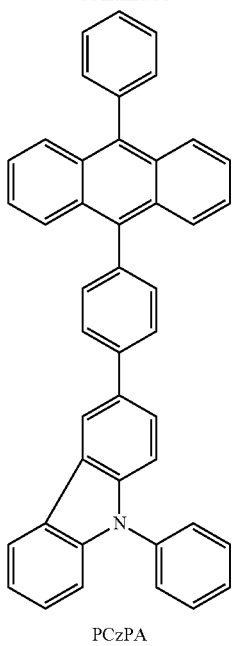

PCzPA

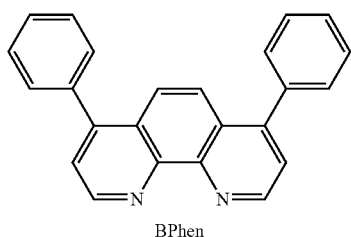

BPhen

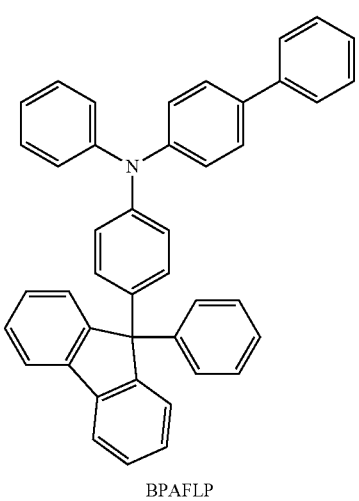

BPAFLP

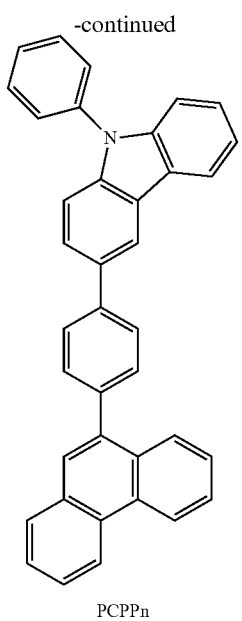

PCPPn

Methods for manufacturing Light-Emitting Element 1, Comparative Light-Emitting Element 2, and Comparative Light-Emitting Element 3 of this example will be described below.

(Light-Emitting Element 1)

First, a film of indium tin oxide containing silicon oxide (ITSO) was formed over a glass substrate 1100 by a sputtering method, so that a first electrode 1101 which functions as an anode was formed. Note that the thickness was set to 110 nm and the electrode area was set to 2 mm×2 mm.

Next, in pretreatment for forming the light-emitting element over the substrate 1100, UV ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate 1100 was cooled down for about 30 minutes.

Next, the substrate 1100 provided with the first electrode 1101 was fixed to a substrate holder in the vacuum evaporation apparatus so that a surface on which the first electrode 1101 was provided faced downward. The pressure in the vacuum evaporation apparatus was reduced to about $10^{-4}$ Pa. Then, 4-[4-(9-phenyl-9H-fluoren-9-yl)phenyl]-6-phenyldibenzothiophene (abbreviation: DBTFLP-IV) and molybdenum(VI) oxide were co-evaporated to form a hole-injection layer 1111 over the first electrode 1101. The thickness of the hole-injection layer 1111 was set to 50 nm, and the mass ratio of DBTFLP-IV to molybdenum(VI) oxide was adjusted to 4:2 (=DBTFLP-IV:molybdenum oxide). Note that the co-evaporation method refers to an evaporation method in which evaporation is carried out from a plurality of evaporation sources at the same time in one treatment chamber.

Next, over the hole-injection layer 1111, a film of 3-[4-(9-phenanthryl)-phenyl]-9-phenyl-9H-carbazole (abbreviation: PCPPn) was formed to a thickness of 10 nm to form a hole-transport layer 1112.

Furthermore, 9-[4-(N-carbazolyl)]phenyl-10-phenylanthracene (abbreviation: CzPA) and N,N'-bis[4-(9-phenyl- 9H-fluoren-9-yl)phenyl]-diphenylpyrene-1,6-diamine (abbreviation: 1,6FLPAPrn) were co-evaporated to form a light-emitting layer 1113 over the hole-transport layer 1112. Here, the mass ratio of CzPA to 1,6FLPAPrn was adjusted to 1:0.05 (=CzPA:1,6FLPAPrn). In addition, the thickness of the light-emitting layer 1113 was set to 30 nm.

Further, over the light-emitting layer 1113, a film of CzPA was formed to a thickness of 10 nm to form a first electron-transport layer 1114a.

Then, over the first electron-transport layer 1114a, a film of bathophenanthroline (abbreviation: BPhen) was formed to a thickness of 15 nm to form a second electron-transport layer 1114b.

Further, over the second electron-transport layer 1114b, a film of lithium fluoride (LiF) was formed by evaporation to a thickness of 1 nm to form an electron-injection layer 1115.

Lastly, an aluminum film was formed by evaporation to a thickness of 200 nm as a second electrode 1103 functioning as a cathode. Thus, Light-Emitting Element 1 of this example was fabricated.

Note that, in all the above evaporation steps, evaporation was performed by a resistance-heating method.

(Comparative Light-Emitting Element 2)

A hole-injection layer 1111 of Comparative Light-Emitting Element 2 was formed by co-evaporating 9-phenyl-3-[4-(10-phenyl-9-anthryl)phenyl]-9H-carbazole (abbreviation: PCzPA) and molybdenum(VI) oxide. The thickness of the hole-injection layer 1111 was set to 50 nm, and the mass ratio of PCzPA to molybdenum(VI) oxide was adjusted to 4:2 (=PCzPA:molybdenum oxide). Components other than the hole-injection layer 1111 were manufactured in a manner similar to that of Light-Emitting Element 1.

(Comparative Light-Emitting Element 3)

A hole-injection layer 1111 of Comparative Light-Emitting Element 3 was formed by co-evaporating 4-phenyl-4'-(9-phenylfluoren-9-yl)triphenylamine (abbreviation: BPAFLP) and molybdenum(VI) oxide. The thickness of the hole-injection layer 1111 was set to 50 nm, and the mass ratio of BPAFLP to molybdenum(VI) oxide was adjusted to 4:2 (=BPAFLP:molybdenum oxide). Components other than the hole-injection layer 1111 were manufactured in a manner similar to that of Light-Emitting Element 1.

Table 2 shows element structures of Light-Emitting Element 1, Comparative Light-Emitting Element 2, and Comparative Light-Emitting Element 3 obtained as described above.

TABLE 2

|  | first electrode | hole-injection layer | hole-transport layer | light-emitting layer |
|---|---|---|---|---|
| Light-Emitting Element 1 | ITSO 110 nm | DBTFLP-IV:MoOx (=4:2) 50 nm | PCPPn 10 nm | CzPA:1,6FLPAPrn (=1:0.05) 30 nm |
| Comparative Light-Emitting Element 2 | ITSO 110 nm | PCzPA:MoOx (=4:2) 50 nm | PCPPn 10 nm | CzPA:1,6FLPAPrn (=1:0.05) 30 nm |
| Comparative Light-Emitting Element 3 | ITSO 110 nm | BPAFLP:MoOx (=4:2) 50 nm | PCPPn 10 nm | CzPA:1,6FLPAPrn (=1:0.05) 30 nm |

|  | first electron-transport layer | second electron-transport layer | electron-injection layer | second electrode |
|---|---|---|---|---|
| Light-Emitting Element 1 | CzPA 10 nm | BPhen 15 nm | LiF 1 nm | Al 200 nm |
| Comparative Light-Emitting Element 2 | CzPA 10 nm | BPhen 15 nm | LiF 1 nm | Al 200 nm |
| Comparative Light-Emitting Element 3 | CzPA 10 nm | BPhen 15 nm | LiF 1 nm | Al 200 nm |

In a glove box containing a nitrogen atmosphere, these light-emitting elements were sealed so as not to be exposed to air. Then, operation characteristics of these light-emitting elements were measured. Note that the measurements were carried out at room temperature (in the atmosphere kept at 25° C.).

Note that the above-described three light-emitting elements were formed over the same substrate. In addition, the first electrodes and the hole-transport layers to the second electrodes of the above-described three light-emitting elements were formed at the same respective times, and sealing was performed at the same time.

Figure 17:
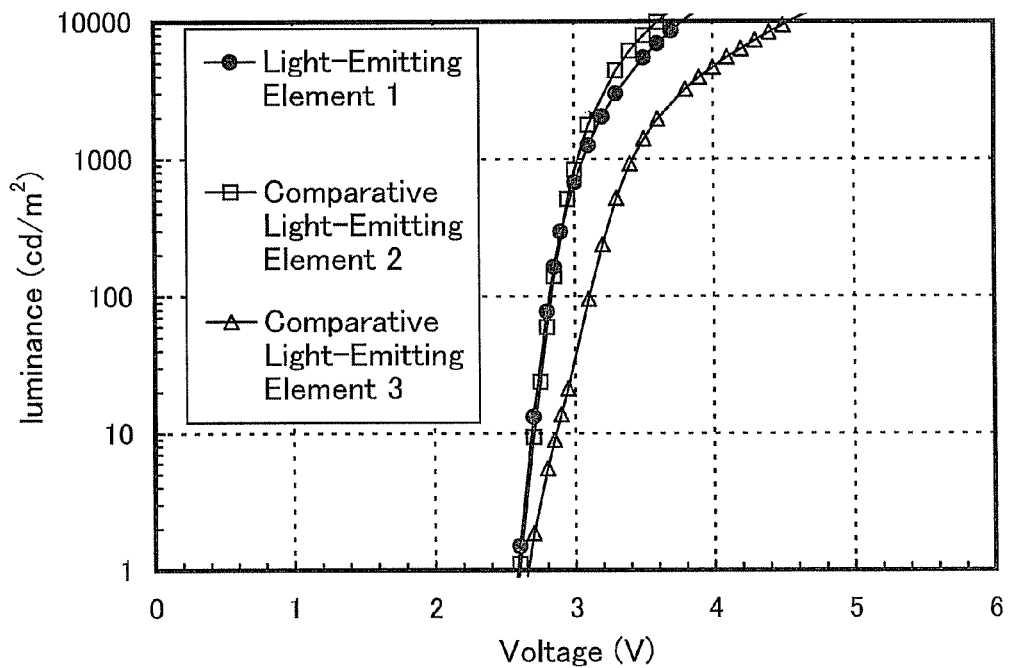
FIG. 17 shows voltage-luminance characteristics of a light-emitting element of Example 2.

FIG. 17 shows the voltage-luminance characteristics of Light-Emitting Element 1, Comparative Light-Emitting Element 2, and Comparative Light-Emitting Element 3.

Figure 18:
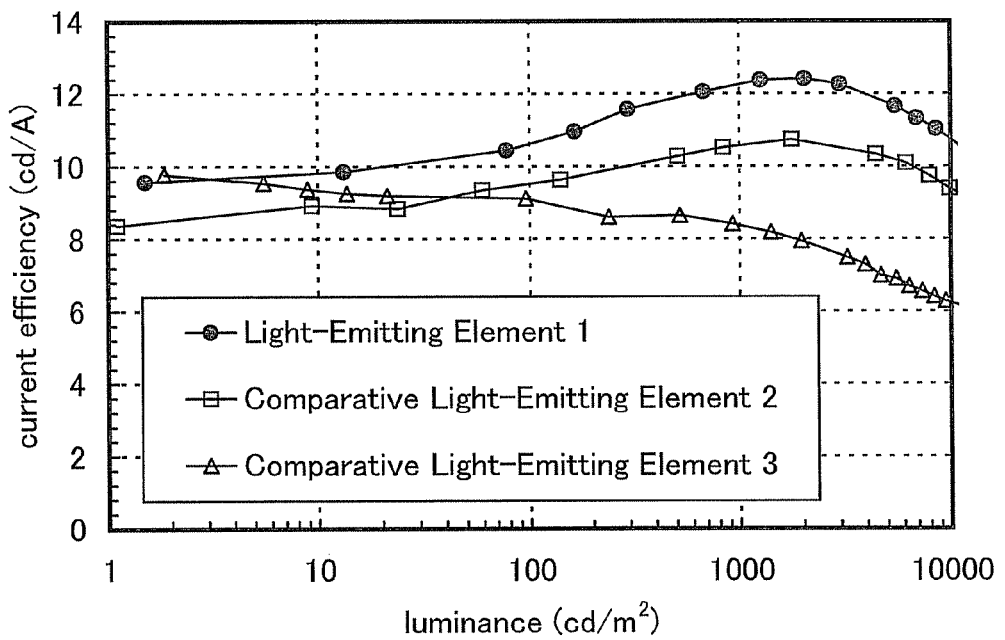
FIG. 18 shows luminance-current efficiency characteristics of a light-emitting element of Example 2.

In FIG. 17, the horizontal axis represents voltage (V) and the vertical axis represents luminance (cd/m$^2$). FIG. 18 shows the luminance-current efficiency characteristics. In FIG. 18, the horizontal axis represents luminance (cd/m$^2$) and the vertical axis represents current efficiency (cd/A). Further, Table 3 shows the voltage (V), CIE chromaticity coordinates (x, y), current efficiency (cd/A), and external quantum efficiency (%) of each light-emitting element at a luminance of 1000 cd/m$^2$.

TABLE 3

|  | voltage (V) | CIE chromaticity coordinates (x, y) | current efficiency (cd/A) | external quantum efficiency (%) |
|---|---|---|---|---|
| Light-Emitting Element 1 | 3.1 | (0.15, 0.23) | 12 | 7.9 |
| Comparative Light-Emitting Element 2 | 3.0 | (0.15, 0.22) | 11 | 7.1 |
| Comparative Light-Emitting Element 3 | 3.4 | (0.15, 0.22) | 8.4 | 5.7 |

As shown in Table 3, the CIE chromaticity coordinates of Light-Emitting Element 1 were (x, y)=(0.15, 0.23), the CIE chromaticity coordinates of Comparative Light-Emitting Element 2 were (x, y)=(0.15, 0.22), and the CIE chromaticity coordinates of Comparative Light-Emitting Element 3 were (x, y)=(0.15, 0.22), each at a luminance of around 1000 cd/m². These results show that blue light emission originating from 1,6FLPAPrn was obtained from Light-Emitting Element 1, Comparative Light-Emitting Element 2, and Comparative Light-Emitting Element 3.

As can be seen from FIG. 17, at the same voltage, Light-Emitting Element 1 has a luminance higher than that of Comparative Light-Emitting Element 3 and comparable to that of Comparative Light-Emitting Element 2. In addition, as can be seen from FIG. 18 and Table 3, Light-Emitting Element 1 has a current efficiency and external quantum efficiency higher than those of Comparative Light-Emitting Element 2 and Comparative Light-Emitting Element 3.

Figure 19:
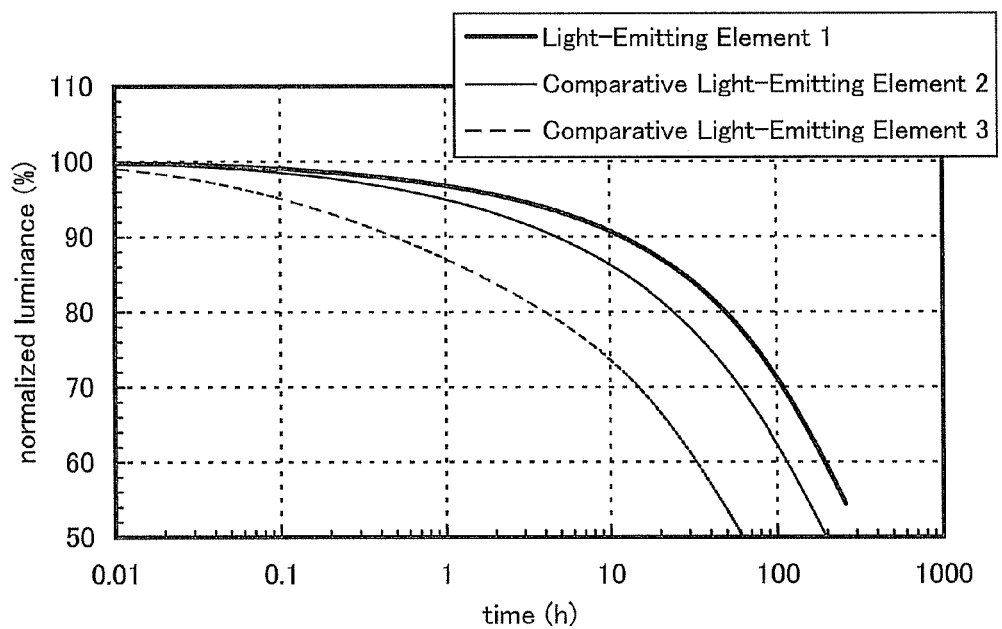
FIG. 19 shows results of reliability tests of a light-emitting element of Example 2.

Next, Light-Emitting Element 1, Comparative Light-Emitting Element 2, and Comparative Light-Emitting Element 3 were subjected to reliability tests. Results of the reliability tests are shown in FIG. 19. In FIG. 19, the vertical axis represents normalized luminance (%) with an initial luminance of 100%, and the horizontal axis represents driving time (h) of the element.

In the reliability tests, the light-emitting elements of this example were driven under the conditions where the initial luminance was set to 5000 cd/m² and the current density was constant.

FIG. 19 shows that Light-Emitting Element 1 kept 54% of the initial luminance after 260 hours elapsed. On the other hand, the luminance of Comparative Light-Emitting Element 2 after 200 hours was 50% or less of the initial luminance. In addition, the luminance of Comparative Light-Emitting Element 3 after 62 hours was 50% or less of the initial luminance.

It is found that Light-Emitting Element 1 according to one embodiment of the present invention has a longer lifetime than Comparative Light-Emitting Element 2 and Comparative Light-Emitting Element 3.

The above results suggest that an element having high emission efficiency can be realized by use of the composite material of one embodiment of the present invention for a hole-injection layer of the light-emitting element. The results also suggest that a light-emitting element having a low drive voltage can be provided by use of the composite material of one embodiment of the present invention for a hole-injection layer of the light-emitting element. The results also suggest that a light-emitting element having a long lifetime can be manufactured by use of the composite material of one embodiment of the present invention for a hole-injection layer.

Example 3

In this example, a light-emitting element of one embodiment of the present invention will be described with reference to FIG. 16A. A structural formula of a material used in this example is illustrated below. Note that the structural formulae of materials which are already illustrated will be omitted.

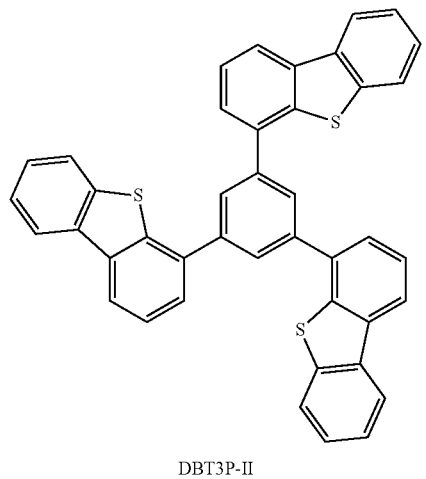 [SMILES: c1ccc2c(c1)sc1c(-c3cc(-c4cccc5c4sc4ccccc45)cc(-c4cccc5c4sc4ccccc45)c3)cccc12 ; "DBT3P-II"]

DBT3P-II

A method for manufacturing Light-Emitting Element 4 of this example will be described below.

(Light-Emitting Element 4)

A hole-injection layer 1111 of Light-Emitting Element 4 was formed by co-evaporating 1,3,5-tri(dibenzothiophen-4-yl)-benzene (abbreviation: DBT3P-II) and molybdenum(VI) oxide. The thickness of the hole-injection layer 1111 was set to 50 nm, and the mass ratio of DBT3P-II to molybdenum (VI) oxide was adjusted to 4:2 (=DBT3P-II:molybdenum oxide). Components other than the hole-injection layer 1111 were manufactured in a manner similar to that of Light-Emitting Element 1 described in Example 2.

Table 4 shows an element structure of Light-Emitting Element 4 obtained as described above.

TABLE 4

| | first electrode | hole-injection layer | hole-transport layer | light-emitting layer |
|---|---|---|---|---|
| Light-Emitting Element 4 | ITSO 110 nm | DBT3P-II:MoOx (=4:2) 50 nm | PCPPn 10 nm | CzPA:1,6FLPAPrn (=1:0.05) 30 nm |

| | first electron-transport layer | second electron-transport layer | electron-injection layer | second electrode |
|---|---|---|---|---|
| Light-Emitting Element 4 | CzPA 10 nm | BPhen 15 nm | LiF 1 nm | Al 200 nm |

In a glove box containing a nitrogen atmosphere, Light-Emitting Element 4 was sealed so as not to be exposed to air. Then, operation characteristics of Light-Emitting Element 4 were measured. Note that the measurements were carried out at room temperature (in the atmosphere kept at 25° C.).

Figure 20:
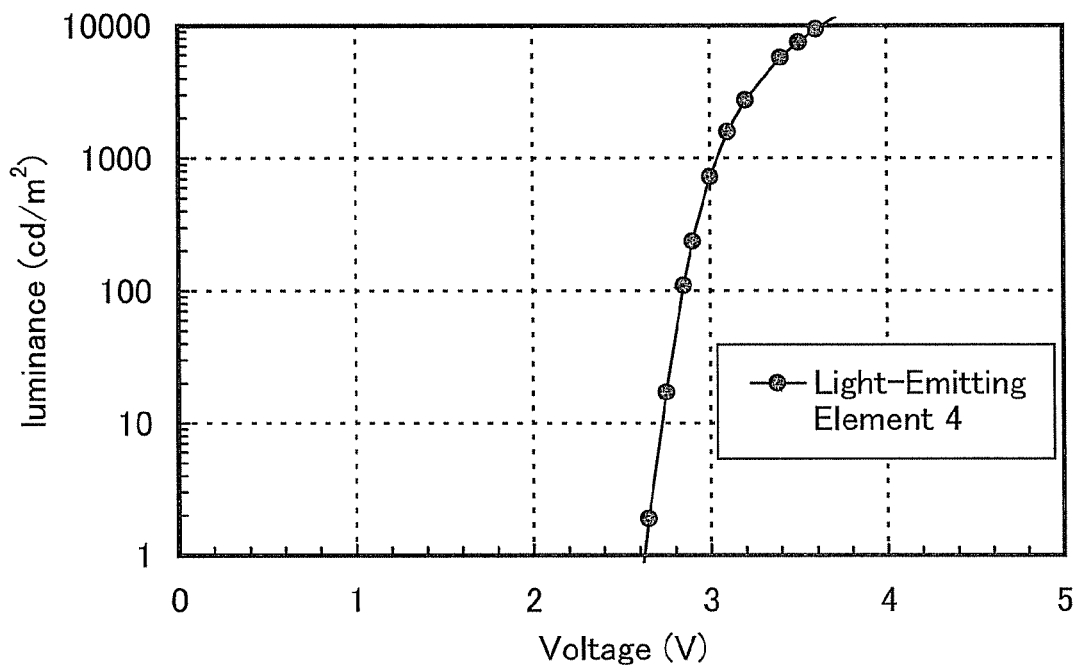
FIG. 20 shows voltage-luminance characteristics of a light-emitting element of Example 3.
Figure 21:
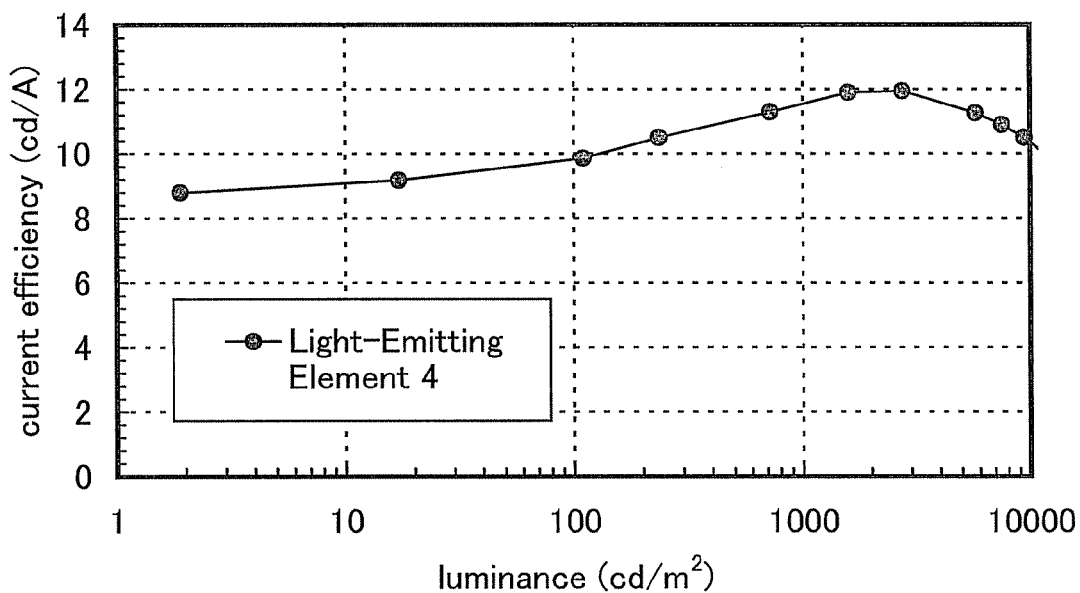
FIG. 21 shows luminance-current efficiency characteristics of a light-emitting element of Example 3.

FIG. 20 shows the voltage-luminance characteristics of Light-Emitting Element 4. In FIG. 20, the horizontal axis represents voltage (V) and the vertical axis represents luminance (cd/m$^2$). FIG. 21 shows the luminance-current efficiency characteristics. In FIG. 21, the horizontal axis represents luminance (cd/m$^2$) and the vertical axis represents current efficiency (cd/A). Further, Table 5 shows the voltage (V), CIE chromaticity coordinates (x, y), current efficiency (cd/A), and external quantum efficiency (%) of Light-Emitting Element 4 at a luminance of 1000 cd/m$^2$.

TABLE 5

|  | voltage (V) | CIE chromaticity coordinates (x, y) | current efficiency (cd/A) | external quantum efficiency (%) |
| --- | --- | --- | --- | --- |
| Light-Emitting Element 4 | 3.0 | (0.15, 0.22) | 11 | 7.4 |

As shown in Table 5, the CIE chromaticity coordinates of Light-Emitting Element 4 were (x, y)=(0.15, 0.22) at a luminance of 1000 cd/m$^2$. These results show that blue light emission originating from 1,6FLPAPrn was obtained from Light-Emitting Element 4.

As can be seen from FIG. 20, FIG. 21, and Table 5, Light-Emitting Element 4 exhibits high emission efficiency. It can also be seen that Light-Emitting Element 4 is a light-emitting element having a low drive voltage.

Figure 22:
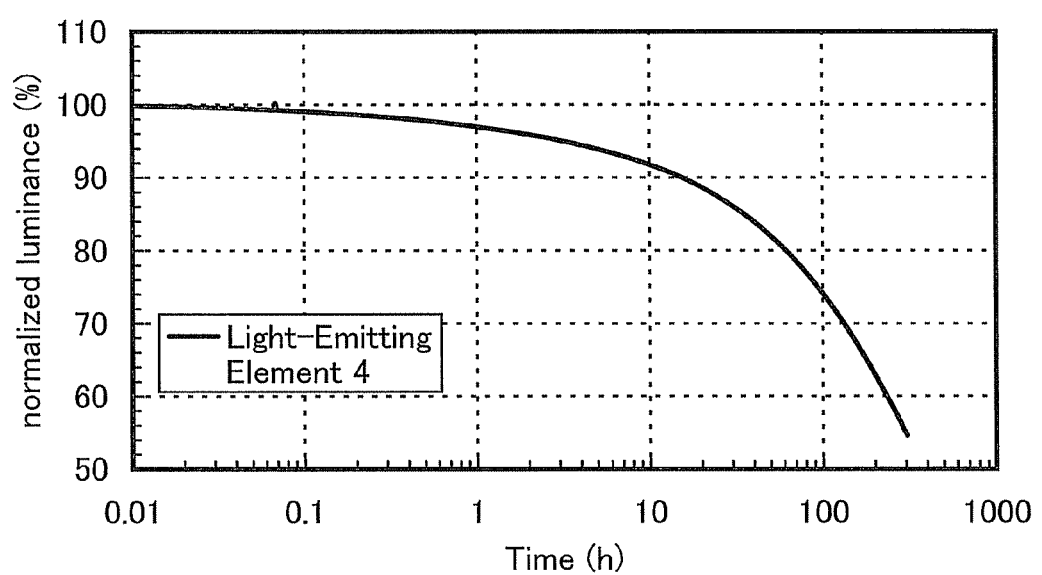
FIG. 22 shows results of reliability tests of a light-emitting element of Example 3.

Next, Light-Emitting Element 4 was subjected to a reliability test. Results of the reliability test are shown in FIG. 22. In FIG. 22, the vertical axis represents normalized luminance (%) with an initial luminance of 100%, and the horizontal axis represents driving time (h) of the element.

In the reliability test, the light-emitting element of this example was driven under the conditions where the initial luminance was set to 5000 cd/m$^2$ and the current density was constant.

FIG. 22 shows that Light-Emitting Element 4 kept 55% of the initial luminance after 310 hours elapsed.

The above results suggest that a light-emitting element having high emission efficiency can be realized by use of the composite material of one embodiment of the present invention. The results also suggest that a light-emitting element having a low drive voltage can be manufactured by use of the composite material of one embodiment of the present invention. The results also suggest that a light-emitting element having a long lifetime can be provided by use of the composite material of one embodiment of the present invention.

Example 4

In this example, a light-emitting element of one embodiment of the present invention will be described with reference to FIG. 16A. A structural formula of a material used in this example is illustrated below. Note that the structural formulae of materials which are already illustrated will be omitted.

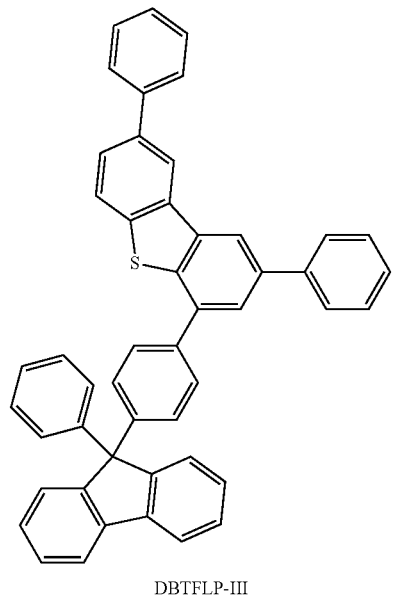 [SMILES: c1ccc(-c2ccc3sc4c(-c5ccc(C6(c7ccccc7)c7ccccc7-c7ccccc76)cc5)cc(-c5ccccc5)cc4c3c2)cc1]

DBTFLP-III

A method for manufacturing Light-Emitting Element 5 of this example will be described below.

(Light-Emitting Element 5)

A hole-injection layer 1111 of Light-Emitting Element 5 was flamed by co-evaporating 2,8-diphenyl-4-[4-(9-phenyl-9H-fluoren-9-yl)phenyl]dibenzothiophene (abbreviation: DBTFLP-III) and molybdenum(VI) oxide. The thickness of the hole-injection layer 1111 was set to 50 nm, and the mass ratio of DBTFLP-III to molybdenum(VI) oxide was adjusted to 4:2 (=DBTFLP-III:molybdenum oxide). Components other than the hole-injection layer 1111 were manufactured in a manner similar to that of Light-Emitting Element 1 described in Example 2.

Table 6 shows an element structure of Light-Emitting Element 5 obtained as described above.

TABLE 6

|  | first electrode | hole-injection layer | hole-transport layer | light-emitting layer |
| --- | --- | --- | --- | --- |
| Light-Emitting Element 5 | ITSO 110 nm | DBTFLP-III:MoOx (=4:2) 50 nm | PCPPn 10 nm | CzPA:1,6FLPAPrn (=1:0.05) 30 nm |

|  | first electron-transport layer | second electron-transport layer | electron-injection layer | second electrode |
| --- | --- | --- | --- | --- |
| Light-Emitting Element 5 | CzPA 10 nm | BPhen 15 nm | LiF 1 nm | Al 200 nm |

In a glove box containing a nitrogen atmosphere, Light-Emitting Element 5 was sealed so as not to be exposed to air. Then, operation characteristics of Light-Emitting Element 5 were measured. Note that the measurements were carried out at room temperature (in the atmosphere kept at 25° C.).

Figure 23:
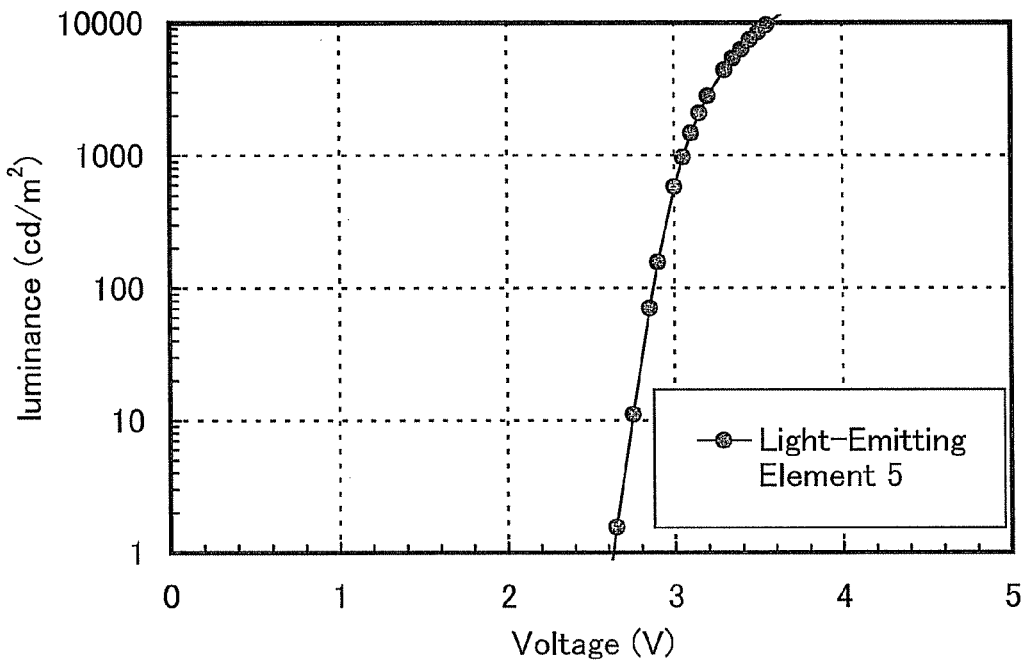
FIG. 23 shows voltage-luminance characteristics of a light-emitting element of Example 4.
Figure 24:
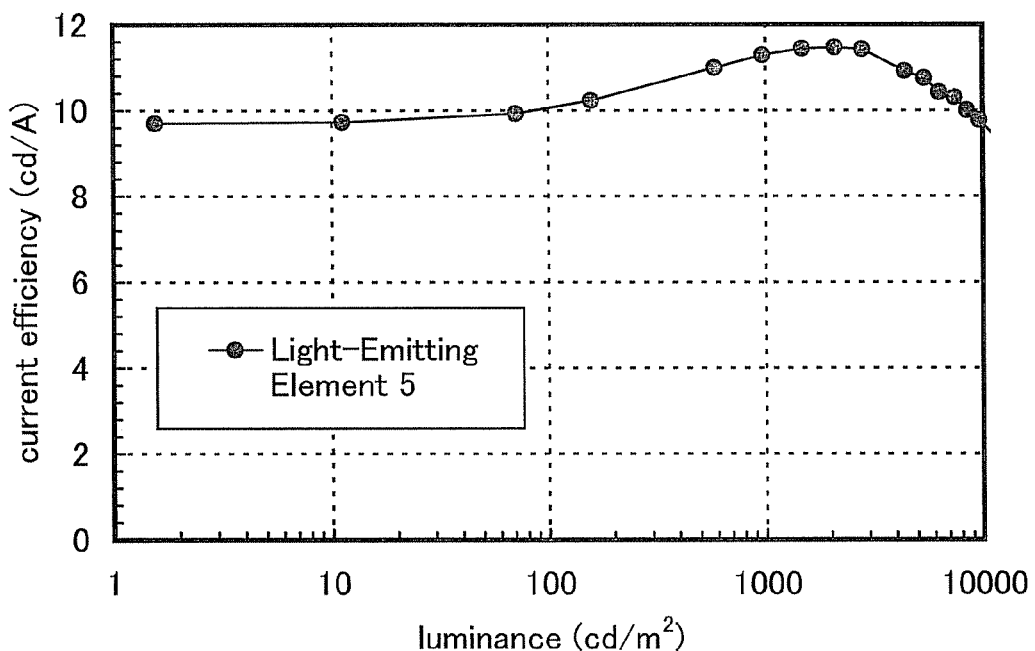
FIG. 24 shows luminance-current efficiency characteristics of a light-emitting element of Example 4.

FIG. 23 shows the voltage-luminance characteristics of Light-Emitting Element 5. In FIG. 23, the horizontal axis represents voltage (V) and the vertical axis represents luminance (cd/m$^2$). FIG. 24 shows the luminance-current efficiency characteristics. In FIG. 24, the horizontal axis represents luminance (cd/m$^2$) and the vertical axis represents current efficiency (cd/A). Further, Table 7 shows the voltage (V), CIE chromaticity coordinates (x, y), current efficiency (cd/A), and external quantum efficiency (%) of Light-Emitting Element 5 at a luminance of 1000 cd/m$^2$.

TABLE 7

| | voltage (V) | CIE chromaticity coordinates (x, y) | current efficiency (cd/A) | external quantum efficiency (%) |
|---|---|---|---|---|
| Light-Emitting Element 5 | 3.0 | (0.15, 0.23) | 11 | 7.5 |

As shown in Table 7, the CIE chromaticity coordinates of Light-Emitting Element 5 were (x, y)=(0.15, 0.23) at a luminance of 1000 cd/m$^2$. These results show that blue light emission originating from 1,6FLPAPrn was obtained from Light-Emitting Element 5.

As can be seen from FIG. 23, FIG. 24, and Table 7, Light-Emitting Element 5 exhibits high emission efficiency. It can also be seen that Light-Emitting Element 5 is a light-emitting element having a low drive voltage.

The above results suggest that a light-emitting element having high emission efficiency can be realized by use of the composite material of one embodiment of the present invention. The results also suggest that a light-emitting element having a low drive voltage can be manufactured by use of the composite material of one embodiment of the present invention.

Example 5

In this example, specific examples of the composite material of one embodiment of the present invention will be described. The composite material of one embodiment of the present invention includes a heterocyclic compound having a dibenzothiophene skeleton or a dibenzofuran skeleton and an inorganic compound exhibiting an electron-accepting property with respect to the heterocyclic compound. Table 8 shows heterocyclic compounds used in Composition Examples 10 to 14 of this example and the HOMO levels of the heterocyclic compounds used in Composition Examples 10 to 13 (measured by photoelectron spectrometry). In addition, structural formulae of the heterocyclic compounds used in this example are illustrated below.

TABLE 8

| | heterocyclic compound | HOMO level |
|---|---|---|
| Composition Example 10 | DBTPPC-II | −5.7 |
| Composition Example 11 | mDBTPPC-II | −5.6 |
| Composition Example 12 | DBTPPN-II | −5.9 |
| Composition Example 13 | mmDBFFLBi-II | −5.9 |
| Composition Example 14 | mZ-DBT2-II | |

TABLE 8-continued

| | heterocyclic compound | HOMO level |
|---|---|---|

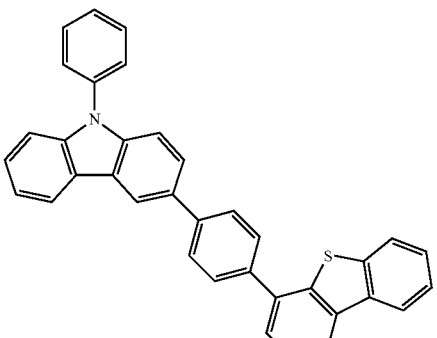

DBTPPC-II

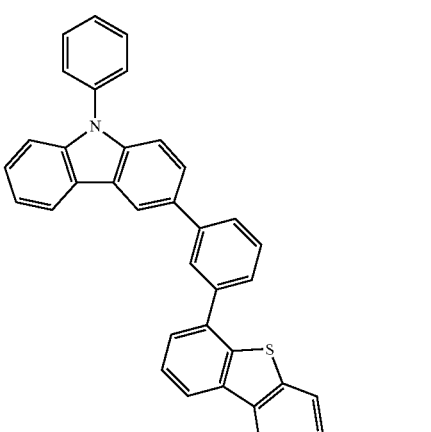

mDBTPPC-II

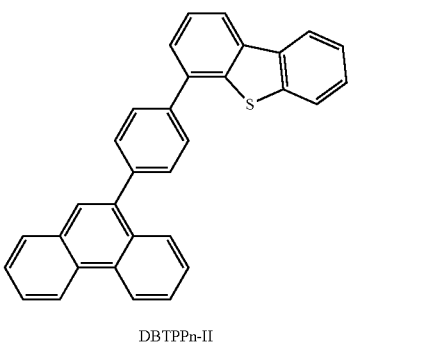 [SMILES: c1ccc2c(c1)cc(-c1ccc(-c3cccc4c3sc3ccccc34)cc1)c1ccccc12]

DBTPPn-II

TABLE 8-continued

| heterocyclic compound | HOMO level |
|---|---|
| mZ-DBT2-II | |
| mmDBFFLBi-II | |

In each of Composition Examples 10 to 14, molybdenum oxide was used as the inorganic compound.

A method for preparing the composite material of one embodiment of the present invention will be described using Composition Example 10 as an example. Composition Examples 11 to 14 were prepared in a manner similar to that of Composition Example 10; thus, the description thereof is omitted.

Composition Example 10

First, a glass substrate was fixed to a substrate holder inside a vacuum evaporation apparatus. Then, 3-[4-(dibenzothiophen-4-yl)-phenyl]-9-phenyl-9H-carbazole (abbreviation: DBTPPC-II) and molybdenum(VI) oxide were separately put in respective resistance-heating evaporation sources, and in a vacuum state, films containing DBTPPC-II and molybdenum oxide were formed by a co-evaporation method. At this time, DBTPPC-II and molybdenum(VI) oxide were co-evaporated such that the mass ratios of DBTPPC-II to molybdenum(VI) oxide were 4:2, 4:1, and 4:0.5 (=DBTPPC-II:molybdenum oxide). Further, the thickness of each film was set to 50 nm.

Figure 25A:
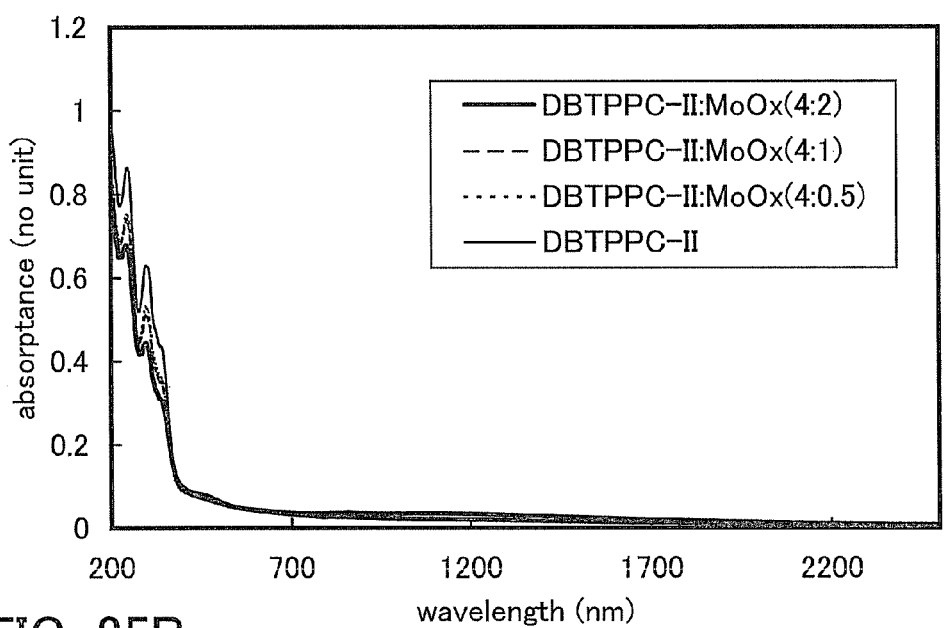
FIGS. 25A and 25B show absorptance of a composite material of one embodiment of the present invention.
Figure 25B:
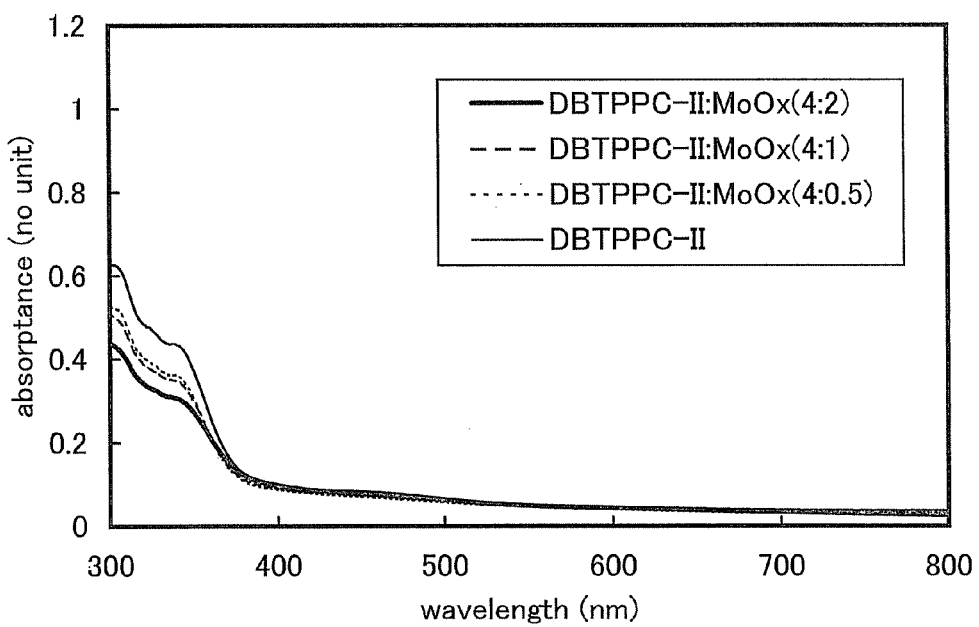

FIGS. 25A and 25B show results of measurement of absorption spectra of the thus formed composite films of DBTPPC-II and molybdenum oxide (Composition Example 10). In addition, for comparison, an absorption spectrum of a film of only DBTPPC-II (50 nm thick) is also shown. Note that as for Composition Examples 11, 12, and 14, an absorption spectrum of a film of only the heterocyclic compound used in each composition example is also shown for comparison.

Figure 26A:
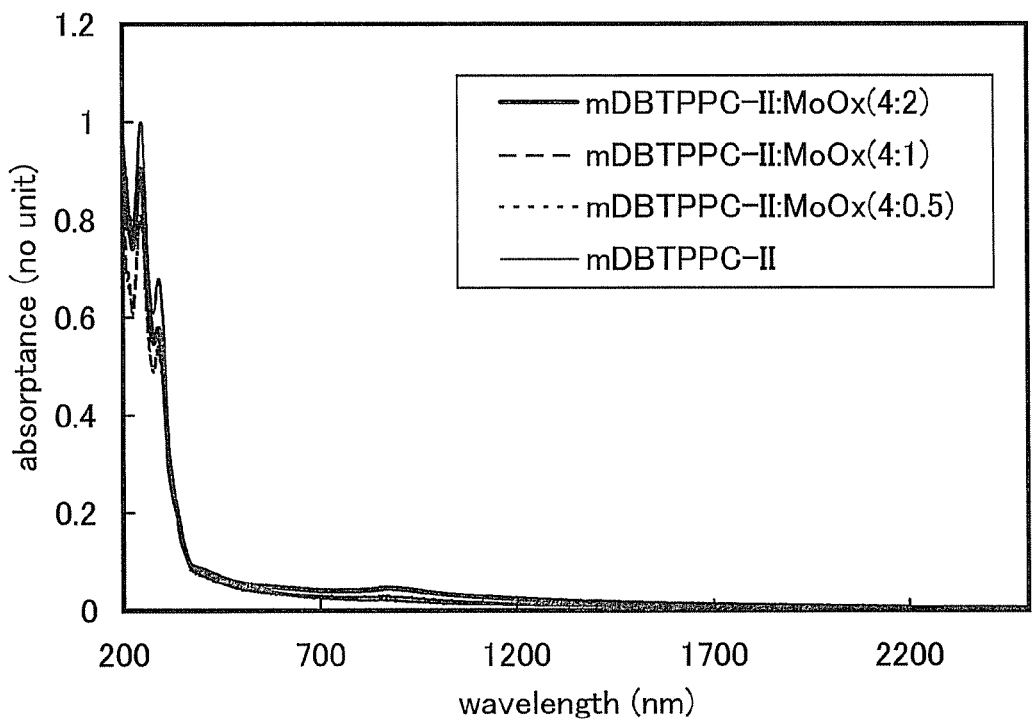
FIGS. 26A and 26B show absorptance of a composite material of one embodiment of the present invention.
Figure 26B:
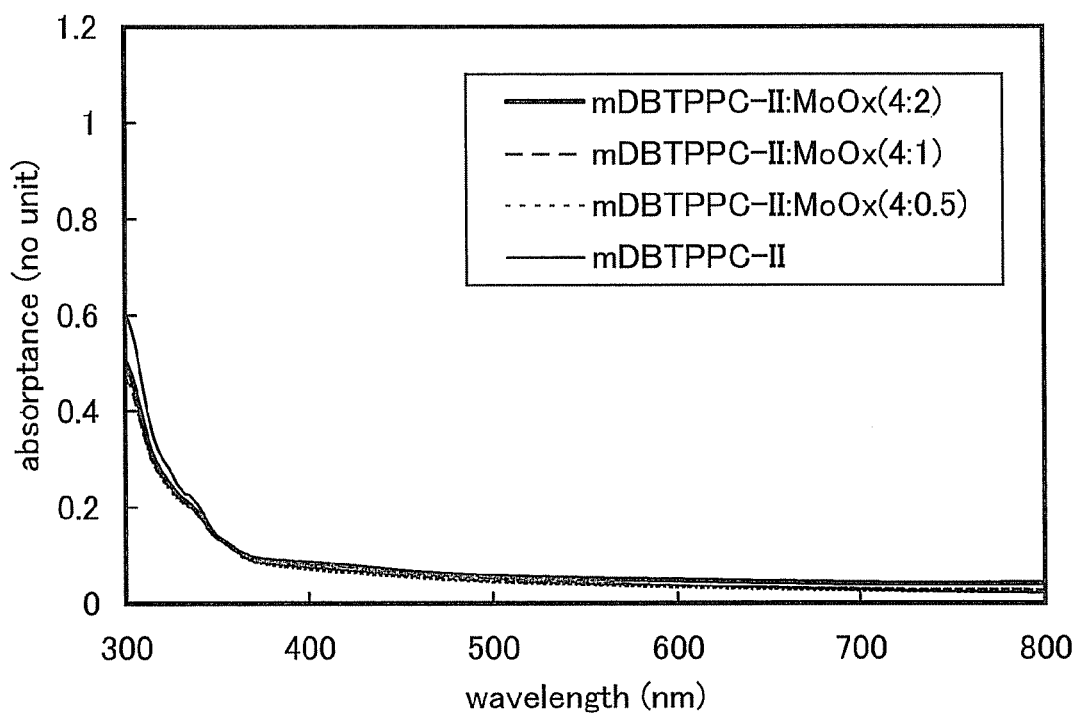

Similarly, FIGS. 26A and 26B show results of measurement of absorption spectra of composite films of 3-[3-(dibenzothiophen-4-yl)-phenyl]-9-phenyl-9H-carbazole (abbreviation: mDBTPPC-II) and molybdenum oxide (Composition Example 11). Note that the thickness of each film was set to 50 nm.

Figure 27A:
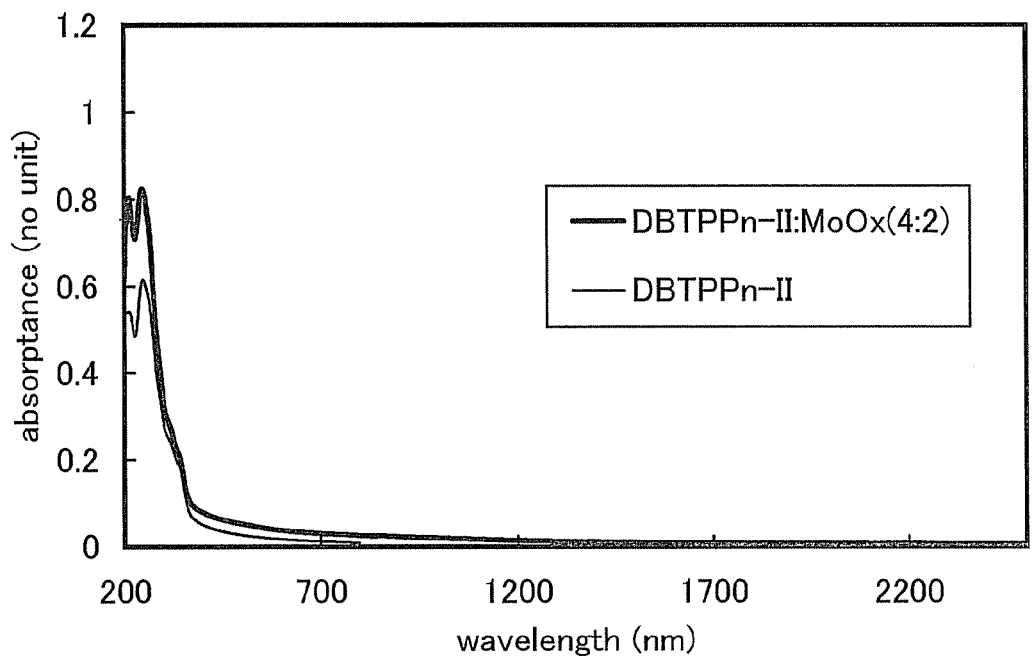
FIGS. 27A and 27B show absorptance of a composite material of one embodiment of the present invention.
Figure 27B:
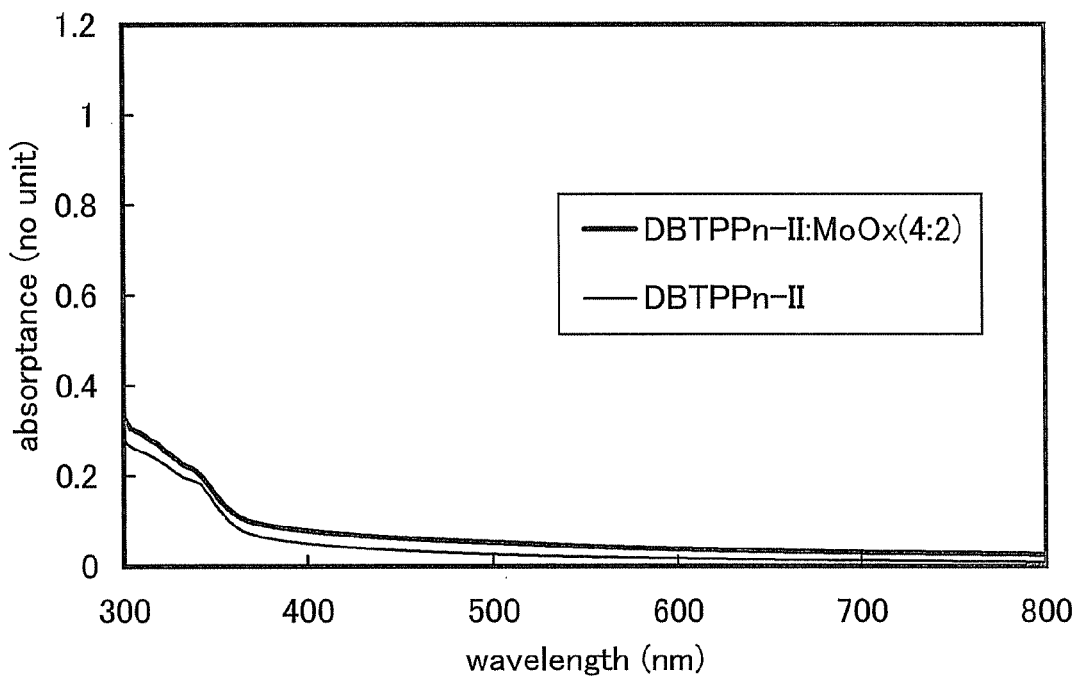

FIGS. 27A and 27B show results of measurement of an absorption spectrum of a composite film of 4-[4-(9-phenanthryl)phenyl]dibenzothiophene (abbreviation: DBTPPn-II) and molybdenum oxide (Composition Example 12). Note that the composite film given in Composition Example 12 is only a film of DBTPPn-II and molybdenum(VI) oxide at a mass ratio of 4:2 (=DBTPPn-II:molybdenum oxide). The thickness of each of the composite film and the film of only DBTPPn-II was set to 50 nm.

Figure 28A:
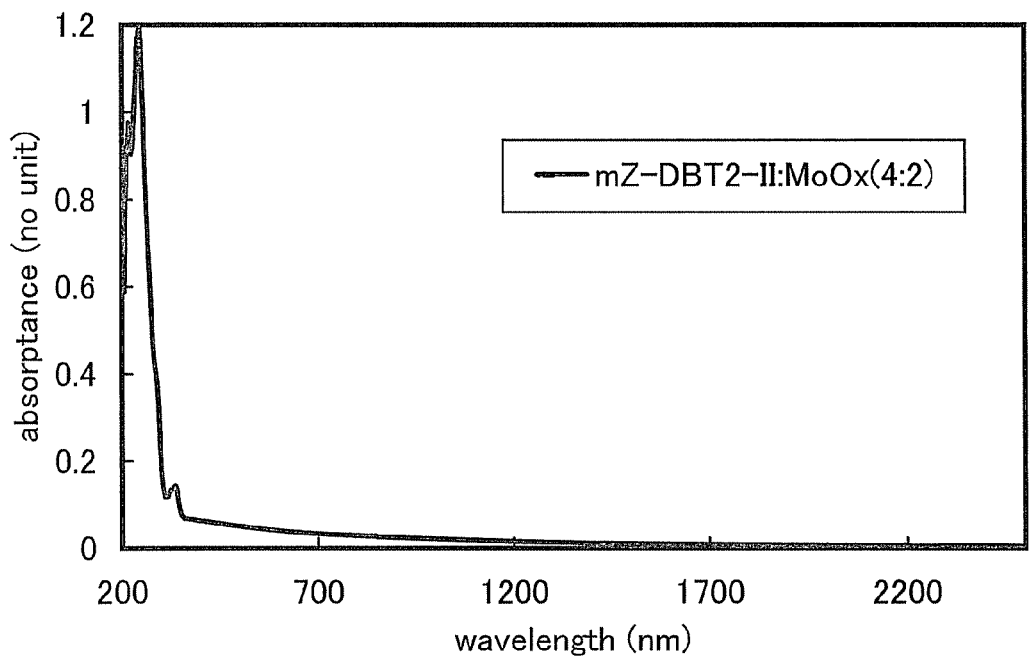
FIGS. 28A and 28B show absorptance of a composite material of one embodiment of the present invention.
Figure 28B:
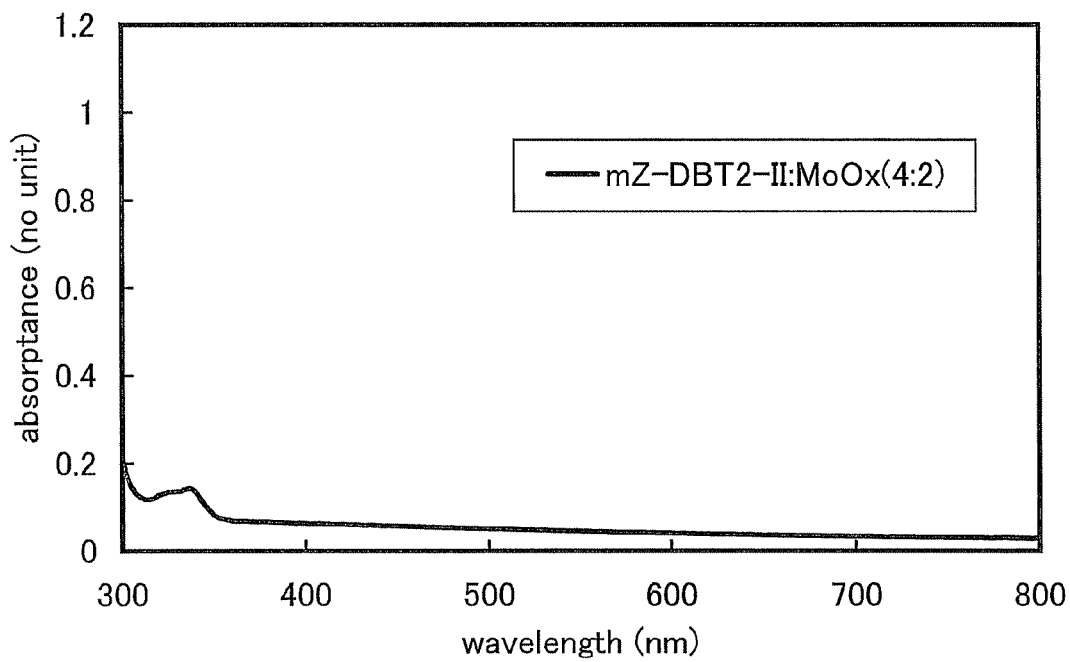

FIGS. 28A and 28B show results of measurement of an absorption spectrum of a composite film of 4,4'-{(1,1':2',1'':2'',1''')-quaterphenyl-3,3''-yl}bisdibenzothiophene (abbreviation: mZ-DBT2-II) and molybdenum oxide (Composition Example 13). Note that only a film of mZ-DBT2-II and molybdenum oxide at a mass ratio of 4:2 (=mZ-DBT2-II:molybdenum oxide) is shown for Composition Example 13 (the thickness: 50 nm).

Figure 29A:
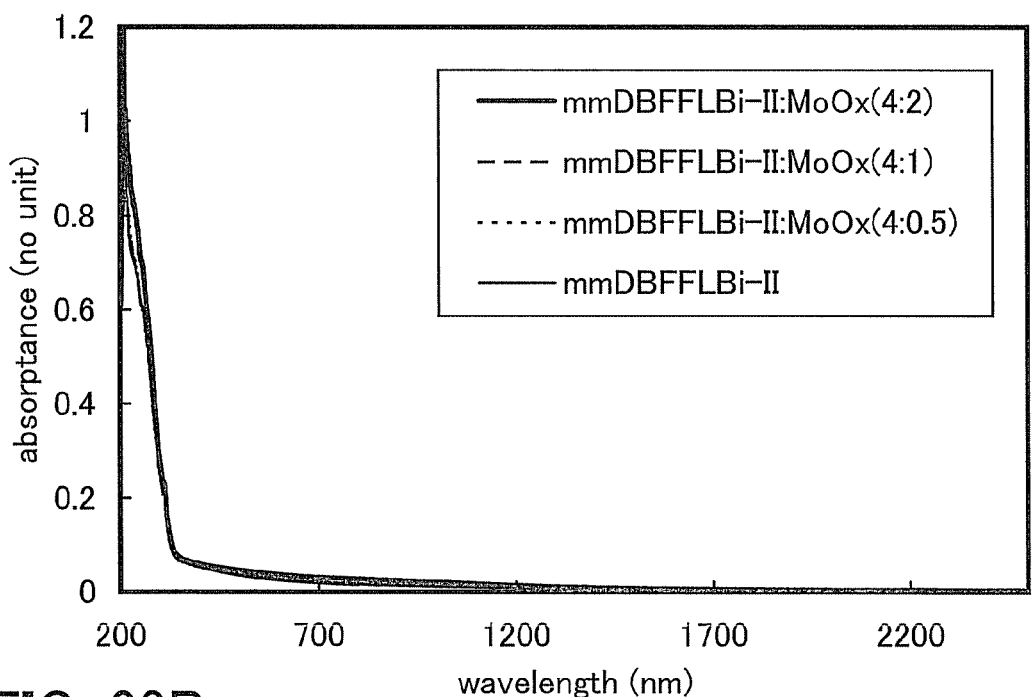
FIGS. 29A and 29B show absorptance of a composite material of one embodiment of the present invention.
Figure 29B:
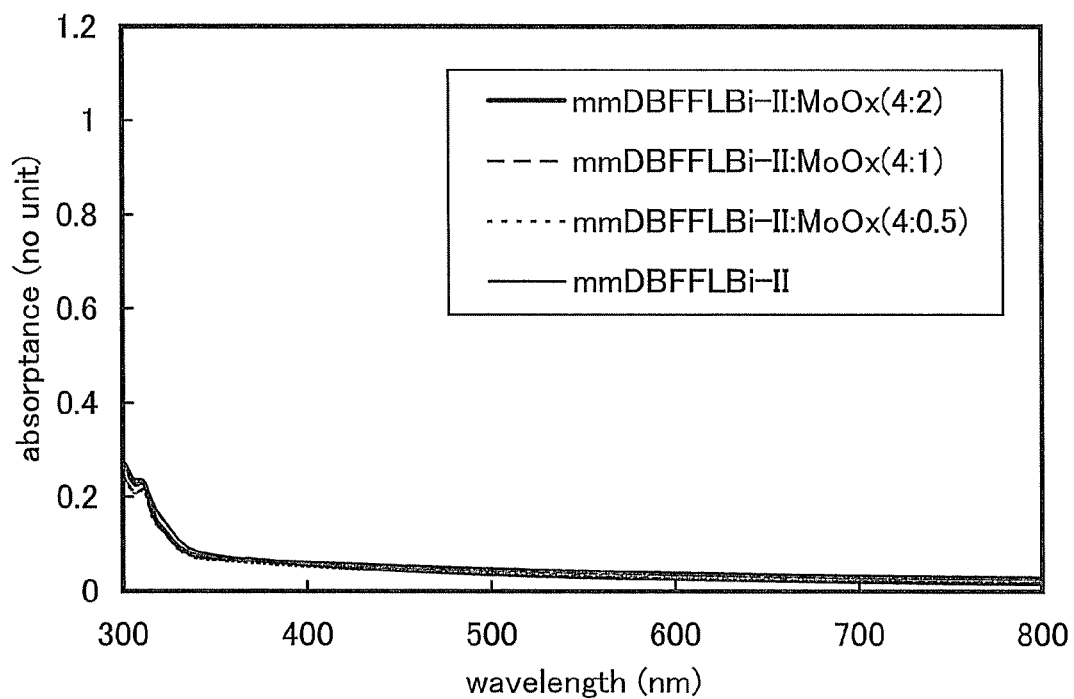

FIGS. 29A and 29B show results of measurement of absorption spectra of composite films of 4-{3-[3-(9-phenyl-9H-fluoren-9-yl)phenyl]phenyl}dibenzofuran (abbreviation: mmDBFFLBi-II) and molybdenum oxide (Composition Example 14). Note that the thickness of each film was set to 50 nm.

In each of FIGS. 25A to 29B, the horizontal axis represents wavelength (nm) and the vertical axis represents absorptance (no unit).

FIGS. 25A to 29B show that the composite materials of one embodiment of the present invention given in Composition Examples 10 to 14 are materials that have almost no significant absorption peak in the visible light region and have a high light-transmitting property. The composite materials of one embodiment of the present invention given in Composition Examples 10 to 14 have almost no significant absorption peak also in the infrared region (a region of wavelengths of 700 nm and more).

The absorption spectrum of the composite material of one embodiment of the present invention including the heterocyclic compound and molybdenum oxide has substantially the same shape as the absorption spectrum of the heterocyclic compound. A film having a high concentration of molybdenum oxide (specifically, the film of the heterocyclic compound and molybdenum oxide at a mass ratio of 4:2 of each composition example) also has almost no significant peak in a range from the visible light region to the infrared region. This indicates that in the composite material of one embodiment of the present invention, light absorption due to charge transfer interaction is unlikely to occur.

Example 6

In this example, a light-emitting element of one embodiment of the present invention will be described with reference to FIG. 16A. Structural formulae of materials used in this example are illustrated below. Note that the structural formulae of materials which are already illustrated will be omitted.

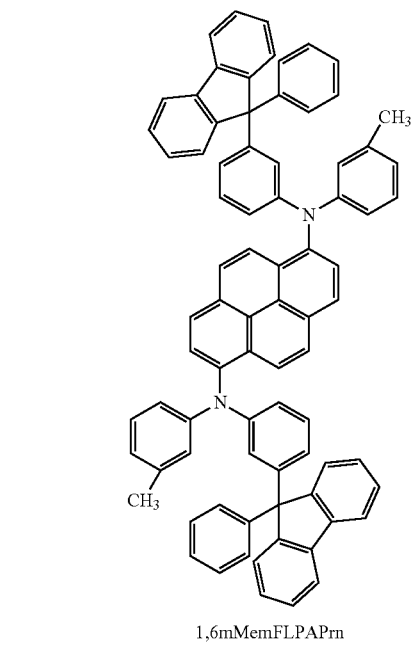

1,6mMemFLPAPrn

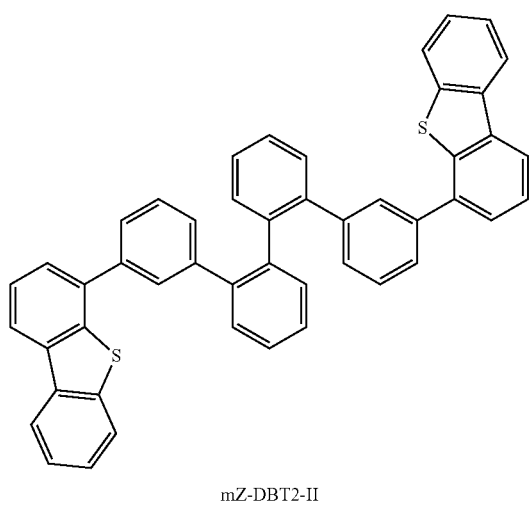

mZ-DBT2-II

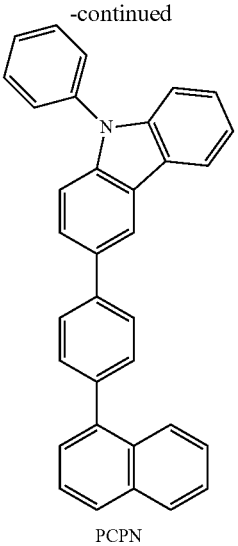

PCPN

A method for manufacturing Light-Emitting Element 6 of this example will be described below.

(Light-Emitting Element 6)

First, in a manner similar to that of Light-Emitting Element 1 described in Example 2, a film of ITSO was formed over a glass substrate 1100 to form a first electrode 1101.

Next, the substrate 1100 provided with the first electrode 1101 was fixed to a substrate holder in the vacuum evaporation apparatus so that a surface on which the first electrode 1101 was provided faced downward. The pressure in the vacuum evaporation apparatus was reduced to about $10^{-4}$ Pa. Then, 4,4'-{(1,1':2',1'':2'',1''')-quaterphenyl-3,3'''-yl}bisdibenzothiophene (abbreviation: mZ-DBT2-II) and molybdenum(VI) oxide were co-evaporated to form a hole-injection layer 1111 over the first electrode 1101. The thickness of the hole-injection layer 1111 was set to 50 nm, and the mass ratio of mZ-DBT2-II to molybdenum(VI) oxide was adjusted to 4:2 (=mZ-DBT2-II:molybdenum oxide).

Next, over the hole-injection layer 1111, a film of 3-[4-(1-naphthyl)-phenyl]-9-phenyl-9H-carbazole (abbreviation: PCPN) was formed to a thickness of 10 nm to form a hole-transport layer 1112.

Furthermore, CzPA and N,N'-bis(3-methylphenyl)-N,N'-bis[3-(9-phenyl-9H-fluoren-9-yl)phenyl]-pyrene-1,6-diamine (abbreviation: 1,6mMemFLPAPrn) were co-evaporated to form a light-emitting layer 1113 over the hole-transport layer 1112. Here, the mass ratio of CzPA to 1,6mMemFLPAPrn was adjusted to 1:0.04 (=CzPA:1,6-mMemFLPAPrn). In addition, the thickness of the light-emitting layer 1113 was set to 30 nm.

Further, over the light-emitting layer 1113, a film of CzPA was formed to a thickness of 10 nm to form a first electron-transport layer 1114*a*.

Then, over the first electron-transport layer 1114*a*, a BPhen film was formed to a thickness of 15 nm to form a second electron-transport layer 1114*b*.

Further, over the second electron-transport layer 1114*b*, a LiF film was formed by evaporation to a thickness of 1 nm to form an electron-injection layer 1115.

Lastly, an aluminum film was formed by evaporation to a thickness of 200 nm as a second electrode 1103 functioning as a cathode. Thus, Light-Emitting Element 6 of this example was fabricated.

Note that, in all the above evaporation steps, evaporation was performed by a resistance-heating method.

Table 9 shows an element structure of Light-Emitting Element 6 obtained as described above.

TABLE 9

|   | first electrode | hole-injection layer | hole-transport layer | light-emitting layer |
|---|---|---|---|---|
| Light-Emitting Element 6 | ITSO 110 nm | mZ-DBT2-II:MoOx (=4:2) 50 nm | PCPN 10 nm | CzPA:1,6mMemFLPAPrn (=1:0.04) 30 nm |

|   | first electron-transport layer | second electron-transport layer | electron-injection layer | second electrode |
|---|---|---|---|---|
| Light-Emitting Element 6 | CzPA 10 nm | BPhen 15 nm | LiF 1 nm | Al 200 nm |

In a glove box containing a nitrogen atmosphere, Light-Emitting Element 6 was sealed so as not to be exposed to air. Then, operation characteristics of Light-Emitting Element 6 were measured. Note that the measurements were carried out at room temperature (in the atmosphere kept at 25° C.).

Figure 30:
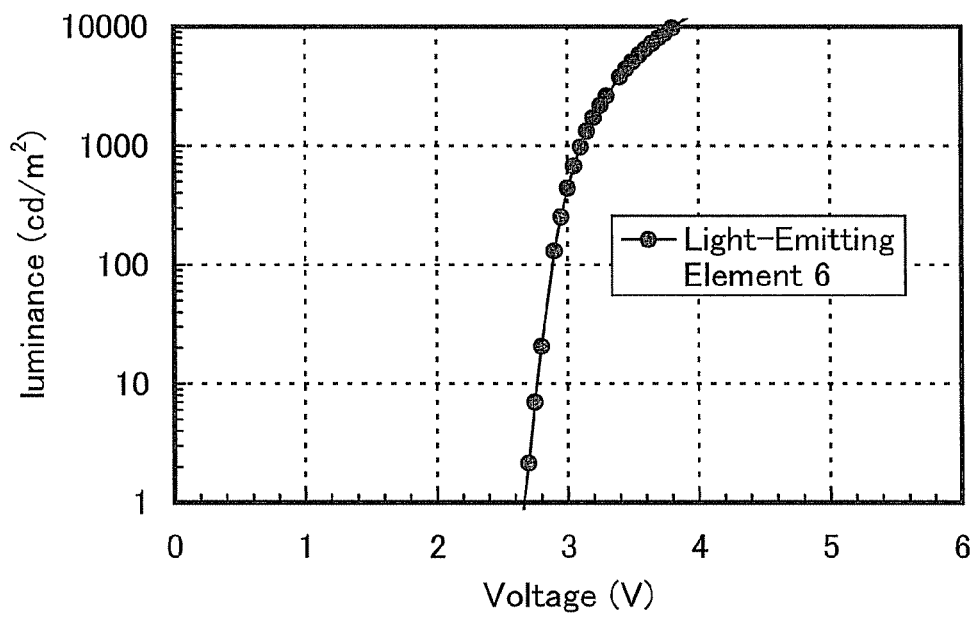
FIG. 30 shows voltage-luminance characteristics of a light-emitting element of Example 6
Figure 31:
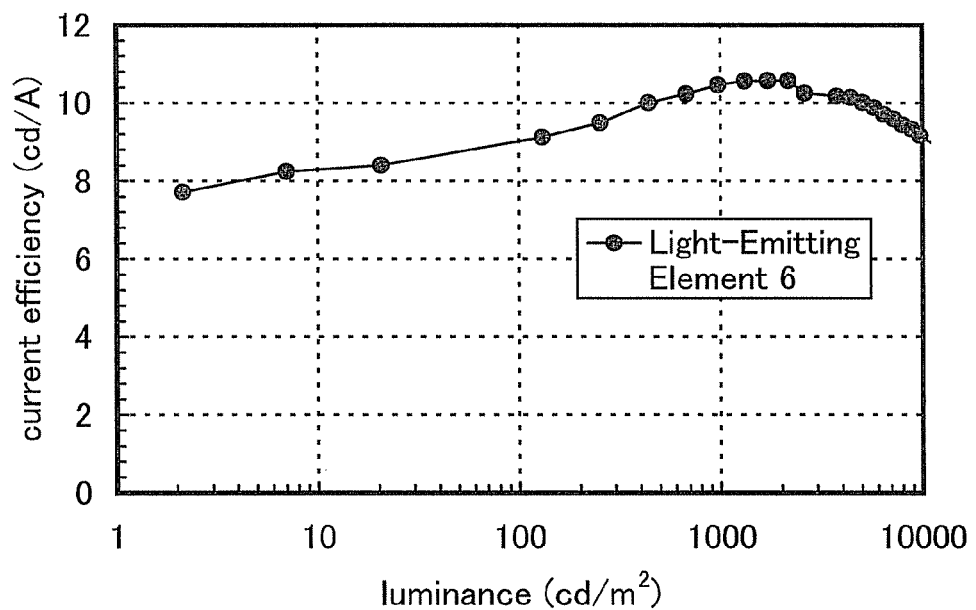
FIG. 31 shows luminance-current efficiency characteristics of a light-emitting element of Example 6.

FIG. 30 shows the voltage-luminance characteristics of Light-Emitting Element 6. In FIG. 30, the horizontal axis represents voltage (V) and the vertical axis represents luminance (cd/m²). FIG. 31 shows the luminance-current efficiency characteristics. In FIG. 31, the horizontal axis represents luminance (cd/m²) and the vertical axis represents current efficiency (cd/A). Further, Table 10 shows the voltage (V), CIE chromaticity coordinates (x, y), current efficiency (cd/A), and external quantum efficiency (%) of Light-Emitting Element 6 at a luminance of 1000 cd/m².

TABLE 10

|   | voltage (V) | CIE chromaticity coordinates (x, y) | current efficiency (cd/A) | external quantum efficiency (%) |
|---|---|---|---|---|
| Light-Emitting Element 6 | 3.1 | (0.14, 0.16) | 10 | 8.8 |

As shown in Table 10, the CIE chromaticity coordinates of Light-Emitting Element 6 were (x, y)=(0.14, 0.16) at a luminance of 1000 cd/m². These results show that blue light emission originating from 1,6mMemFLPAPrn was obtained from Light-Emitting Element 6.

As can be seen from FIG. 30, FIG. 31, and Table 10, Light-Emitting Element 6 exhibits high emission efficiency. It can also be seen that Light-Emitting Element 6 is a light-emitting element having a low drive voltage.

Figure 32:
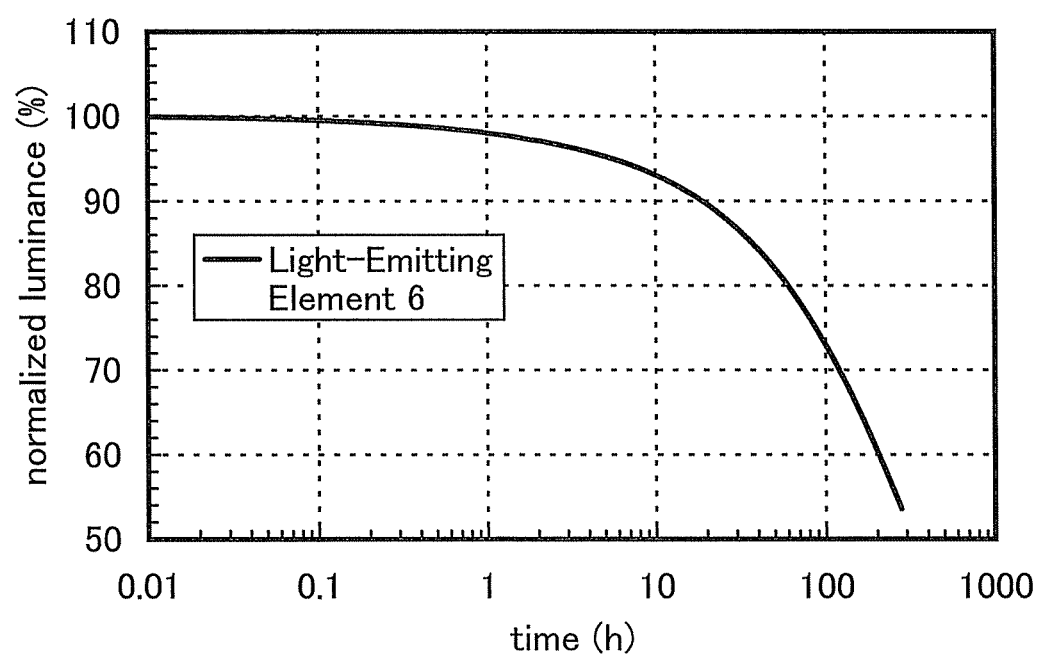
FIG. 32 shows results of a reliability test of a light-emitting element of Example 6.

Next, Light-Emitting Element 6 was subjected to a reliability test. Results of the reliability test are shown in FIG. 32. In FIG. 32, the vertical axis represents normalized luminance (%) with an initial luminance of 100%, and the horizontal axis represents driving time (h) of the element.

In the reliability test, Light-Emitting Element 6 was driven under the conditions where the initial luminance was set to 5000 cd/m² and the current density was constant.

FIG. 32 shows that Light-Emitting Element 6 kept 54% of the initial luminance after 280 hours elapsed.

The above results suggest that an element having high emission efficiency can be realized by use of the composite material of one embodiment of the present invention for a hole-injection layer of the light-emitting element. The results also suggest that a light-emitting element having a low drive voltage can be provided by use of the composite material of one embodiment of the present invention for a hole-injection layer of the light-emitting element. The results also suggest that a light-emitting element having a long lifetime can be manufactured by use of the composite material of one embodiment of the present invention for a hole-injection layer.

Example 7

In this example, a light-emitting element of one embodiment of the present invention will be described with reference to FIG. 16A. A structural formula of a material used in this example is illustrated below. Note that the structural formulae of materials which are already illustrated will be omitted.

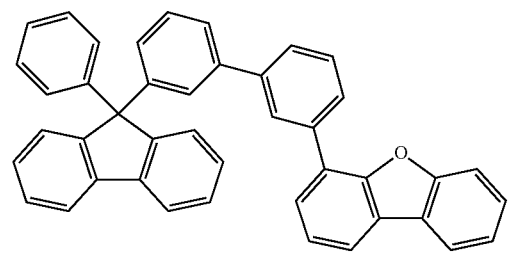

mmDBFFLBi-II

A method for manufacturing Light-Emitting Element 7 of this example will be described below.

(Light-Emitting Element 7)

A hole-injection layer 1111 of Light-Emitting Element 7 was formed by co-evaporating 4-{3-[3-(9-phenyl-9H-fluoren-9-yl)phenyl]phenyl}dibenzofuran (abbreviation: mmDBFFLBi-II) and molybdenum(VI) oxide. The thickness of the hole-injection layer 1111 was set to 50 nm, and the mass ratio of mmDBFFLBi-II to molybdenum(VI) oxide was adjusted to 4:2 (=mmDBFFLBi-II:molybdenum oxide).

A hole-transport layer 1112 of Light-Emitting Element 7 was formed by forming a film of mmDBFFLBi-II to a thickness of 10 nm. Components other than the hole-injection layer 1111 and the hole-transport layer 1112 were manufactured in a manner similar to that of Light-Emitting Element 6 described in Example 6.

Table 11 shows an element structure of Light-Emitting Element 7 obtained as described above.

TABLE 11

| | first electrode | hole-injection layer | hole-transport layer | light-emitting layer |
|---|---|---|---|---|
| Light-Emitting Element 7 | ITSO 110 nm | mmDBFFLBi-II:MoOx (=4:2) 50 nm | mmDBFFLBi-II 10 nm | CzPA:1,6mMemFLPAPrn (=1:0.04) 30 nm |

| | first electron-transport layer | second electron-transport layer | electron-injection layer | second electrode |
|---|---|---|---|---|
| Light-Emitting Element 7 | CzPA 10 nm | BPhen 15 nm | LiF 1 nm | Al 200 nm |

In a glove box containing a nitrogen atmosphere, Light-Emitting Element 7 was sealed so as not to be exposed to air. Then, operation characteristics of Light-Emitting Element 7 were measured. Note that the measurements were carried out at room temperature (in the atmosphere kept at 25° C.).

Figure 33:
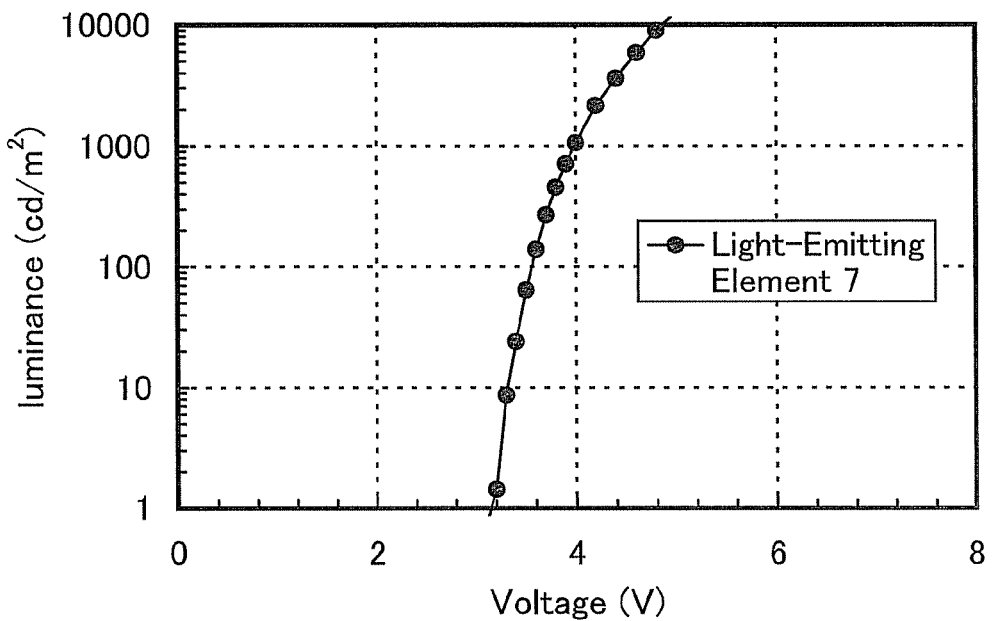
FIG. 33 shows voltage-luminance characteristics of a light-emitting element of Example 7.
Figure 34:
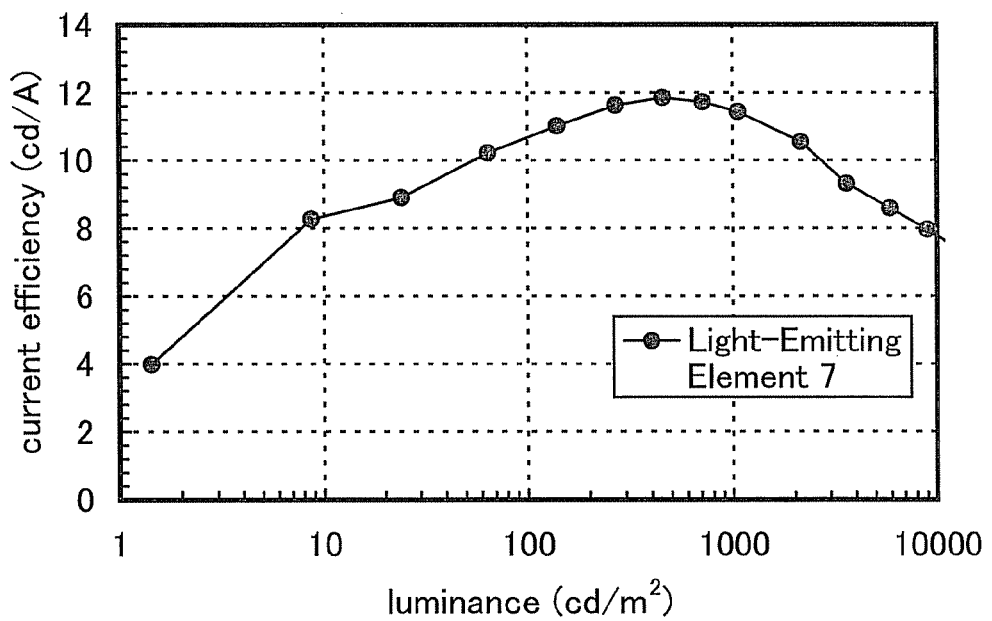
FIG. 34 shows luminance-current efficiency characteristics of a light-emitting element of Example 7.

FIG. 33 shows the voltage-luminance characteristics of Light-Emitting Element 7. In FIG. 33, the horizontal axis represents voltage (V) and the vertical axis represents luminance ($cd/m^2$). FIG. 34 shows the luminance-current efficiency characteristics. In FIG. 34, the horizontal axis represents luminance ($cd/m^2$) and the vertical axis represents current efficiency (cd/A). Further, Table 12 shows the voltage (V), CIE chromaticity coordinates (x, y), current efficiency (cd/A), and external quantum efficiency (%) of Light-Emitting Element 7 at a luminance of 1000 $cd/m^2$.

TABLE 12

| | voltage (V) | CIE chromaticity coordinates (x, y) | current efficiency (cd/A) | external quantum efficiency (%) |
|---|---|---|---|---|
| Light-Emitting Element 7 | 3.1 | (0.14, 0.16) | 10 | 8.8 |

As shown in Table 12, the CIE chromaticity coordinates of Light-Emitting Element 7 were (x, y)=(0.14, 0.16) at a luminance of 1000 $cd/m^2$. These results show that blue light emission originating from 1,6mMemFLPAPrn was obtained from Light-Emitting Element 7.

As can be seen from FIG. 32, FIG. 33, and Table 12, Light-Emitting Element 7 exhibits high emission efficiency. It can also be seen that Light-Emitting Element 7 is a light-emitting element having a low drive voltage.

The above results suggest that an element having high emission efficiency can be realized by use of the composite material of one embodiment of the present invention for a hole-injection layer of the light-emitting element. The results also suggest that a light-emitting element having a low drive voltage can be provided by use of the composite material of one embodiment of the present invention for a hole-injection layer of the light-emitting element.

Example 8

In this example, a light-emitting element of one embodiment of the present invention will be described with reference to FIG. 16A. The materials used in this example are used in the above examples, and therefore the chemical formulae thereof are omitted here.

A method for manufacturing Light-Emitting Element 8 of this example will be described below.

(Light-Emitting Element 8)

A hole-injection layer 1111 of Light-Emitting Element 8 was formed by co-evaporating mmDBFFLBi-II and molybdenum(VI) oxide. The thickness of the hole-injection layer 1111 was set to 50 nm, and the mass ratio of mmDBFFLBi-II to molybdenum(VI) oxide was adjusted to 4:2 (=mmDBFFLBi-II:molybdenum oxide).

The hole-transport layer 1112 of Light-Emitting Element 8 was formed by forming a film of PCzPA to a thickness of 10 nm. Components other than the hole-injection layer 1111 and the hole-transport layer 1112 were manufactured in a manner similar to that of Light-Emitting Element 6 described in Example 6.

Table 13 shows an element structure of Light-Emitting Element 8 obtained as described above.

TABLE 13

| | first electrode | hole-injection layer | hole-transport layer | light-emitting layer |
|---|---|---|---|---|
| Light-Emitting Element 8 | ITSO 110 nm | mmDBFFLBi-II:MoOx (=4:2) 50 nm | PCzPA 10 nm | CzPA:1,6mMemFLPAPrn (=1:0.04) 30 nm |

| | first electron-transport layer | second electron-transport layer | electron-injection layer | second electrode |
|---|---|---|---|---|
| Light-Emitting Element 8 | CzPA 10 nm | BPhen 15 nm | LiF 1 nm | Al 200 nm |

In a glove box containing a nitrogen atmosphere, Light-Emitting Element 8 was sealed so as not to be exposed to air. Then, operation characteristics of Light-Emitting Element 8 were measured. Note that the measurements were carried out at room temperature (in the atmosphere kept at 25° C.).

Figure 35:
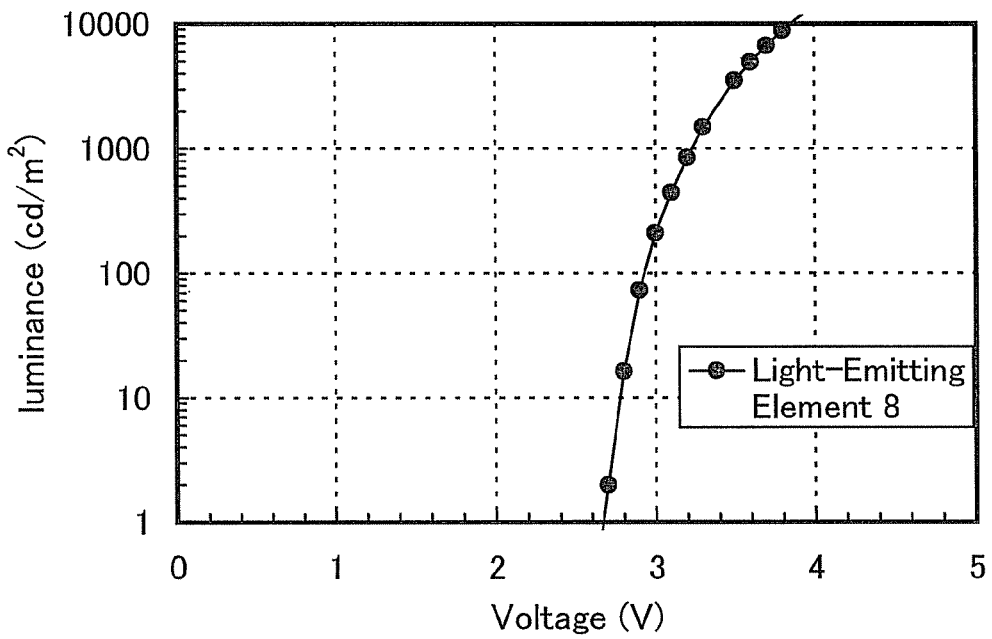
FIG. 35 shows voltage-luminance characteristics of a light-emitting element of Example 8.
Figure 36:
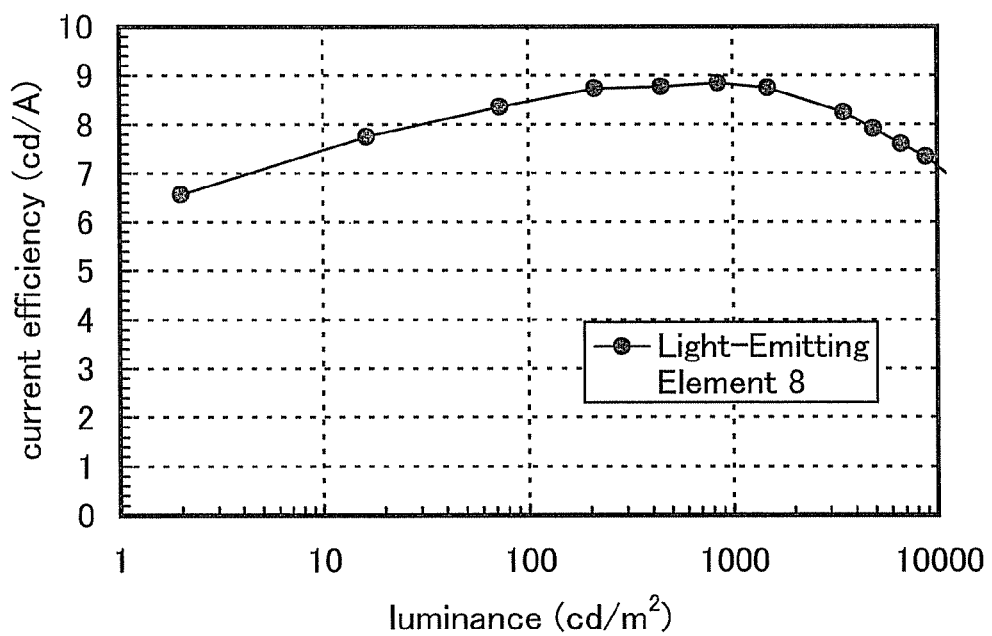
FIG. 36 shows luminance-current efficiency characteristics of a light-emitting element of Example 8.

FIG. 35 shows the voltage-luminance characteristics of Light-Emitting Element 8. In FIG. 35, the horizontal axis represents voltage (V) and the vertical axis represents luminance ($cd/m^2$). FIG. 36 shows the luminance-current efficiency characteristics. In FIG. 36, the horizontal axis represents luminance ($cd/m^2$) and the vertical axis represents current efficiency (cd/A). Further, Table 14 shows the voltage (V), CIE chromaticity coordinates (x, y), current efficiency (cd/A), and external quantum efficiency (%) of Light-Emitting Element 8 at a luminance of 1000 $cd/m^2$.

TABLE 14

| | voltage (V) | CIE chromaticity coordinates (x, y) | current efficiency (cd/A) | external quantum efficiency (%) |
|---|---|---|---|---|
| Light-Emitting Element 8 | 3.2 | (0.14, 0.18) | 8.8 | 6.8 |

As shown in Table 14, the CIE chromaticity coordinates of Light-Emitting Element 8 were (x, y)=(0.14, 0.18) at a luminance of 1000 cd/m². These results show that blue light emission originating from 1,6mMemFLPAPrn was obtained from Light-Emitting Element 8.

As can be seen from FIG. 34, FIG. 35, and Table 14, Light-Emitting Element 8 exhibits high emission efficiency. It can also be seen that Light-Emitting Element 8 is a light-emitting element having a low drive voltage.

The above results suggest that an element having high emission efficiency can be realized by use of the composite material of one embodiment of the present invention for a hole-injection layer of the light-emitting element. The results also suggest that a light-emitting element having a low drive voltage can be provided by use of the composite material of one embodiment of the present invention for a hole-injection layer of the light-emitting element.

Example 9

Figure 16B:
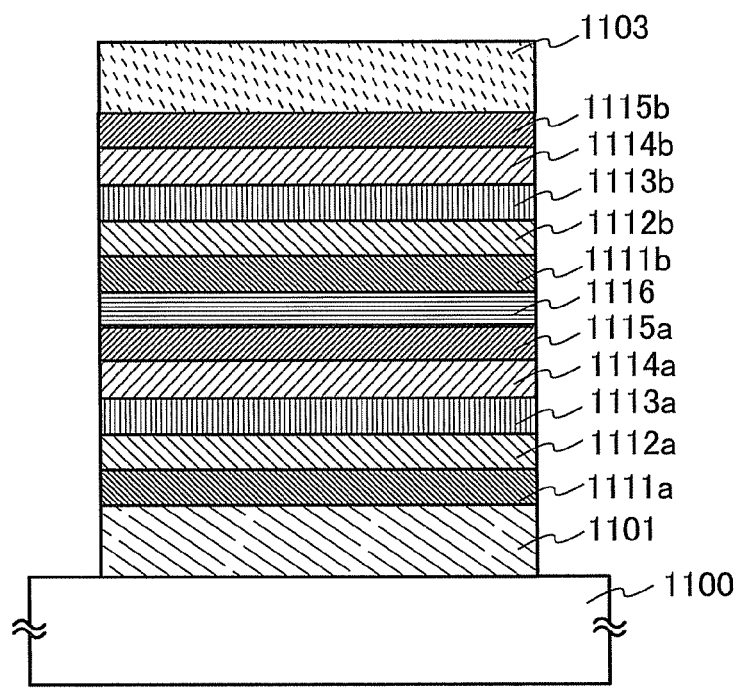

In this example, a light-emitting element of one embodiment of the present invention will be described with reference to FIG. 16B. A structural formula of a material used in this example is illustrated below. Note that structural formulae of the materials used in the above examples are omitted here.

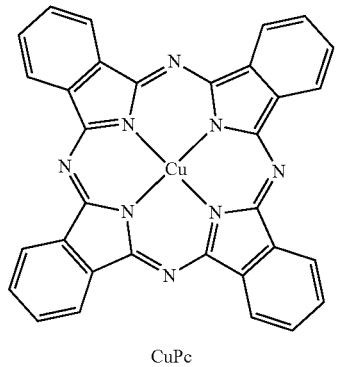

CuPc

Methods for manufacturing Light-Emitting Element 9 and Comparative Light-Emitting Element 10 of this example will be described below.
(Light-Emitting Element 9)

First, an ITSO film was formed over a glass substrate 1100 by a sputtering method, so that a first electrode 1101 which functions as an anode was formed. Note that the thickness was set to 110 nm and the electrode area was set to 2 mm×2 mm.

In pretreatment for forming the light-emitting element over the substrate 1100, UV ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate 1100 was cooled down for about 30 minutes.

Next, the substrate 1100 provided with the first electrode 1101 was fixed to a substrate holder in the vacuum evaporation apparatus so that a surface on which the first electrode 1101 was provided faced downward. The pressure in the vacuum evaporation apparatus was reduced to about $10^{-4}$ Pa. Then, DBT3P-II and molybdenum(VI) oxide were co-evaporated to form a first hole-injection layer 1111a over the first electrode 1101. The thickness of the first hole-injection layer 1111a was set to 50 nm, and the mass ratio of DBT3P-II to molybdenum(VI) oxide was adjusted to 4:2 (=DBT3P-II:molybdenum oxide).

Next, over the first hole-injection layer 1111a, a film of PCPN was formed to a thickness of 10 nm to form a first hole-transport layer 1112a.

Next, CzPA and 1,6FLPAPrn were co-evaporated to form a first light-emitting layer 1113a over the first hole transport-layer 1112a. Here, the mass ratio of CzPA to 1,6FLPAPrn was adjusted to 1:0.05 (=CzPA:1,6FLPAPrn). The thickness of the first light-emitting layer 1113a was set to 30 nm.

Next, over the first light-emitting layer 1113a, a CzPA film was formed to a thickness of 10 nm and a BPhen film was formed to a thickness of 15 nm to form a first electron-transport layer 1114a.

Further, over the first electron-transport layer 1114a, a film of lithium oxide ($Li_2O$) was formed by evaporation to a thickness of 0.1 nm to form a first electron-injection layer 1115a.

After that, over the first electron-injection layer 1115a, a film of copper phthalocyanine (abbreviation: CuPc) was formed by evaporation to a thickness of 2 nm to form an electron-relay layer 1116.

Next, over the electron-relay layer 1116, DBT3P-II and molybdenum(VI) oxide were co-evaporated to form a second hole-injection layer 1111b. The thickness of the second hole-injection layer 1111b was set to 50 nm, and the mass ratio of DBT3P-II to molybdenum(VI) oxide was adjusted to 4:2 (=DBT3P-II:molybdenum oxide). Note that the second hole-injection layer 1111b of this example functions as the charge-generation layer described in the above embodiment.

Next, over the second hole-injection layer 1111b, a PCPN film was formed to a thickness of 10 nm to form a second hole-transport layer 1112b.

Furthermore, CzPA and 1,6FLPAPrn were co-evaporated to form a second light-emitting layer 1113b over the second hole-transport layer 1112b. Here, the mass ratio of CzPA to 1,6FLPAPrn was adjusted to 1:0.05 (=CzPA:1,6FLPAPrn). In addition, the thickness of the second light-emitting layer 1113b was set to 30 nm.

Further, over the second light-emitting layer 1113b, a film of CzPA was formed to a thickness of 10 nm and a film of BPhen was formed to a thickness of 15 nm to form a second electron-transport layer 1114b.

Further, over the second electron-transport layer 1114b, a film of LiF was formed to a thickness of 1 nm to form a second electron-injection layer 1115b.

Lastly, an aluminum film was formed by evaporation to a thickness of 200 nm as a second electrode 1103 functioning as a cathode. Thus, Light-Emitting Element 9 of this example was fabricated.

(Comparative Light-Emitting Element 10)

A first hole-injection layer 1111a of Comparative Light-Emitting Element 10 was formed by co-evaporating PCzPA and molybdenum(VI) oxide. The thickness of the first hole-injection layer 1111a was set to 50 nm, and the mass ratio of PCzPA to molybdenum(VI) oxide was adjusted to 4:2 (=PCzPA:molybdenum oxide).

A second hole-injection layer 1111b of Comparative Light-Emitting Element 10 was formed by co-evaporating PCzPA and molybdenum(VI) oxide. The thickness of the second hole-injection layer 1111b was set to 60 nm, and the mass ratio of PCzPA to molybdenum(VI) oxide was adjusted to 4:2 (=PCzPA:molybdenum oxide). Components other than the first hole-injection layer 1111a and the second hole-injection layer 1111b were manufactured in a manner similar to that of Light-Emitting Element 9.

Note that, in all the above evaporation steps, evaporation was performed by a resistance-heating method.

Table 15 shows element structures of Light-Emitting Element 9 and Comparative Light-Emitting Element 10 obtained as described above. Note that as for Light-Emitting Element 9, the substance X in Table 15 is DBT3P-II and the thickness Y is 50 nm. In addition, as for Comparative Light-Emitting Element 10, the substance X in Table 15 is PCzPA and the thickness Y is 60 nm.

luminance (cd/m²) and the vertical axis represents current efficiency (cd/A). Further, Table 16 shows the voltage (V), CIE chromaticity coordinates (x, y), current efficiency (cd/A), power efficiency (1 m/W), and external quantum efficiency (%) of Light-Emitting Element 9 and Comparative Light-Emitting Element 10 at a luminance of 1000 cd/m².

TABLE 16

| | voltage (V) | CIE chromaticity coordinates (x, y) | current efficiency (cd/A) | power efficiency (lm/W) | external quantum efficiency (%) |
|---|---|---|---|---|---|
| Light-Emitting Element 9 | 6.0 | (0.14, 0.20) | 23 | 12 | 16 |
| Comparative Light-Emitting Element 10 | 6.0 | (0.14, 0.20) | 21 | 11 | 15 |

As shown in Table 16, the CIE chromaticity coordinates of each of Light-Emitting Element 9 and Comparative Light-Emitting Element 10 were (x, y)=(0.14, 0.20) at a luminance of 1000 cd/m².

Figure 38:
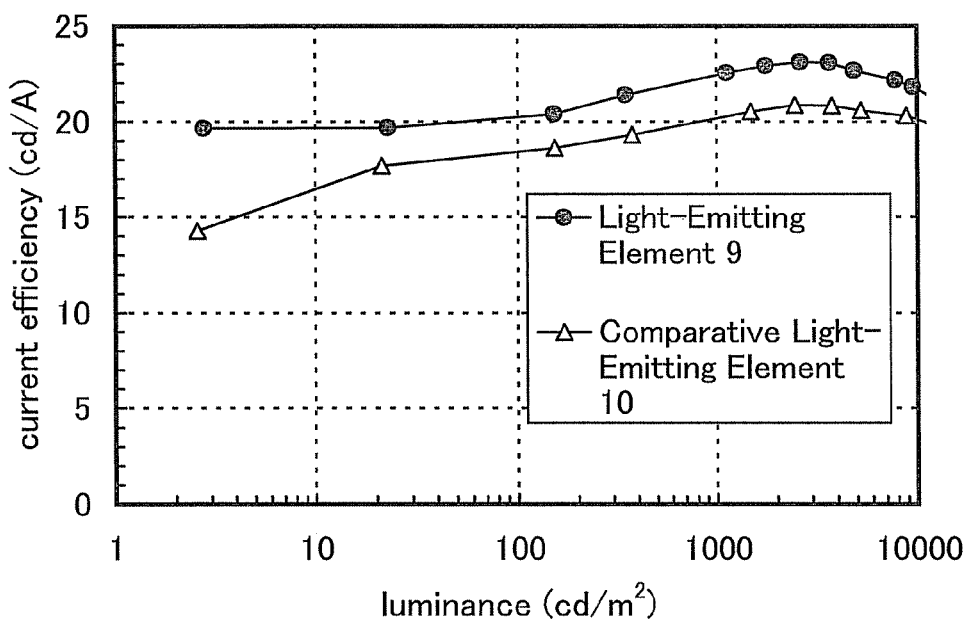
FIG. 38 shows luminance-current efficiency characteristics of a light-emitting element of Example 9.

As can be seen from FIG. 38 and Table 16, Light-Emitting Element 9 has current efficiency, power efficiency, and

TABLE 15

| first electrode ITSO | | | | | | |
|---|---|---|---|---|---|---|
| 110 nm | | | | | | |
| first hole-injection layer substance X:MoOx | first hole-transport layer | first light-emitting layer | first electron-transport layer | first electron-injection layer | electron-relay layer | |
| (=4:2) | PCPN | (=1:0.05) | CzPA | Bphen | Li₂O | CuPc |
| 50 nm | 10 nm | 30 nm | 10 nm   15 nm | 0.1 nm | 2 nm | |
| second hole-injection layer substance X:MoOx | second hole-transport layer | second light-emitting layer | second electron-transport layer | second electron-injection layer | second electrode | |
| (=4:2) | PCPN | (=1:0.05) | CzPA | Bphen | LiF | Al |
| thickness Y | 10 nm | 30 nm | 10 nm   15 nm | 1 nm | 200 nm | |

In a glove box containing a nitrogen atmosphere, these light-emitting elements were sealed so as not to be exposed to air. Then, operation characteristics of these light-emitting elements were measured. Note that the measurements were carried out at room temperature (in the atmosphere kept at 25° C.).

Note that the above-described two light-emitting elements were formed over the same substrate. In addition, the first electrodes, the first hole-transport layers to the electron-relay layers, and the second hole-transport layers to the second electrodes of the above-described two light-emitting elements were formed at the same respective times, and sealing was performed at the same time.

Figure 37:
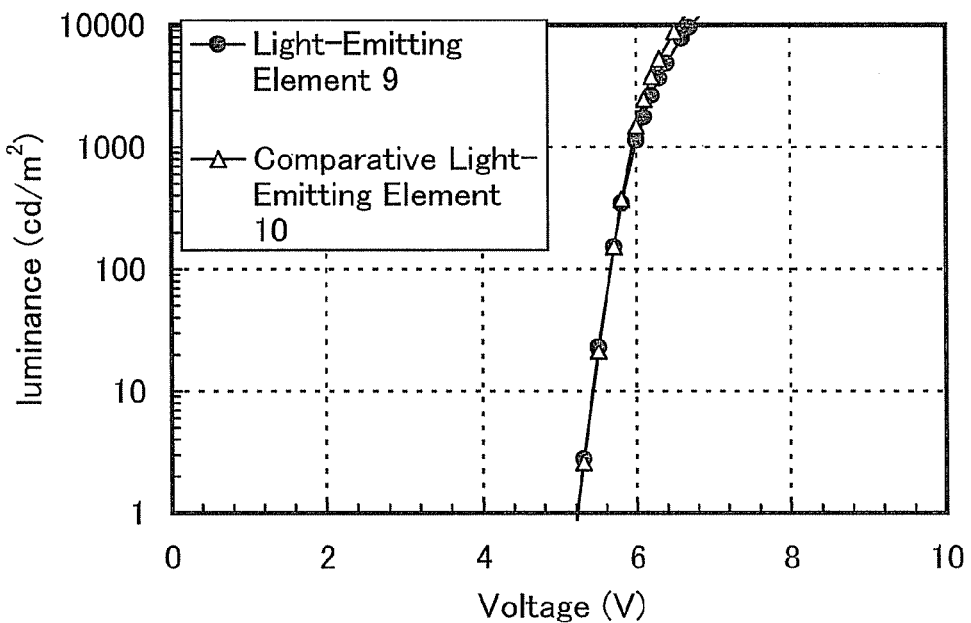
FIG. 37 shows voltage-luminance characteristics of a light-emitting element of Example 9.

FIG. 37 shows the voltage-luminance characteristics of Light-Emitting Element 9 and Comparative Light-Emitting Element 10. In FIG. 37, the horizontal axis represents voltage (V) and the vertical axis represents luminance (cd/m²). FIG. 38 shows the luminance-current efficiency characteristics. In FIG. 38, the horizontal axis represents external quantum efficiency higher than those of Comparative Light-Emitting Element 10.

Here, an absorption spectrum of the composite material including PCzPA and molybdenum oxide used in Comparative Light-Emitting Element 10 was measured and compared with that of the composite material including DBT3P-II and molybdenum oxide (FIGS. 8A and 8B) used in Light-Emitting Element 9.

Figure 39A:
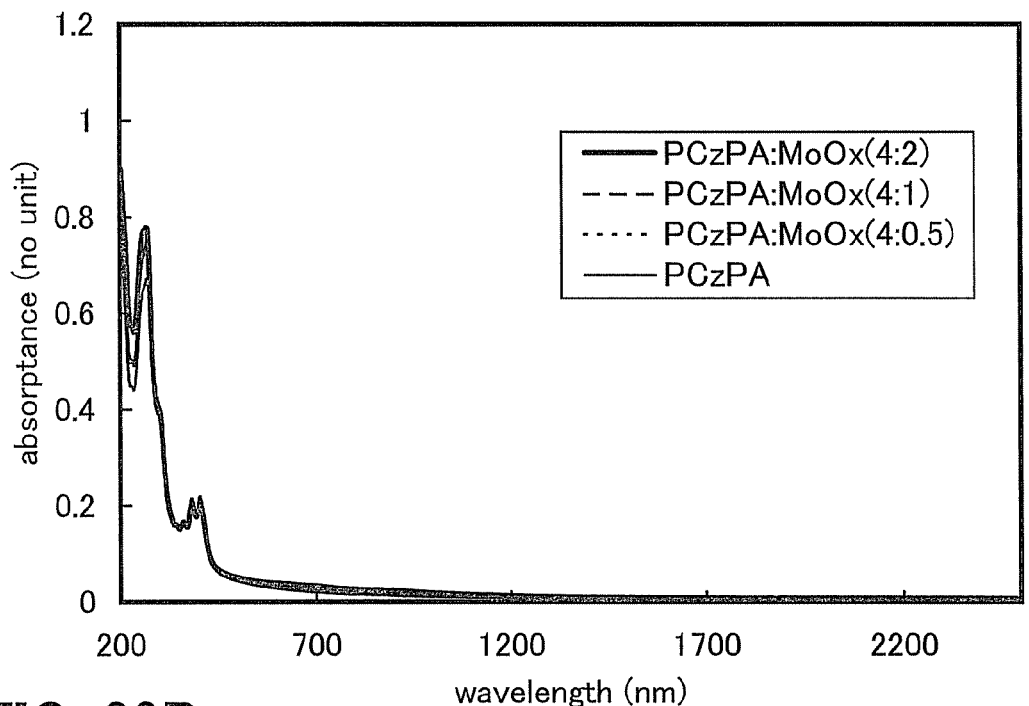
FIGS. 39A and 39B show absorptances of PCzPA and a composite material thereof.
Figure 39B:
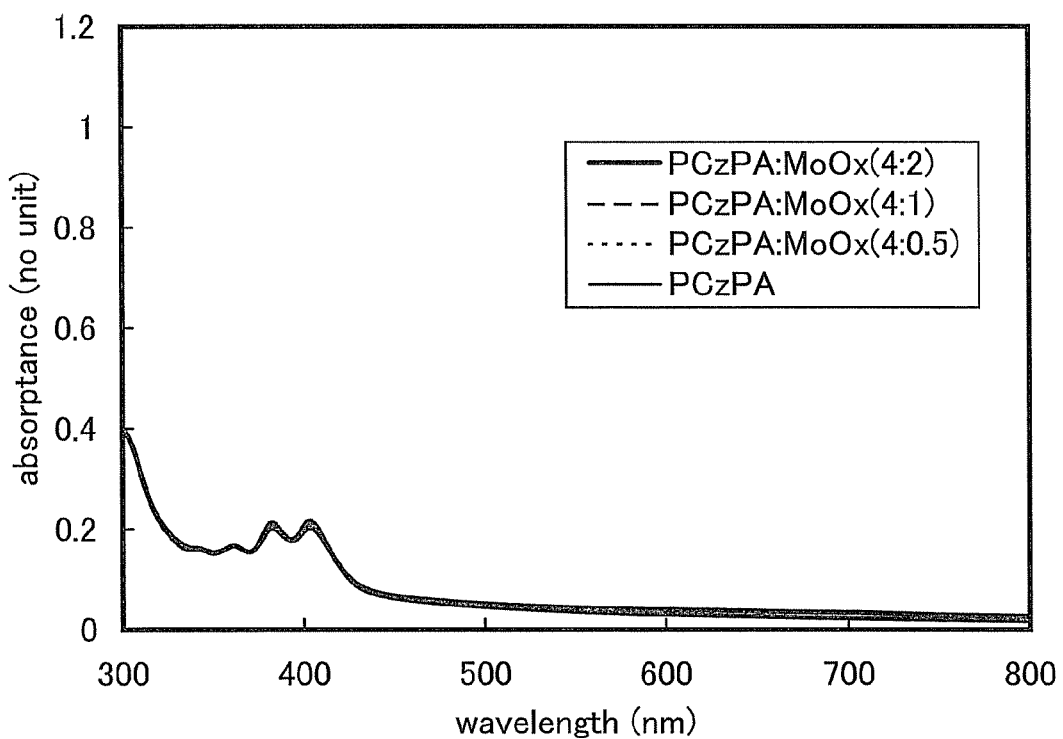

FIGS. 39A and 39B show absorption spectra of films formed by co-evaporating PCzPA and molybdenum(VI) oxide (at mass ratios of 4:2, 4:1, and 4:0.5 (=PCzPA:molybdenum oxide)) to a thickness of 50 nm. Note that in FIGS. 39A and 39B, the horizontal axis represents wavelength (nm) and the vertical axis represents absorptance (no unit).

As shown in FIGS. 39A and 39B, the composite material including PCzPA and molybdenum oxide has an absorption peak in the visible light region. On the other hand, as described in Example 1, the composite material including DBT3P-II and molybdenum oxide has almost no significant absorption peak in the visible light region (FIGS. 8A and 8B).

This indicates that the composite material including DBT3P-II and molybdenum oxide has a higher transmittance in the visible light region than the composite material including PCzPA and molybdenum oxide and therefore Light-Emitting Element 9 has current efficiency higher than that of Comparative Light-Emitting Element 10.

The above results suggest that an element having high emission efficiency can be realized by use of the composite material of one embodiment of the present invention for a hole-injection layer and a charge-generation layer of a tandem light-emitting element. The results also suggest that a light-emitting element having a low drive voltage can be provided by use of the composite material of one embodiment of the present invention for a hole-injection layer and a charge-generation layer of a tandem light-emitting element. The results also show that the composite material of one embodiment of the present invention functions quite effectively as a charge-generation layer of a tandem light-emitting element despite the fact that no light absorption due to charge transfer interaction is observed.

Example 10

In this example, results of evaluation of the composite material of one embodiment of the present invention by an electron spin resonance (ESR) method will be described. In this example, the composite material of one embodiment of the present invention which includes DBT3P-II and molybdenum oxide is compared with a conventional composite material which includes 4,4'-bis[N-(1-naphthyl)-N-phenylamino]biphenyl (abbreviation: NPB) and molybdenum oxide. A structural formula of NPB is illustrated below.

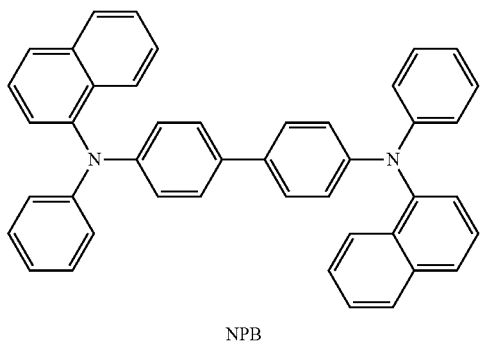 [SMILES: c1ccc(N(c2ccc(-c3ccc(N(c4ccccc4)c4cccc5ccccc45)cc3)cc2)c2cccc3ccccc23)cc1 ; "NPB"]

NPB

<Comparison Between Absorption Spectra of Composite Materials>

First, an absorption spectrum of the conventional composite material which includes NPB and molybdenum oxide was measured and compared with that of the composite material of one embodiment of the present invention which includes DBT3P-II and molybdenum oxide (FIGS. 8A and 8B).

Figure 40A:
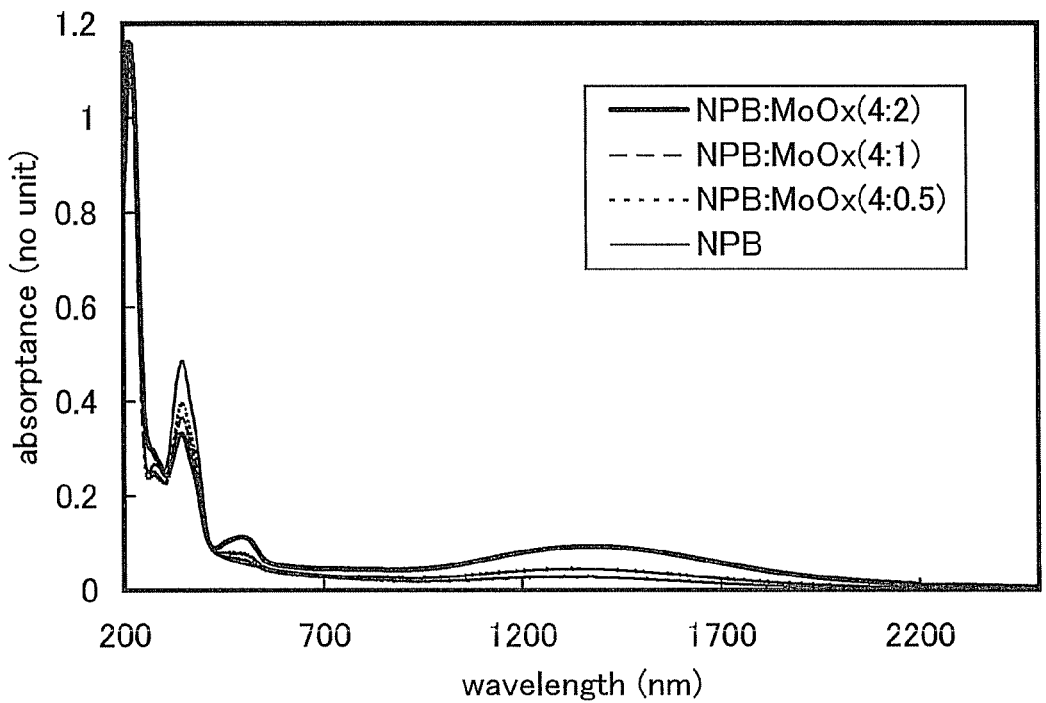
FIGS. 40A and 40B show absorptances of NPB and a composite material thereof.
Figure 40B:
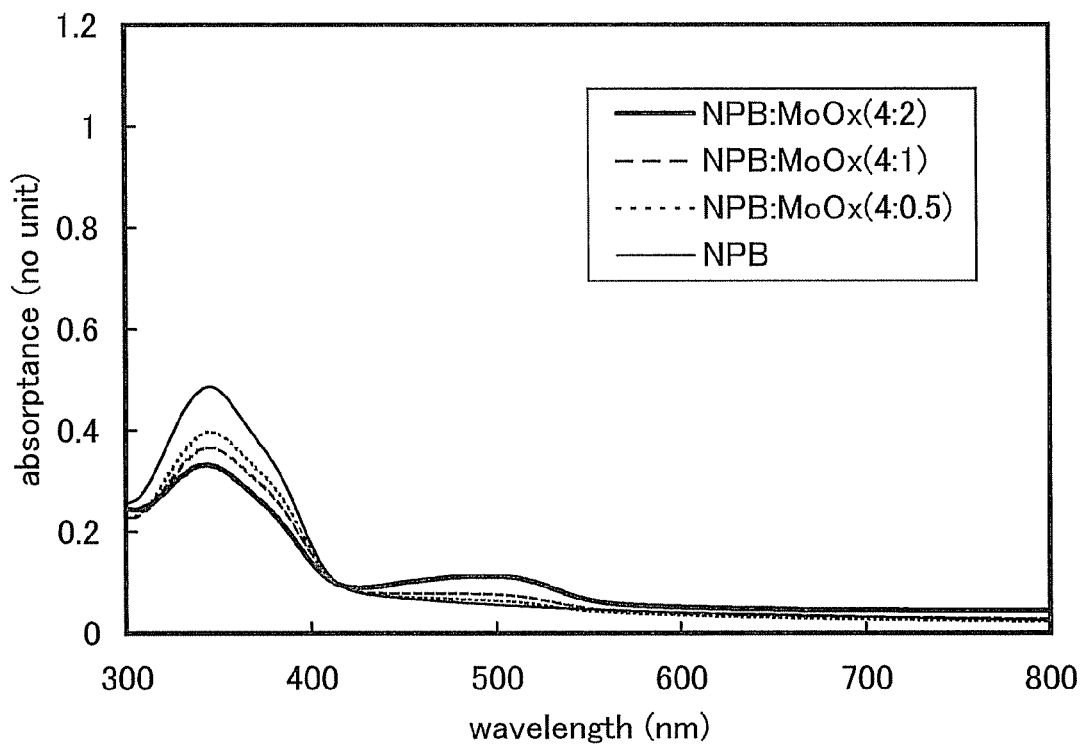

FIGS. 40A and 40B show absorption spectra of films formed by co-evaporating NPB and molybdenum(VI) oxide (at mass ratios of 4:2, 4:1, and 4:0.5 (=NPB: molybdenum oxide)) to a thickness of 50 nm. Note that in FIGS. 40A and 40B, the horizontal axis represents wavelength (nm) and the vertical axis represents absorptance (no unit).

A comparison between FIGS. 40A and 40B and FIGS. 8A and 8B demonstrates that significant light absorption based on charge transfer interaction occurs at around 500 nm and around 1300 nm when NPB is used for the composite material (furthermore, as the concentration of molybdenum oxide increases, the peak intensity increases), whereas this problem can be solved when DBT3P-II is used. Note that the HOMO level of NPB (measured by photoelectron spectroscopy) is −5.4 eV and the HOMO level of DBT3P-II is −5.9 eV. This also indicates that NPB is more likely to have charge transfer interaction as compared to DBT3P-II.

In this manner, the likelihood of occurrence of charge transfer interaction can be found from an absorption spectrum; in this example, qualitative and quantitative evaluations by ESR measurement were further conducted to examine a difference between the composite material of one embodiment of the present invention and the conventional composite material. The details will be described below.

<Samples for ESR Measurement>

Samples 1 to 6 and Comparative Samples 1 to 13 of this example will be described.

Samples 1 to 6 according to one embodiment of the present invention are composite films containing a composite material of DBT3P-II and molybdenum oxide. Comparative Samples 1 to 13 are composite films containing a composite material of NPB and molybdenum oxide.

Every sample was formed by co-evaporating an organic compound (DBT3P-II or NPB) and molybdenum(VI) oxide over a quartz substrate. The size of the quartz substrate was 2.8 mm×20 mm (as for Comparative Samples 1 to 3, 3.0 mm×20 mm).

Specifically, the quartz substrate was fixed to a holder in a vacuum evaporation apparatus so that a surface on which the composite material was to be deposited faced downward. The pressure in the vacuum evaporation apparatus was reduced to $10^{-4}$ Pa. Then, the organic compound (DBT3P-II or NPB) and molybdenum(VI) oxide were co-evaporated to form a composite film containing a composite material of the organic compound (DBT3P-II or NPB) and molybdenum oxide over the quartz substrate. The thickness of the composite film of each sample was adjusted to 50 nm.

The molar ratio of the organic compound to molybdenum(VI) oxide of each sample was adjusted with deposition rates. Table 17 shows the mass ratio and the molar ratio of the organic compound to molybdenum(VI) oxide of each sample. Note that four samples were prepared as each sample (eight samples as Comparative Sample 3) and subjected to ESR measurement in the state where the four samples (the eight samples in the case of Comparative Sample 3) were stacked. Table 17 also shows the g-value of each sample.

TABLE 17

| | organic compound | mass ratio (organic compound:MoOx) | molar ratio | g-value |
|---|---|---|---|---|
| Sample 1 | DBT3P-II | 4:0.2 | 1:0.215 | 2.0054 |
| Sample 2 | | 4:0.5 | 1:0.538 | 2.0054 |
| Sample 3 | | 4:1 | 1:1.07 | 2.0055 |
| Sample 4 | | 4:2 | 1:2.15 | 2.0055 |
| Sample 5 | | 4:3 | 1:3.23 | 2.0055 |
| Sample 6 | | 4:4 | 1:4.30 | 2.0054 |
| Comparative Sample 1 | NPB | 4:0.2 | 1:0.205 | 2.0026 |
| Comparative Sample 2 | | 4:1 | 1:1.03 | 2.0025 |
| Comparative Sample 3 | | 4:1 | 1:1.03 | 2.0024 |
| Comparative Sample 4 | | 4:0.5 | 1:0.512 | 2.0023 |

TABLE 17-continued

| | organic compound | mass ratio (organic compound:MoOx) | molar ratio | g-value |
|---|---|---|---|---|
| Comparative Sample 5 | | 4:1 | 1:1.03 | 2.0021 |
| Comparative Sample 6 | | 4:2 | 1:2.05 | 2.0019 |
| Comparative Sample 7 | | 4:2 | 1:2.05 | 2.0020 |
| Comparative Sample 8 | | 4:2 | 1:2.05 | 2.0021 |
| Comparative Sample 9 | | 4:3 | 1:3.04 | 2.0019 |
| Comparative Sample 10 | | 4:4 | 1:4.10 | 2.0016 |
| Comparative Sample 11 | | 4:4 | 1:4.10 | 2.0012 |
| Comparative Sample 12 | | 4:5 | 1:5.13 | 2.0011 |
| Comparative Sample 13 | | 4:6 | 1:6.15 | 2.0011 |

<ESR Measurement>

The measurement was performed using an electron spin resonance spectrometer (JES-FA200, manufactured by JEOL Ltd.) under the conditions where the resonance frequency was about 9.4 GHz, the modulation frequency was 100 kHz, the modulation width was 0.6 mT, the time constant was 0.1 sec, the sweep time was 4 min., and the measurement temperature was room temperature. Magnetic field correction was performed with reference to the positions of $Mn^{2+}$ third and fourth signals. The intensity of a measured electron spin resonance (ESR) spectrum reflects the number of unpaired electrons, and the likelihood of occurrence of charge transfer interaction between the organic compound and molybdenum oxide can be indirectly found out by comparing the intensities of spectra. Note that g-values each calculated from the peak of the ESR spectrum range from 2.001 to 2.006 and are in the neighborhood of the g-value of a free electron (2.0023).

<Results of Measurement>

Figure 41:
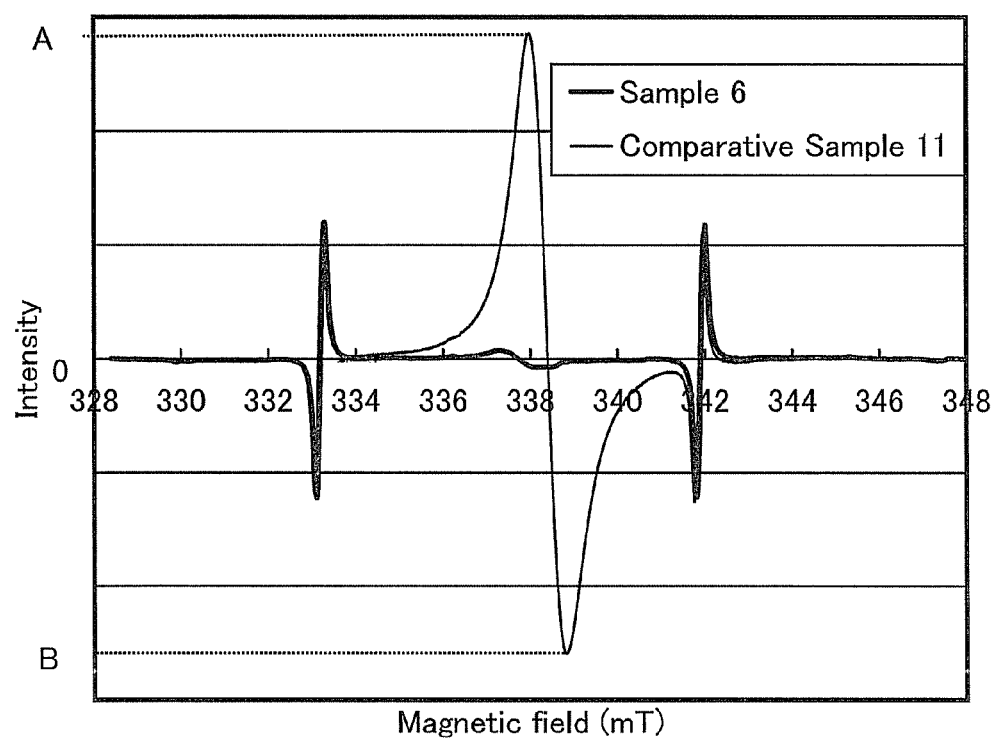
FIG. 41 shows results of ESR measurement of Example 10.

FIG. 41 shows ESR spectra of Sample 6 and Comparative Sample 11. In FIG. 41, the horizontal axis represents magnetic field (unit:mT) and the vertical axis represents intensity.

As can be seen from FIG. 41, the intensity of Sample 6 at a magnetic field of around 336 mT to 340 mT is extremely lower than that of Comparative Sample 11. The lower the intensity is, the smaller the number of unpaired electrons generated by charge transfer interaction in the composite material is. That is, it can be said that Sample 6 is less likely to have charge transfer interaction in the composite material, as compared to Comparative Sample 11.

The results indicate that the composite material including DBT3P-II and molybdenum oxide, which is the composite material of one embodiment of the present invention, is less likely to have charge transfer interaction as compared to the composite material including NPB and molybdenum oxide and can suppress the occurrence of light absorption based on the charge transfer interaction.

Figure 42A:
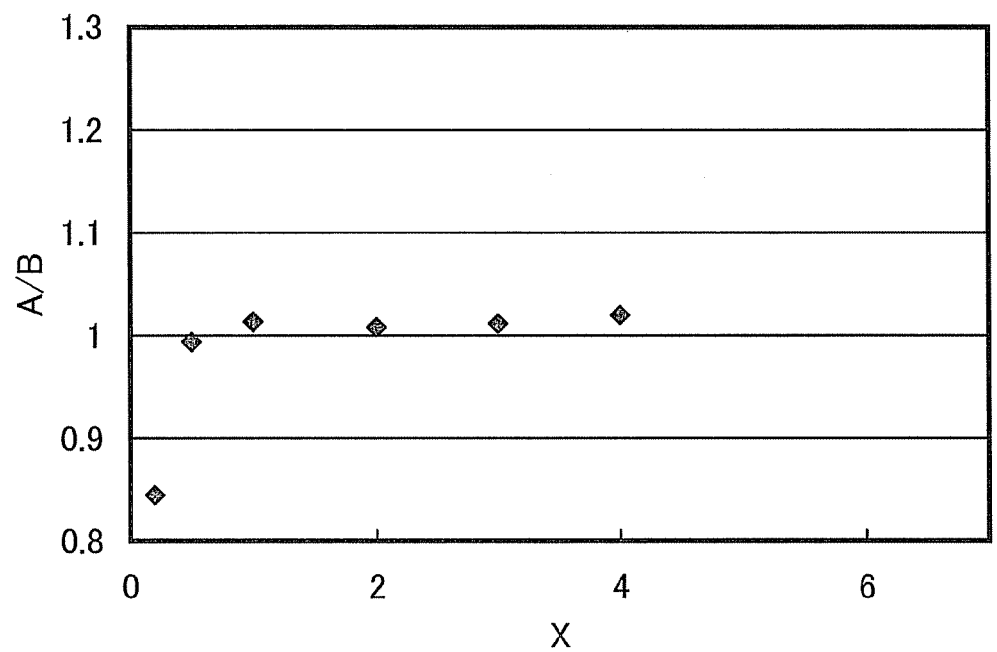
FIGS. 42A and 42B show results of ESR measurement of Example 10.
Figure 42B:
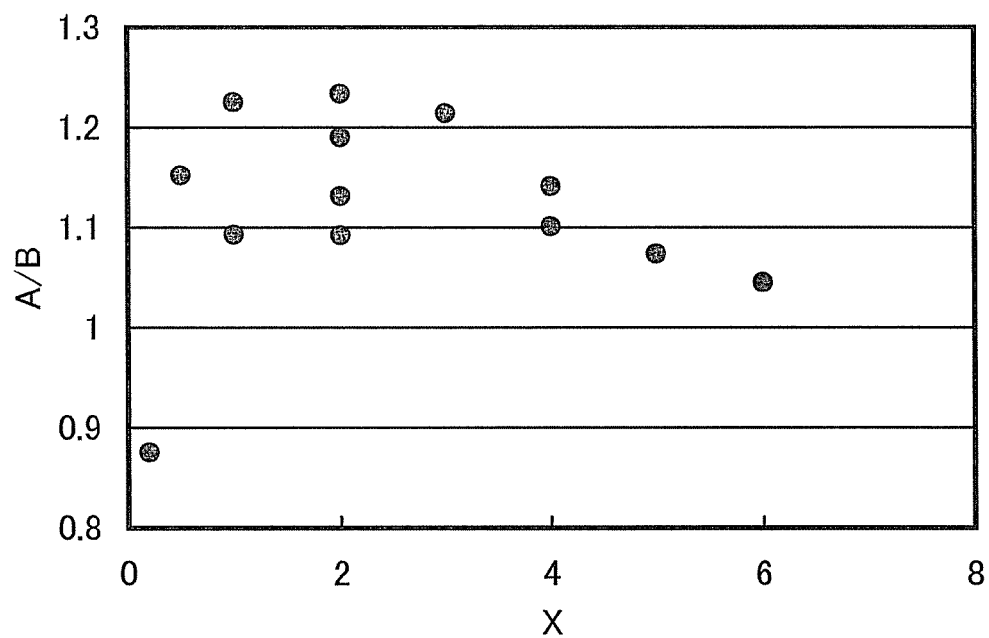

FIGS. 42A and 42B are graphs showing the relationship between the molar ratio of molybdenum(VI) oxide to the organic compound of each sample and the ratio (A/B) of a positive peak value (A) to a negative peak value (B) of the ESR spectrum of each sample. As an example, A and B of Comparative Sample 11 are shown in FIG. 41. In FIGS. 42A and 42B, the horizontal axis represents the value of X in the molar ratio of the organic compound to molybdenum(VI) oxide (1:X (=Organic compound: molybdenum oxide)) of each sample, and the vertical axis represents the value of A/B of each sample.

FIG. 42A is a graph of Samples 1 to 6 each including DBT3P-II as the organic compound, and FIG. 42B is a graph of Comparative Samples 1 to 13 each including NPB as the organic compound.

As can be seen from FIGS. 42A and 42B, many of Samples 1 to 6 have values of A/B at around 1.0, and many of Comparative Samples 1 to 13 have values of A/B at around 1.1 to 1.2. This means that the shape of the ESR spectrum of the composite material including DBT3P-II and molybdenum oxide, which is the composite material of one embodiment of the present invention, at around the positive peak and the negative peak is symmetrical, whereas that of the composite material including NPB and molybdenum oxide is asymmetrical.

It can be considered that in the case where the shape of the ESR spectrum at around the positive peak and the negative peak is symmetrical, unpaired electrons are localized in the composite material, whereas in the case where the shape is asymmetrical, unpaired electrons are delocalized as in a semiconductor.

Here, Table 17 shows that the g-values of Samples 1 to 6 range from 2.005 to 2.006 and the g-values of Comparative Samples 1 to 13 range from 2.001 to 2.003. The g-value is affected by spin orbit interaction of an atom in the vicinity of an unpaired electron and therefore becomes large if there is a heavy atom nearby. This indicates that in Samples 1 to 6, unpaired electrons are greatly affected by sulfur atoms (S) of DBT3P-II, whereas in Comparative Samples 1 to 13, unpaired electrons are affected by nitrogen atoms (N) or carbon atoms (C) of NPB.

<Consideration>

From the intensity and the symmetry of peaks of the ESR spectrum, and the g-value obtained above, consideration will be given as follows.

First, high intensity of the ESR spectrum of the composite material including NPB indicates high likelihood of occurrence of charge transfer interaction. In Comparative Samples 1 to 13, it can be considered that molybdenum oxide takes electrons from NPB, whereby unpaired electrons are generated mainly at nitrogen atoms and the unpaired electrons are delocalized over the nitrogen atoms or adjacent carbon atoms. This is because of a relatively small g-value and an asymmetrical shape of the ESR spectrum at around the positive peak and the negative peak.

Here, on the orbital where the unpaired electrons exist, there is the absence of electrons, i.e., holes are generated, and this means that the holes are also delocalized. Therefore, it can be estimated that it is easy for holes to move through a conjugated system that extends from a nitrogen atom to a benzene ring and even to move between molecules (this is the reason for the excellent hole-transport property of an aromatic amine). That is, holes generated at NPB serve as carriers that directly contribute to conduction.

The above consideration indicates that NPB is likely to have charge transfer interaction through nitrogen atoms and holes generated at NPB due to the charge transfer interaction directly contribute to carrier-transport and/or carrier-injection properties.

On the other hand, low intensity of the ESR spectrum of the composite material including DBT3P-II suggests almost no occurrence of charge transfer interaction. It can be considered that in Samples 1 to 6, molybdenum oxide takes electrons from DBT3P-II, whereby a very small number of unpaired electrons are generated at sulfur atoms, but the unpaired electrons are localized at sulfur atoms. This is because of a relatively large g-value and a symmetrical shape of the ESR spectrum at around the positive peak and the negative peak.

Here, on the orbital where the unpaired electrons exist, there is the absence of electrons, i.e., holes are generated, and this means that the holes are also localized. Therefore, a small number of holes generated at sulfur atoms also remain at the sulfur atoms and are not likely to serve as carriers that contribute to conduction. The above consideration indicates that in DBT3P-II, charge transfer interaction is unlikely to occur, and even if holes are generated at DBT3P-II, they are unlikely to serve as carriers.

However, the composite material including DBT3P-II can inject and/or transport holes by voltage application. This can be explained as follows. That is, it can be considered that in such composite materials as in Samples 1 to 6, by voltage application, molybdenum oxide further takes electrons from DBT3P-II and unpaired electrons are generated (i.e., holes are generated) not at sulfur atoms but at carbon atoms this time. The holes are considered to be delocalized due to π bonds between carbon atoms and move through a conjugated system that extends over a dibenzothiophene ring (or a benzene ring). This indicates that the composite material including DBT3P-II can exhibit excellent carrier-transport and/or carrier-injection properties despite the fact that charge transfer interaction is unlikely to occur. In fact, as described in the above examples, a light-emitting element including the composite material of one embodiment of the present invention exhibits high emission efficiency.

As described above, this example indicates that in the composite material of one embodiment of the present invention, charge transfer interaction is unlikely to occur, and the composite material can suppress the occurrence of light absorption based on the charge transfer interaction. This example also indicates a mechanism by which the composite material of one embodiment of the present invention exhibits excellent carrier-injection and/or carrier-transport properties despite the fact that charge transfer interaction is unlikely to occur.

Reference Example 1

A method of synthesizing 4-[4-(9-phenyl-9H-fluoren-9-yl)phenyl]-6-phenyldibenzothiophene (abbreviation: DBT-FLP-IV) used in the above example will be described. A structure of DBTFLP-IV is illustrated below.

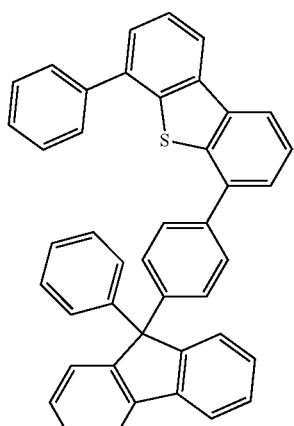

DBTFLP-IV

To a 100 mL three-neck flask were added 1.6 g (4.0 mmol) of 9-(4-bromophenyl)-9-phenyl-9H-fluorene, 1.2 g (4.0 mmol) of 4-phenyl-dibenzothiophene-6-boronic acid, 4.0 mg (20 µmol) of palladium(II) acetate, 12 mg (40 µmol) of tri(ortho-tolyl)phosphine, 30 mL of toluene, 3 mL of ethanol, and 3 mL of a 2 mol/L aqueous potassium carbonate solution. This mixture was degassed while being stirred under reduced pressure, and was then reacted by being heated and stirred under a nitrogen atmosphere at 90° C. for 6 hours.

After the reaction, 150 mL of toluene was added to this reaction mixture solution, and the organic layer was filtered through Florisil (produced by Wako Pure Chemical Industries, Ltd., Catalog No. 540-00135), alumina (produced by Merck & Co., Inc., neutral), and Celite (produced by Wako Pure Chemical Industries, Ltd., Catalog No. 531-16855) in this order to give a filtrate. The obtained residue was purified by silica gel column chromatography (with a developing solvent of toluene and hexane in a 1:3 ratio). The obtained fraction was concentrated, and acetone and methanol were added thereto. The mixture was irradiated with ultrasonic waves and then recrystallized to give 1.6 g of a white powder in a yield of 73%, which was the object of the synthesis. A reaction scheme of the above synthesis method is illustrated in the following (A-1).

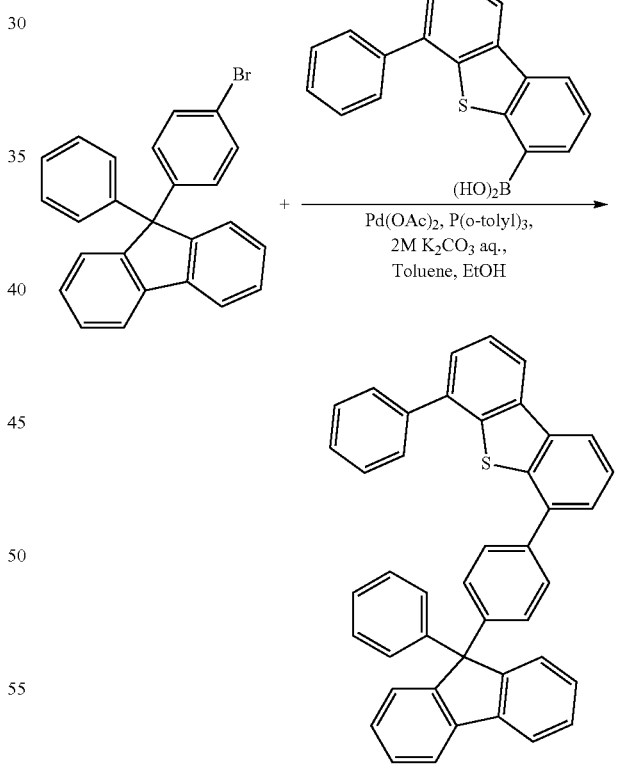

(A-1)

The Rf values of the substance that was the object of the synthesis and 9-(4-bromophenyl)-9-phenyl-9H-fluorene were respectively 0.40 and 0.48, which were found by silica gel thin layer chromatography (TLC) (with a developing solvent of ethyl acetate and hexane in a 1:10 ratio).

This compound was identified as DBTFLP-IV, which was the object of the synthesis, by nuclear magnetic resonance (NMR) spectroscopy.

¹H NMR data of the obtained compound are as follows:
¹H NMR (CDCl₃, 300 MHz): 7.16-7.59 (m, 22H), 7.69-7.71 (m, 2H), 7.79 (d, J=7.5 Hz, 2H), 8.14-8.18 (m, 2H).

Reference Example 2

A method of synthesizing 4,4'-(biphenyl-2,2'-diyl)-bis-dibenzothiophene (abbreviation: oDBTBP-II) used in the above example will be described. A structure of oDBTBP-II is illustrated below.

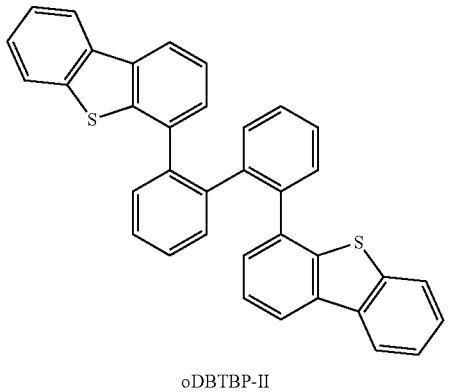 [SMILES: c1ccc(-c2cccc3c2sc2ccccc23)c(-c2ccccc2-c2cccc3c2sc2ccccc23)c1]

oDBTBP-II

To a 100 mL three-neck flask were added 1.6 g (5.0 mmol) of 2,2'-dibromobiphenyl, 3.2 g (11 mmol) of dibenzothiophene-4-boronic acid, 44 mg (0.2 mmol) of palladium(II) acetate, 120 mg (0.4 mmol) of tri(ortho-tolyl)phosphine, 30 mL of toluene, 3 mL of ethanol, and 20 mL of a 2 mol/L aqueous potassium carbonate solution. This mixture was degassed while being stirred under reduced pressure, and was then reacted by being heated and stirred under a nitrogen atmosphere at 90° C. for 10 hours.

After the reaction, 150 mL of toluene was added to this reaction mixture solution, and the organic layer was filtered through Florisil and Celite in this order to give a filtrate. The obtained residue was purified by silica gel column chromatography (with a developing solvent of toluene and hexane in a 1:3 ratio). The obtained fraction was concentrated, and acetone and methanol were added thereto. The mixture was irradiated with ultrasonic waves and then recrystallized to give 1.8 g of a white powder of oDBTBP-II in a yield of 69%, which was the object of the synthesis. A reaction scheme of the above synthesis method is illustrated in the following (B-1).

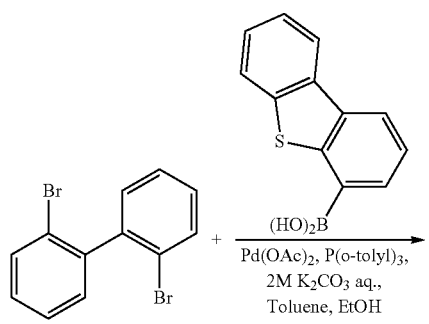

(B-1)

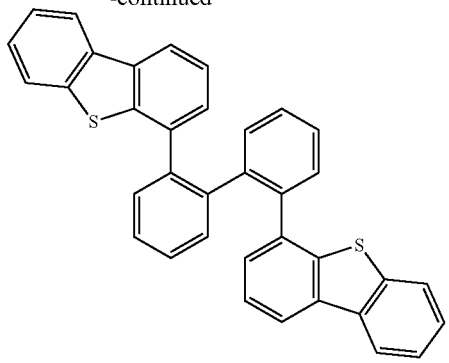

The Rf values of oDBTBP-II and 2,2'-dibromobiphenyl were respectively 0.56 and 0.77, which were found by silica gel thin layer chromatography (TLC) (with a developing solvent of ethyl acetate and hexane in a 1:10 ratio).

Reference Example 3

A method of synthesizing 2,8-diphenyl-4-[4-(9-phenyl-9H-fluoren-9-yl)phenyl]dibenzothiophene (abbreviation: DBTFLP-III) used in the above example will be described. A structure of DBTFLP-III is illustrated below.

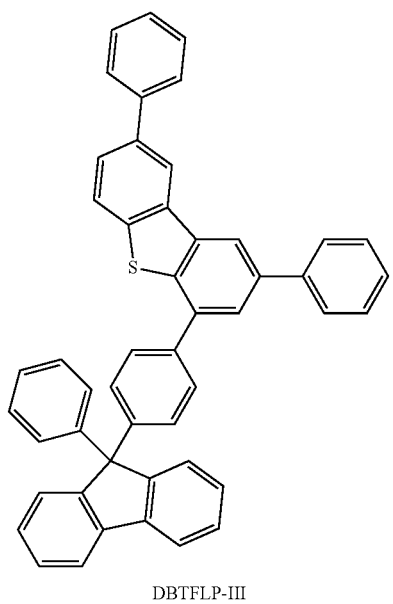 [SMILES: c1ccc(-c2ccc3sc4c(-c5ccc(C6(c7ccccc7)c7ccccc7-c7ccccc76)cc5)cc(-c5ccccc5)cc4c3c2)cc1]

DBTFLP-III

To a 100 mL three-neck flask were added 1.6 g (4.0 mmol) of 9-(4-bromophenyl)-9-phenyl-9H-fluorene, 1.7 g (4.4 mmol) of 2,8-diphenyldibenzothiophene-4-boronic acid, 11 mg (0.1 mmol) of palladium(II) acetate, 30 mg (0.1 mmol) of tri(ortho-tolyl)phosphine, 30 mL of toluene, 3 mL of ethanol, and 5 nit of a 2 mol/L aqueous potassium carbonate solution. This mixture was degassed while being stirred under reduced pressure, and was then reacted by being heated and stirred under a nitrogen atmosphere at 90° C. for 6.5 hours.

After the reaction, 150 mL of toluene was added to this reaction mixture solution, and the organic layer was filtered through Florisil, alumina, and Celite in this order to give a filtrate. The obtained residue was purified by silica gel column chromatography (with a developing solvent of toluene and hexane in a 1:3 ratio). The obtained fraction was concentrated, and acetone and methanol were added thereto. The mixture was irradiated with ultrasonic waves and then recrystallized to give 2.3 g of a white powder in a yield of 90%, which was the object of the synthesis. A reaction scheme of the above synthesis method is illustrated in the following (C-1).

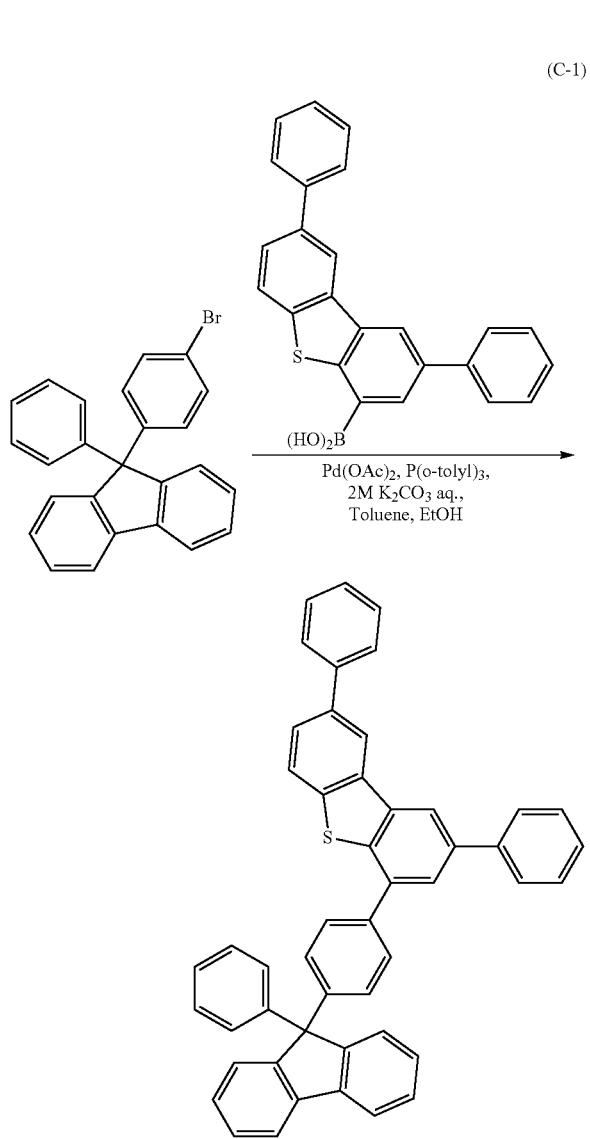

The Rf values of the substance that was the object of the synthesis and 9-(4-bromophenyl)-9-phenyl-9H-fluorene were respectively 0.33 and 0.60, which were found by silica gel thin layer chromatography (TLC) (with a developing solvent of ethyl acetate and hexane in a 1:10 ratio).

This compound was identified as DBTFLP-III, which was the object of the synthesis, by nuclear magnetic resonance (NMR) spectroscopy.

$^1$H NMR data of the obtained compound are as follows:
$^1$H NMR (CDCl$_3$, 300 MHz): 7.23-7.52 (m, 20H), 7.65-7.76 (m, 8H), 7.81 (d, J=6.9 Hz, 1H), 7.88 (d, J=8.1 Hz, 1H), 8.40 (dd, J=11.7 Hz, 1.5 Hz, 2H).

Reference Example 4

A method of synthesizing 3,6-di-(dibenzothiophen-4-yl)-9-phenyl-9H-carbazole (abbreviation: DBT2PC-II) used in the above example will be described. A structure of DBT2PC-II is illustrated below.

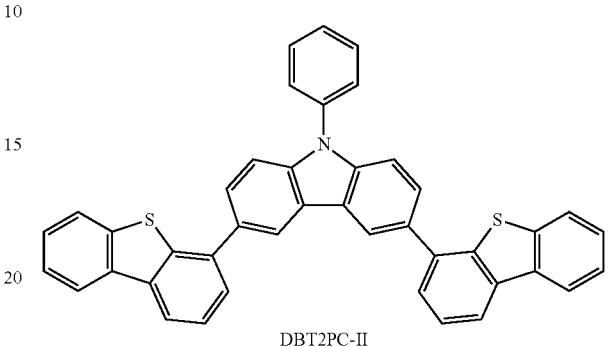

DBT2PC-II

To a 200 mL three-neck flask were added 2.0 g (5.0 mmol) of 3,6-dibromo-9-phenyl-9H-carbazole, 3.2 g (11 mmol) of dibenzothiophene-4-boronic acid, 10 mg (0.1 mmol) of palladium(II) acetate, 30 mg (0.1 mmol) of tri(ortho-tolyl)phosphine, 50 mL of toluene, 5 mL of ethanol, and 7.5 mL of a 2 mol/L aqueous potassium carbonate solution. This mixture was degassed while being stirred under reduced pressure, and reacted by being heated and stirred under a nitrogen atmosphere at 90° C. for 6 hours. After the reaction, this reaction mixture solution was cooled to room temperature, and then filtered to give a residue while being washed with water, ethanol, toluene, and hexane in this order. The obtained residue was purified by silica gel column chromatography (with a developing solvent of toluene and hexane in a 1:3 ratio). The obtained fraction was concentrated, and acetone and ethanol were added thereto. The mixture was irradiated with ultrasonic waves and then recrystallized to give 1.4 g of a white powder in a yield of 47%. A reaction scheme of the above synthesis method is illustrated in the following (D-1).

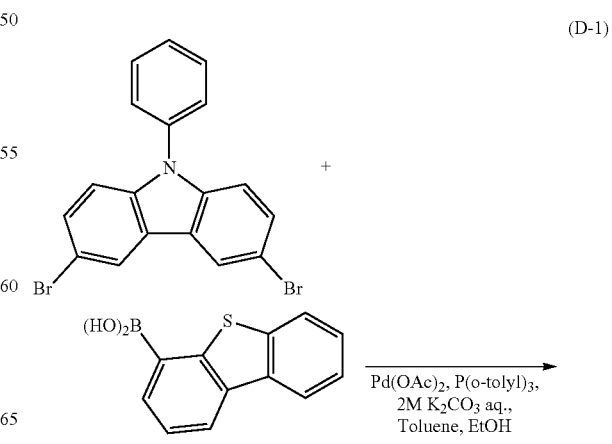

-continued

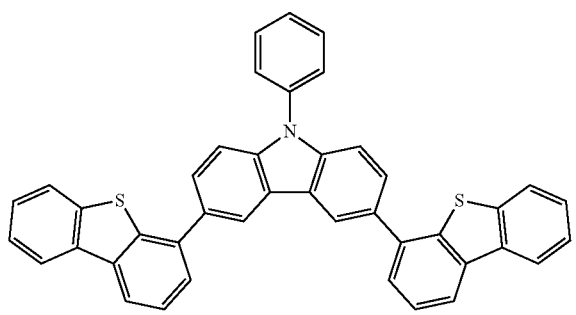

The white powder obtained was subjected to nuclear magnetic resonance (NMR) spectroscopy. The measurement data are as follows: $^1$H NMR (CDCl$_3$, 300 MHz): δ (ppm)=7.44-7.70 (m, 15H), 7.82-7.86 (m, 4H), 8.15-8.22 (m, 4H), 8.57 (d, J=1.5 Hz, 2H).

Reference Example 5

A method of synthesizing 4-[3-(9,10-diphenyl-2-anthryl)phenyl]dibenzothiophene (abbreviation: 2mDBTPPA-II) used in the above example will be described. A structure of 2mDBTPPA-II is illustrated below.

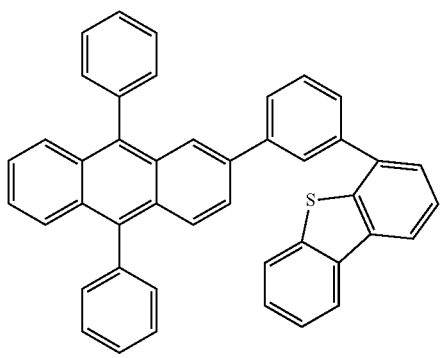

2mDBTPPA-II

The method of synthesizing 2mDBTPPA-II is represented by Synthesis Scheme (E-1), and detailed reaction in the synthesis will be detailed below.

(E-1)

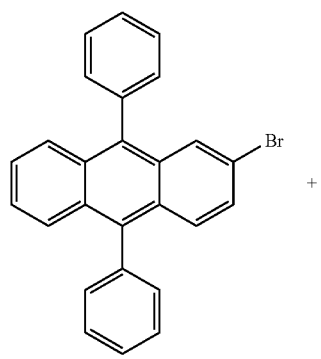

-continued

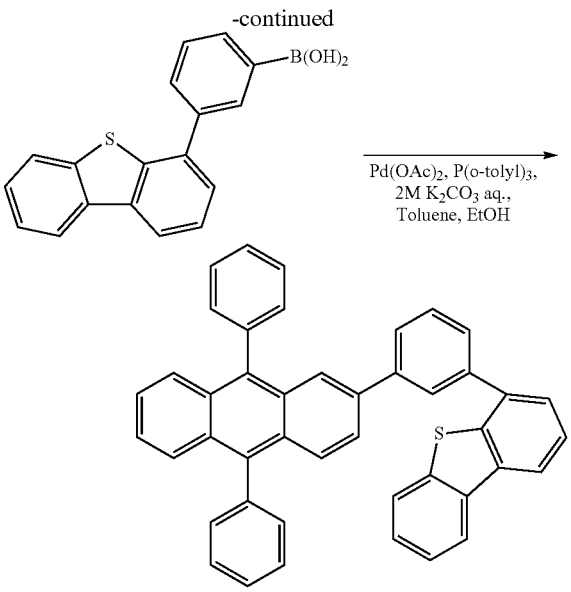

In a 100 mL three-neck flask were put 1.6 g (4.0 mmol) of 2-bromo-9,10-diphenylanthracene, 1.2 g (4.0 mmol) of 3-(dibenzothiophen-4-yl)phenylboronic acid, and 0.30 g (1.0 mmol) of tri(ortho-tolyl)phosphine. The air in the flask was replaced with nitrogen. To this mixture were added 25 mL of toluene, 5.0 mL of ethanol, and 5.0 mL of a 2.0 mol/L aqueous potassium carbonate solution. While the pressure was reduced, this mixture was degassed by being stirred.

Then, 45 mg (0.20 mmol) of palladium(II) acetate was added to this mixture, and the mixture was stirred under a nitrogen stream at 80° C. for 5 hours. Then, the aqueous layer of this mixture was extracted with toluene, and the solution of the extract and the organic layer were combined and washed with a saturated aqueous sodium chloride solution. The organic layer was dried with magnesium sulfate. Then, this mixture was gravity filtered. The obtained filtrate was concentrated to give an oily substance. The obtained oily substance was purified by silica gel column chromatography. The chromatography was carried out using a mixed solvent of hexane and toluene in a 5:1 ratio as a developing solvent. The obtained solid was recrystallized with a mixed solvent of toluene and hexane to give 1.6 g of a yellow powder in a yield of 70%, which was the object of synthesis.

By a train sublimation method, 1.6 g of the obtained yellow powder solid was purified. In the sublimation purification, the yellow powder solid was heated at 290° C. under a pressure of 3.0 Pa with a flow rate of argon at 4.0 mL/min. After the sublimation purification, 1.4 g of a yellow solid, which was the object of the synthesis, was obtained in a yield of 87%.

This compound was identified as 4-[3-(9,10-diphenyl-2-anthryl)phenyl]dibenzothiophene (abbreviation: 2mDBT-PPA-II), which was the object of the synthesis, by nuclear magnetic resonance (NMR) spectroscopy.

$^1$H NMR data of the obtained substance are as follows: $^1$H NMR (CDCl$_3$, 300 MHz): δ=7.33 (q, J1=3.3 Hz, 2H), 7.46-7.73 (m, 20H), 7.80-7.87 (m, 2H), 7.99 (st, J1=1.8 Hz, 1H), 8.03 (sd, J1=1.5 Hz, 1H), 8.14-8.20 (m, 2H).

Reference Example 6

A method of synthesizing 4-[3-(9,10-diphenyl-2-anthryl)phenyl]dibenzofuran (abbreviation: 2mDBFPPA-II) used in the above example will be described. A structure of 2mDBFPPA-II is illustrated below.

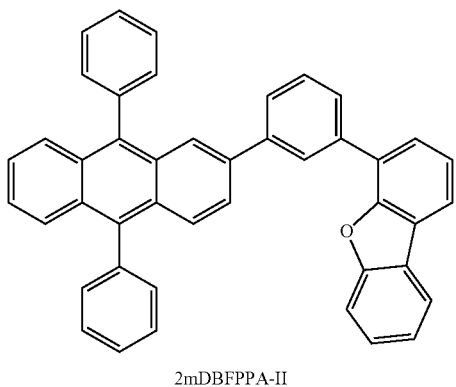 [SMILES: c1ccc(-c2c3ccccc3c(-c3ccccc3)c3cc(-c4cccc(-c5cccc6c5oc5ccccc56)c4)ccc23)cc1]

2mDBFPPA-II

The method of synthesizing 2mDBFPPA-II is represented by Synthesis Scheme (F-1), and detailed reaction in the synthesis will be detailed below.

(F-1)

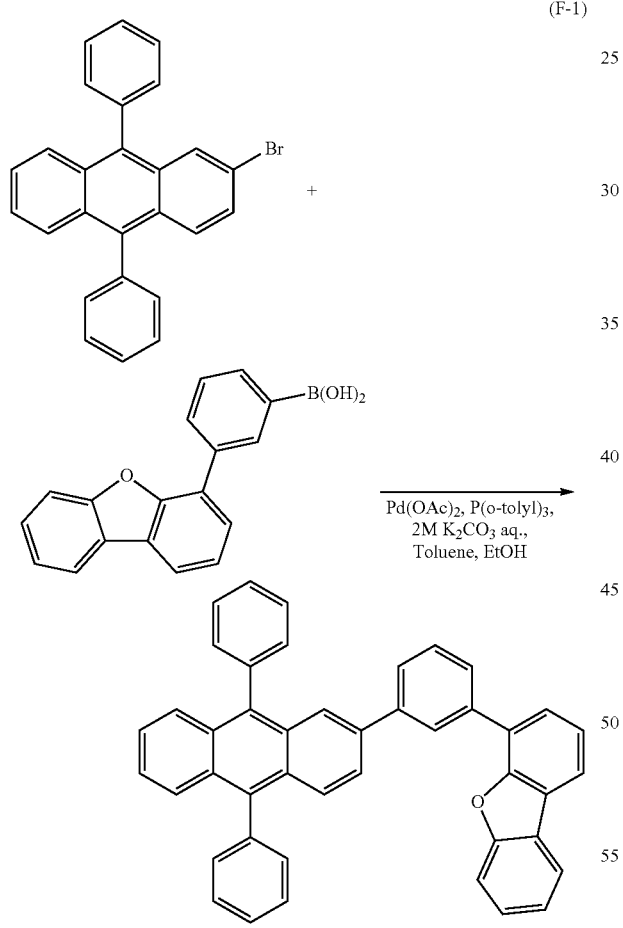

In a 100 mL three-neck flask were put 1.2 g (3.0 mmol) of 2-bromo-9,10-diphenylanthracene, 0.87 g (3.0 mmol) of 3-(dibenzofuran-4-yl)phenylboronic acid, and 0.23 g (0.75 mmol) of tri(ortho-tolyl)phosphine. The air in the flask was replaced with nitrogen. To this mixture were added 15 mL of toluene, 5.0 mL of ethanol, and 3.0 mL of a 2.0 mol/L aqueous potassium carbonate solution. While the pressure was reduced, this mixture was degassed by being stirred. Then, 34 mg (0.15 mmol) of palladium(II) acetate was added to this mixture, and the mixture was stirred under a nitrogen stream at 80° C. for 4 hours. Then, the aqueous layer of this mixture was extracted with ethyl acetate, and the solution of the extract and the organic layer were combined and washed with a saturated aqueous sodium chloride solution. The organic layer was dried with magnesium sulfate. Then, this mixture was gravity filtered. The obtained filtrate was concentrated, and the obtained solid was purified by silica gel column chromatography. The chromatography was carried out using a mixed solvent of hexane and toluene in a 5:1 ratio as a developing solvent. The obtained solid was recrystallized with a mixed solvent of toluene and hexane to give 1.4 g of a yellow powder in a yield of 79%, which was the object of synthesis.

By a train sublimation method, 1.4 g of the obtained yellow powder solid was purified. In the sublimation purification, the yellow powder solid was heated at 270° C. under a pressure of 3.0 Pa with a flow rate of argon at 4.0 mL/min. After the sublimation purification, 1.1 g of a yellow solid, which was the object of the synthesis, was obtained in a yield of 81%.

This compound was identified as 4-[3-(9,10-diphenyl-2-anthryl)phenyl]dibenzofuran (abbreviation: 2mDBFPPA-II), which was the object of the synthesis, by nuclear magnetic resonance (NMR) spectroscopy.

$^1$H NMR data of the obtained substance are as follows: $^1$H NMR (CDCl$_3$, 300 MHz): δ=7.31-7.67 (m, 19H), 7.69-7.73 (m, 3H), 7.80-7.86 (m, 2H), 7.95 (dd, J1=0.90 Hz, J2=1.8 Hz, 1H), 7.98-8.01 (m, 2H), 8.07 (s, 1H).

Reference Example 7

A method of synthesizing 4-phenyl-4'-(9-phenylfluoren-9-yl)triphenylamine (abbreviation: BPAFLP) used in the above example will be specifically described. A structure of BPAFLP is illustrated below.

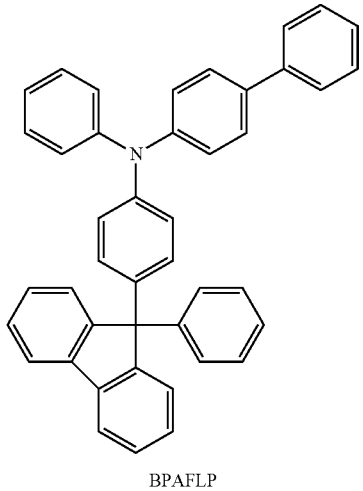 [SMILES: c1ccc(-c2ccc(N(c3ccccc3)c3ccc(C4(c5ccccc5)c5ccccc5-c5ccccc54)cc3)cc2)cc1]

BPAFLP

Step 1: Method of Synthesizing 9-(4-Bromophenyl)-9-phenylfluorene

In a 100 mL three-neck flask, 1.2 g (50 mmol) of magnesium was activated by being heated and stirred for 30 minutes under reduced pressure. The activated magnesium was cooled to room temperature, and the flask was made to contain a nitrogen atmosphere. Then, several drops of dibromoethane were added, so that foam formation and heat generation were confirmed. After 12 g (50 mmol) of 2-bromobiphenyl dissolved in 10 mL of diethyl ether was slowly added dropwise to this mixture, the mixture was heated and stirred under reflux for 2.5 hours, so that a Grignard reagent was prepared.

In a 500 mL three-neck flask were placed 10 g (40 mmol) of 4-bromobenzophenone and 100 mL of diethyl ether. After the Grignard reagent which was synthesized in advance was slowly added dropwise to this mixture, the mixture was heated and stirred under reflux for 9 hours.

After reaction, this mixture solution was filtered to give a residue. The obtained residue was dissolved in 150 mL of ethyl acetate, and 1N-hydrochloric acid was added to the mixture until it was made acid, which was then stirred for 2 hours. The organic layer of this liquid was washed with water, and magnesium sulfate was added thereto to remove moisture. This suspension was filtered, and the obtained filtrate was concentrated to give a highly viscous substance.

In a 500 mL recovery flask were placed this highly viscous substance, 50 mL of glacial acetic acid, and 1.0 mL of hydrochloric acid. The mixture was reacted by being stirred and heated at 130° C. for 1.5 hours under a nitrogen atmosphere.

After the reaction, this reaction mixture solution was filtered to give a residue. The obtained residue was washed with water, an aqueous sodium hydroxide solution, water, and methanol in this order. Then, the mixture was dried, so that the substance which was the object of the synthesis was obtained as 11 g of a white powder in a yield of 69%. A reaction scheme of the above synthesis method is illustrated in the following (G-1).

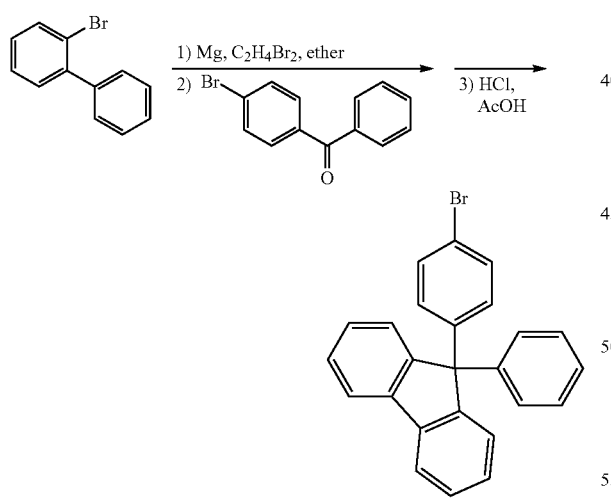

(G-1)

Step 2: Method of Synthesizing 4-Phenyl-4'-(9-phenylfluoren-9-yl)triphenylamine (abbreviation: BPAFLP)

In a 100 mL three-neck flask were placed 3.2 g (8.0 mmol) of 9-(4-bromophenyl)-9-phenylfluorene, 2.0 g (8.0 mmol) of 4-phenyl-diphenylamine, 1.0 g (10 mmol) of sodium tert-butoxide, and 23 mg (0.04 mmol) of bis(dibenzylideneacetone)palladium(0), and the air in the flask was replaced with nitrogen. Then, 20 mL of dehydrated xylene was added to this mixture. After the mixture was degassed while being stirred under reduced pressure, 0.2 mL (0.1 mmol) of tri(tert-butyl)phosphine (a 10 wt % hexane solution) was added to the mixture. This mixture was reacted by being stirred and heated at 110° C. for 2 hours under a nitrogen atmosphere.

After the reaction, 200 mL of toluene was added to this reaction mixture solution, and this suspension was filtered through Florisil and Celite. The obtained filtrate was concentrated, and the resulting substance was purified by silica gel column chromatography (with a developing solvent of toluene and hexane in a 1:4 ratio). The obtained fraction was concentrated, and acetone and methanol were added thereto. The mixture was irradiated with ultrasonic waves and then recrystallized, so that the substance which was the object of the synthesis was obtained as 4.1 g of a white powder in a yield of 92%. A reaction scheme of the above synthesis method is illustrated in the following (G-2).

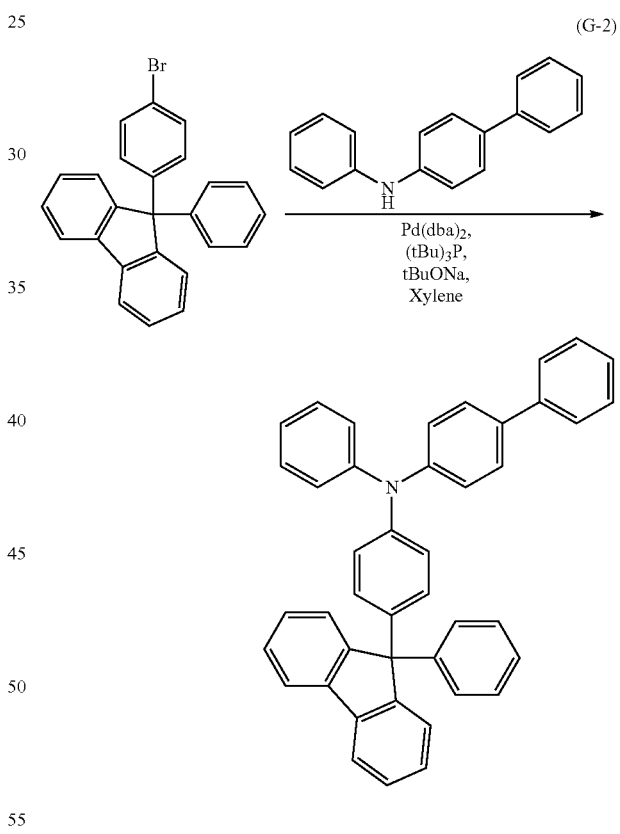

(G-2)

The Rf values of the substance that was the object of the synthesis, 9-(4-bromophenyl)-9-phenylfluorene, and 4-phenyl-diphenylamine were respectively 0.41, 0.51, and 0.27, which were found by silica gel thin layer chromatography (TLC) (with a developing solvent of ethyl acetate and hexane in a 1:10 ratio).

The compound obtained in Step 2 as described above was subjected to nuclear magnetic resonance (NMR) spectroscopy. The measurement data are shown below. The measurement results indicate that the obtained compound was BPAFLP (abbreviation), which is a fluorene derivative.

¹H NMR (CDCl₃, 300 MHz): δ (ppm)=6.63-7.02 (m, 3H), 7.06-7.11 (m, 6H), 7.19-7.45 (m, 18H), 7.53-7.55 (m, 2H), 7.75 (d, J=6.9 Hz, 2H).

Reference Example 8

A method of synthesizing N,N'-bis[4-(9-phenyl-9H-fluoren-9-yl)phenyl]-N,N'-diphenylpyrene-1,6-diamine (abbreviation: 1,6FLPAPrn) used in the above example will be specifically described. A structure of 1,6FLPAPrn is illustrated below.

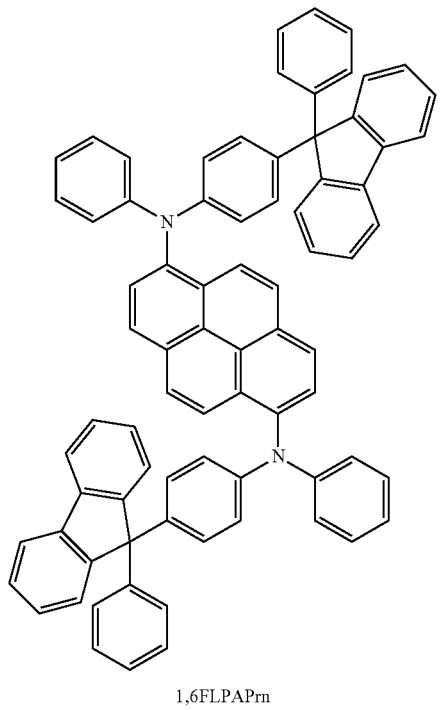 [SMILES: c1ccc(N(c2ccc(C3(c4ccccc4)c4ccccc4-c4ccccc43)cc2)c2ccc3ccc4c(N(c5ccccc5)c5ccc(C6(c7ccccc7)c7ccccc7-c7ccccc76)cc5)ccc5ccc2c3c54)cc1]

1,6FLPAPrn

In a 300 mL three-neck flask were put 3.0 g (8.3 mmol) of 1,6-dibromopyrene and 6.8 g (17 mmol) of 4-(9-phenyl-9H-fluoren-9-yl)diphenylamine (abbreviation: FLPA). The air in the flask was replaced with nitrogen. To this mixture were added 100 mL of toluene, 0.10 mL of a 10 wt % hexane solution of tri(tert-butyl)phosphine, and 2.4 g (25 mmol) of sodium tert-butoxide. This mixture was degassed while being stirred under reduced pressure. This mixture was heated at 80° C., and after the confirmation that the material was dissolved, 48 mg (0.083 mmol) of bis(dibenzylideneacetone)palladium(0) was added. This mixture was stirred at 80° C. for 1.5 hours. After the stirring, the precipitated yellow solid was collected through suction filtration without cooling the mixture. The obtained solid was suspended in 3 L of toluene and heated at 110° C. This suspension was suction filtered through alumina, Celite, and Florisil while the temperature of the suspension was kept at 110° C. Further, the suspension was processed with 200 mL of toluene which had been heated to 110° C. The resulting filtrate was concentrated to about 300 mL, which was then recrystallized. Accordingly, 5.7 g of the substance which was the object of the synthesis was obtained in a yield of 67%.

By a train sublimation method, 3.56 g of the obtained yellow solid was purified. Under a pressure of 5.0 Pa with a flow rate of argon at 5.0 mL/min, the sublimation purification was carried out at 353° C. After the sublimation purification, 2.54 g of a yellow solid, which was the object of the synthesis, was obtained in a yield of 71%. A reaction scheme of the above synthesis method is illustrated in the following (H-1).

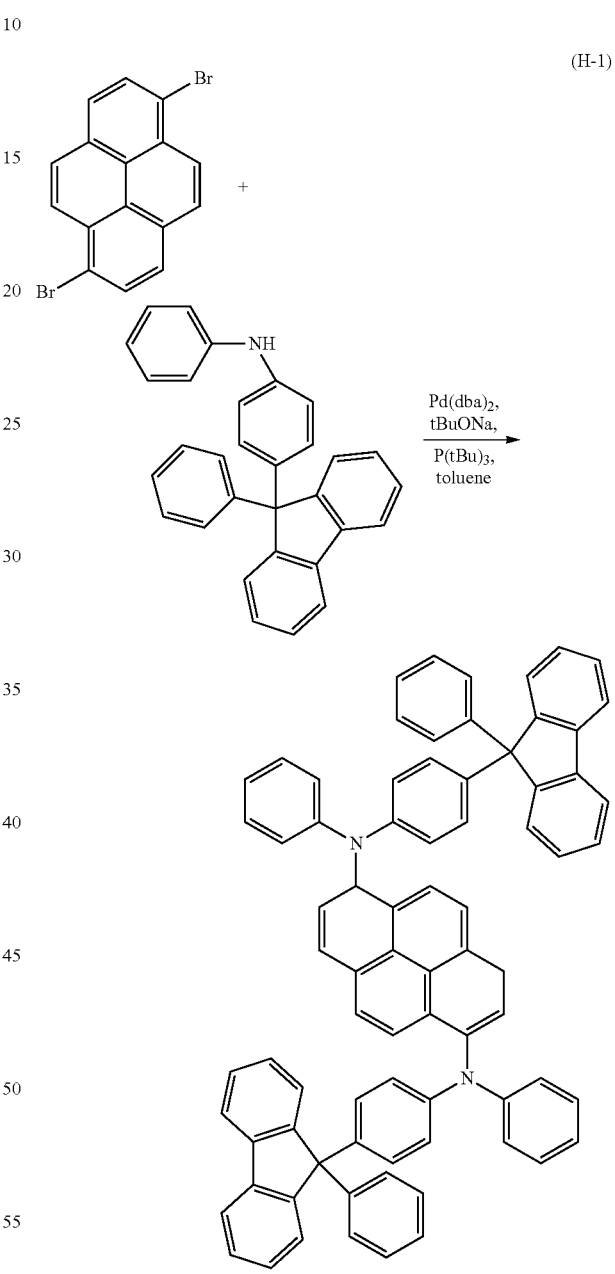

The compound obtained in the synthesis example was identified as N,N'-bis[4-(9-phenyl-9H-fluoren-9-yl)phenyl]-N,N-diphenylpyrene-1,6-diamine (abbreviation: 1,6FLPA-Prn), which was the object of the synthesis, by nuclear magnetic resonance (NMR) spectroscopy and mass spectrometry.

¹H NMR data of the compound obtained in the above synthesis example are as follows: ¹H NMR (CDCl₃, 300

MHz): δ=6.88-6.91 (m, 6H), 7.00-7.03 (m, 8H), 7.13-7.40 (m, 26H), 7.73-7.80 (m, 6H), 7.87 (d, J=9.0 Hz, 2H), 8.06-8.09 (m, 4H).

Reference Example 9

A method of synthesizing 3-[4-(9-phenanthryl)-phenyl]-9-phenyl-9H-carbazole (abbreviation: PCPPn) will be specifically described. A structure of PCPPn is illustrated below.

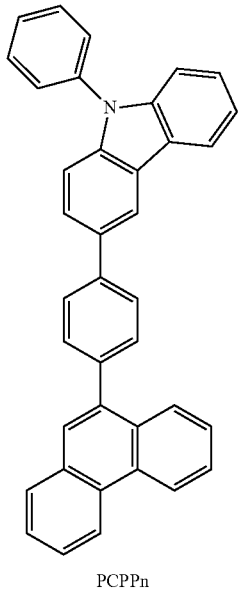 [SMILES: c1ccc(-n2c3ccccc3c3cc(-c4ccc(-c5cc6ccccc6c6ccccc56)cc4)ccc32)cc1]

PCPPn

Step 1: Method of Synthesizing 4-(9-Phenyl-9H-carbazol-3-yl)phenylboronic acid

In a 300 mL three-neck flask, 8.0 g (20 mmol) of 3-(4-bromophenyl)-9-phenyl-9H-carbazole was placed, the atmosphere in the flask was replaced with nitrogen, 100 mL of dehydrated tetrahydrofuran (abbreviation: THF) was added, and the temperature was lowered to −78° C. Into this mixture solution, 15 mL (24 mmol) of a 1.65 mol/L n-butyllithium hexane solution was dropped, and the mixture solution with the n-butyllithium hexane solution added was stirred for 2 hours. To this mixture, 3.4 mL (30 mmol) of trimethyl borate was added, and the mixture was stirred at −78° C. for 2 hours and at room temperature for 18 hours. After the reaction, a 1M diluted hydrochloric acid was added to this reaction solution until the solution became acid, and the solution with the diluted hydrochloric acid added was stirred for 7 hours. This solution was subjected to extraction with ethyl acetate, and the obtained organic layer was washed with a saturated aqueous sodium chloride solution. After the washing, magnesium sulfate was added to the organic layer to adsorb moisture. This suspension was filtrated, and the obtained filtrate was concentrated, and hexane was added thereto. The mixture was irradiated with supersonic waves and then recrystallized to give 6.4 g of a white powder in a yield of 88%, which was the object of synthesis. A reaction scheme of Step 1 described above is illustrated in the following (I-1).

(I-1)

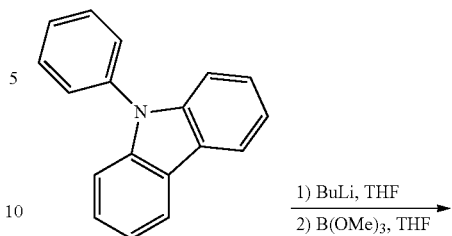

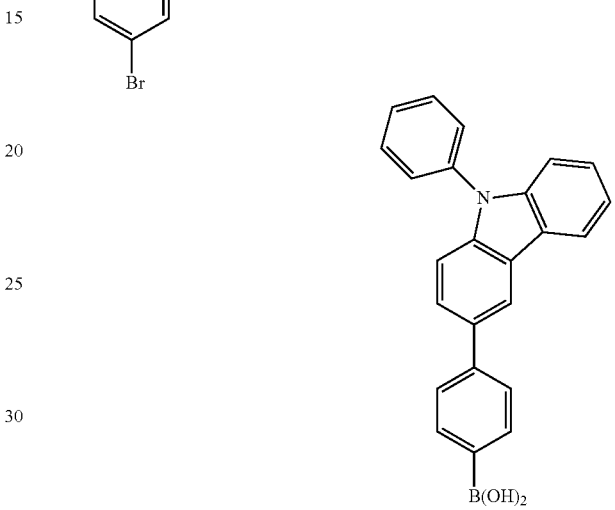

The Rf values of the substance that was the object of synthesis and 3-(4-bromophenyl)-9-phenyl-9H-carbazole were respectively 0 (origin) and 0.53, which were found by silica gel thin layer chromatography (TLC) (with a developing solvent of ethyl acetate and hexane in a 1:10 ratio). In addition, the Rf values of the object of the synthesis and 3-(4-bromophenyl)-9-phenyl-9H-carbazole were respectively 0.72 and 0.93, which were found by silica gel thin layer chromatography (TLC) using ethyl acetate as a developing solvent.

Step 2: Method of Synthesizing 3-[4-(9-Phenanthryl)-phenyl]-9-phenyl-9H-carbazole (abbreviation: PCPPn)

In a 200 mL three-neck flask, a mixture of 1.5 g (5.0 mmol) of 9-phenyl-9H-carbazol-3-yl-phenyl-4-boronic acid, 3.2 g (11 mmol) of 9-bromophenanthrene, 11 mg (0.1 mmol) of palladium(II) acetate, 30 mg (0.1 mmol) of tri(ortho-tolyl)phosphine, 30 mL of toluene, 3 mL of ethanol, and 5 mL of a 2 mol/L aqueous potassium carbonate solution was degassed while being stirred under reduced pressure, and reacted by being stirred and heated at 90° C. for 6 hours tinder a nitrogen atmosphere.

After the reaction, 200 mL of toluene was added to this reaction mixture solution, and the organic layer of the mixture solution was filtered through Florisil, alumina, and Celite. The obtained filtrate was washed with water, and magnesium sulfate was added thereto so that moisture was adsorbed. This suspension was filtered to obtain a filtrate. The obtained filtrate was concentrated and purified by silica gel column chromatography. At this time, a mixed solvent of toluene and hexane (toluene:hexane=1:4) was used as a developing solvent for the chromatography. The obtained fraction was concentrated, and acetone and methanol were added thereto. The mixture was irradiated with ultrasonic waves and then recrystallized, so that the substance which was the object of the synthesis was obtained as 2.2 g of a white powder in a yield of 75%. A reaction scheme of Step 2 is illustrated in the following (I-2).

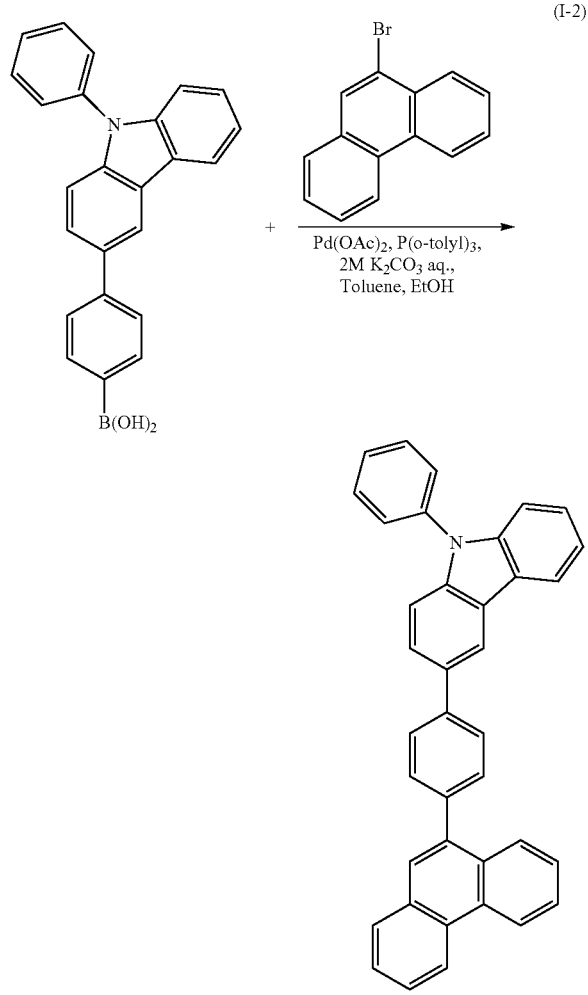 [SMILES: OB(O)c1ccc(-c2ccc3c(c2)c2ccccc2n3-c2ccccc2)cc1 ; Brc1cc2ccccc2c2ccccc12 ; c1ccc(-n2c3ccccc3c3cc(-c4ccc(-c5cc6ccccc6c6ccccc56)cc4)ccc32)cc1]

(I-2)

The Rf values of the substance that was the object of the synthesis and 9-bromophenanthrene were respectively 0.33 and 0.70, which were found by silica gel thin layer chromatography (TLC) (with a developing solvent of ethyl acetate and hexane in a 1:10 ratio).

The obtained compound was subjected to nuclear magnetic resonance (NMR) spectroscopy. The measurement data are as follows: $^1$H NMR (CDCl$_3$, 300 MHz): δ(ppm) =7.30-7.35 (m, 11H), 7.43-7.78 (m, 16H), 7.86-7.93 (m, 3H), 8.01 (dd, J=0.9 Hz, 7.8 Hz, 1H), 8.23 (d, J=7.8 Hz, 1H), 8.47 (d, J=1.5 Hz, 1H), 8.74 (d, J=8.1 Hz, 1H), 8.80 (d, J=7.8 Hz, 1H).

Reference Example 10

A method of synthesizing 3-[4-(dibenzothiophen-4-yl)-phenyl]-9-phenyl-9H-carbazole (abbreviation: DBTPPC-II) will be specifically described. A structure of DBTPPC-II is illustrated below.

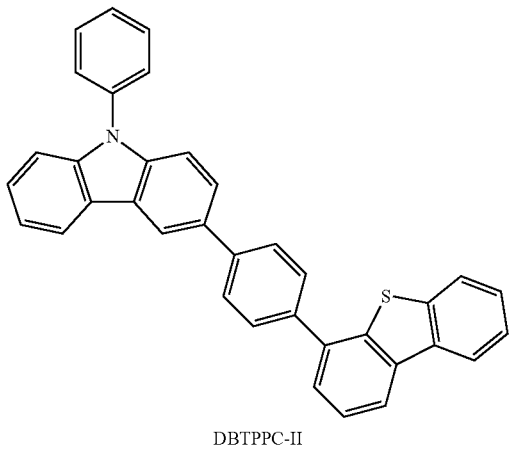 [SMILES: c1ccc(-n2c3ccccc3c3cc(-c4ccc(-c5cccc6c5sc5ccccc56)cc4)ccc32)cc1 ; "DBTPPC-II"]

DBTPPC-II

In a 100 mL three-neck flask, a mixture of 2.4 g (6.0 mmol) of 3-(4-bromophenyl)-9-phenyl-9H-carbazole, 1.7 g (6.0 mmol) of dienzothiophene-4-boronic acid, 13 mg (0.1 mmol) of palladium(II) acetate, 36 mg (0.1 mmol) of tri(ortho-tolyl)phosphine, 20 mL of toluene, 3 mL of ethanol, and 5 mL of a 2 mol/L aqueous potassium carbonate solution was degassed while being stirred under reduced pressure, and reacted by being stirred and heated at 90° C. for 4 hours under a nitrogen atmosphere.

After the reaction, 200 mL of toluene was added to this reaction mixture solution, and the organic layer of the mixture solution was filtered through Florisil (produced by Wako Pure Chemical Industries, Ltd., Catalog No. 540-00135), alumina (produced by Merck & Co., Inc., neutral), and Celite (produced by Wako Pure Chemical Industries, Ltd., Catalog No. 531-16855). The obtained filtrate was washed with water, and magnesium sulfate was then added thereto so that moisture was adsorbed. This suspension was filtered to obtain a filtrate. The obtained filtrate was concentrated and purified by silica gel column chromatography. A mixed solvent of toluene and hexane (toluene:hexane=1:4) was used as a developing solvent for the chromatography. The obtained fraction was concentrated, and acetone and methanol were added thereto. The mixture was irradiated with ultrasonic waves and then recrystallized, so that 2.3 g of a white powder was obtained in a yield of 77%. A reaction scheme of the above synthesis method is illustrated in the following (J-1).

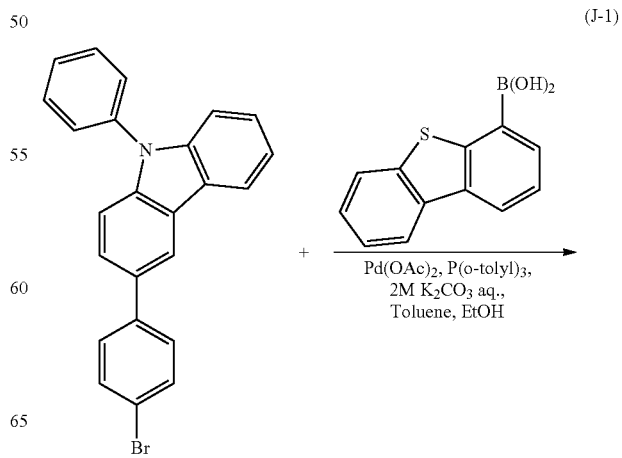

(J-1)

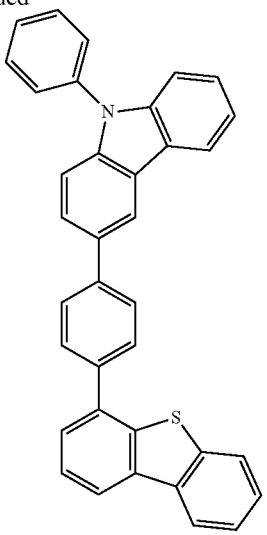

The Rf values of the white powder obtained by the above reaction and 3-(4-bromophenyl)-9-phenyl-9H-carbazole were respectively 0.40 and 0.60, which were found by silica gel thin layer chromatography (TLC) (with a developing solvent of ethyl acetate and hexane in a 1:10 ratio).

The white powder obtained by the above reaction was subjected to nuclear magnetic resonance (NMR) spectroscopy. The measurement data are shown below. From the measurement data, the white powder obtained by the above reaction was identified as DBTPPC-II which was the object of the synthesis.

$^1$H NMR (CDCl$_3$, 300 MHz): δ (ppm)=7.30-7.36 (m, 1H), 7.44-7.52 (m, 6H), 7.55-7.67 (m, 6H), 7.75 (dd, J=8.7 Hz, 1.5 Hz, 1H), 7.85-7.88 (m, 5H), 8.16-8.24 (m, 3H), 8.46 (d, J=1.5 Hz, 1H)

Reference Example 11

A method of synthesizing 3-[3-(dibenzothiophen-4-yl)-phenyl]-9-phenyl-9H-carbazole (abbreviation: mDBTPPC-II) used in the above example will be specifically described. A structure of mDBTPPC-II is illustrated below.

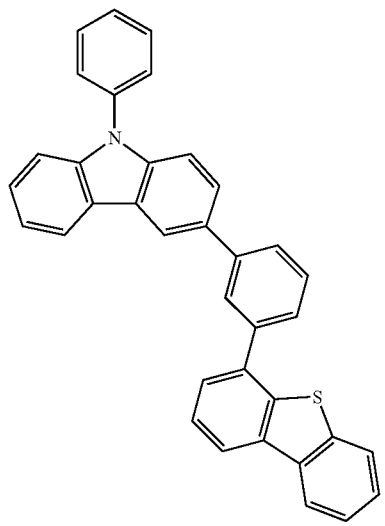

mDBTPPC-II

In a 100 mL three-neck flask, a mixture of 2.4 g (6.0 mmol) of 3-(3-bromophenyl)-9-phenyl-9H-carbazole, 1.7 g (6.0 mmol) of dienzothiophene-4-boronic acid, 13 mg (0.1 mmol) of palladium(II) acetate, 36 mg (0.1 mmol) of tri(ortho-tolyl)phosphine, 20 mL of toluene, 3 mL of ethanol, and 5 mL of a 2 mol/L aqueous potassium carbonate solution was degassed while being stirred under reduced pressure, and reacted by being stirred and heated at 90° C. for 6 hours under a nitrogen atmosphere.

After the reaction, 200 mL of toluene was added to this reaction mixture solution, and the organic layer of the mixture solution was filtered through Florisil (produced by Wako Pure Chemical Industries, Ltd., Catalog No. 540-00135), alumina (produced by Merck & Co., Inc., neutral), and Celite (produced by Wako Pure Chemical Industries, Ltd., Catalog No. 531-16855). The obtained filtrate was washed with water, and magnesium sulfate was then added thereto so that moisture was adsorbed. This suspension was filtered to obtain a filtrate. The obtained filtrate was concentrated and purified by silica gel column chromatography. A mixed solvent of toluene and hexane (toluene:hexane=1:4) was used as a developing solvent for the chromatography. The obtained fraction was concentrated, and acetone and hexane were added thereto. The mixture was irradiated with ultrasonic waves and then recrystallized, so that 2.6 g of a white powder was obtained in a yield 87%. A reaction scheme of the above synthesis method is illustrated in the following (K-1).

(K-1)

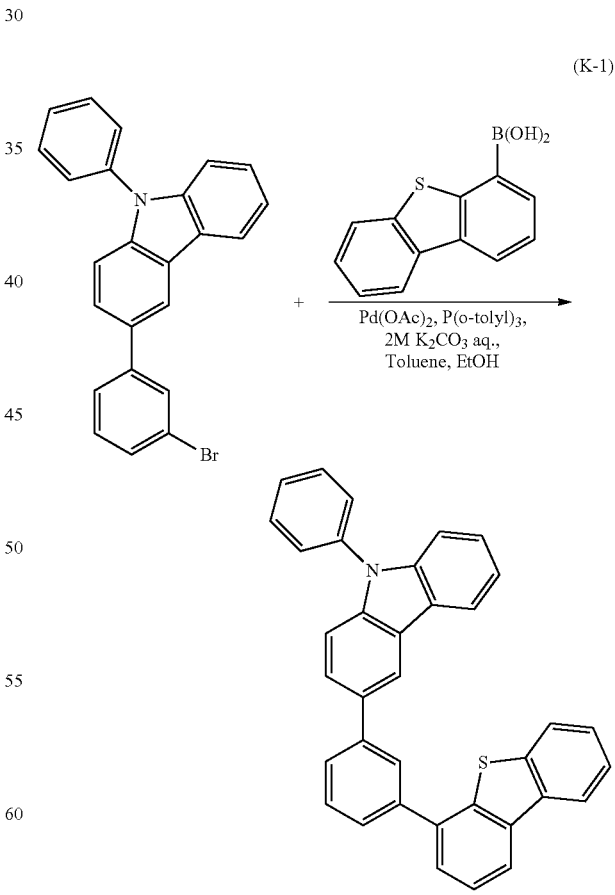

The Rf values of the white powder obtained by the above reaction and 3-(3-bromophenyl)-9-phenyl-9H-carbazole were respectively 0.38 and 0.54, which were found by silica gel thin layer chromatography (TLC) (with a developing solvent of ethyl acetate and hexane in a 1:10 ratio).

The white powder obtained by the above reaction was subjected to nuclear magnetic resonance (NMR) spectroscopy. The measurement data are shown below. From the measurement data, the white powder obtained by the above reaction was identified as mDBTPPC-II which was the object of the synthesis.

$^{1}$H NMR (CDCl$_3$, 300 MHz): δ (ppm)=7.27-7.33 (m, 1H), 7.41-7.51 (m, 6H), 7.58-7.65 (m, 7H), 7.70-7.86 (m, 4H), 8.12 (t, J=1.5 Hz, 1H), 8.17-8.22 (m, 3H), 8.44 (d, J=1.8 Hz, 1H).

Reference Example 12

A method of synthesizing 4-[4-(9-phenanthryl)phenyl]dibenzothiophene (abbreviation: DBTPPn-II) will be specifically described. A structure of DBTPPn-II is illustrated below.

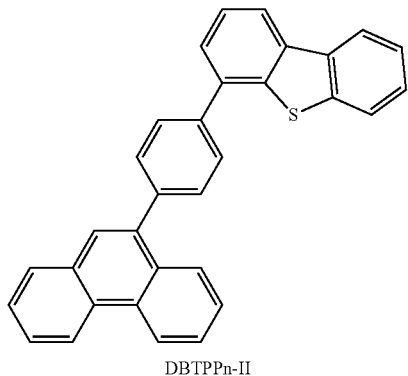 [SMILES: c1ccc2c(c1)cc(-c1ccc(-c3cccc4c3sc3ccccc34)cc1)c1ccccc12]

DBTPPn-II

In a 50 mL three-neck flask were put 1.2 g (3.6 mmol) of 9-(4-bromophenyl)phenanthrene, 0.8 g (3.5 mmol) of dibenzothiophene-4-boronic acid, and 53 mg (0.2 mmol) of tri(ortho-tolyl)phosphine. The air in the flask was replaced with nitrogen. To this mixture were added 3.5 mL of a 2.0 M aqueous potassium carbonate solution, 13 mL of toluene, and 4.0 mL of ethanol. The mixture was degassed by being stirred under reduced pressure. Then, 8.0 mg (36 mmol) of palladium(II) acetate was added to this mixture, and the mixture was stirred under a nitrogen stream at 80° C. for 7 hours. After a predetermined time elapsed, an organic substance was extracted from the aqueous layer of the obtained mixture with toluene.

The solution of the extract and the organic layer were combined and washed with a saturated aqueous sodium chloride solution, and dried with magnesium sulfate. This mixture was separated by gravity filtration, and the filtrate was concentrated to give an oily substance. This oily substance was purified by silica gel column chromatography. The column chromatography was conducted using a developing solvent of hexane and toluene in a 20:1 ratio. The obtained fraction was concentrated to give an oily substance. This oily substance was recrystallized with a mixed solvent of toluene and hexane, so that the substance which was the object of the synthesis was obtained as 0.8 g of a white powder in a yield of 53%.

By a train sublimation method, 0.8 g of the obtained white powder was purified. In the sublimation purification, the white powder was heated at 240° C. under a pressure of 2.4 Pa with a flow rate of argon at 5 mL/min. After the sublimation purification, 0.7 g of a white powder was obtained in a yield of 88%. The above-described synthesis scheme is illustrated in the following (L-1).

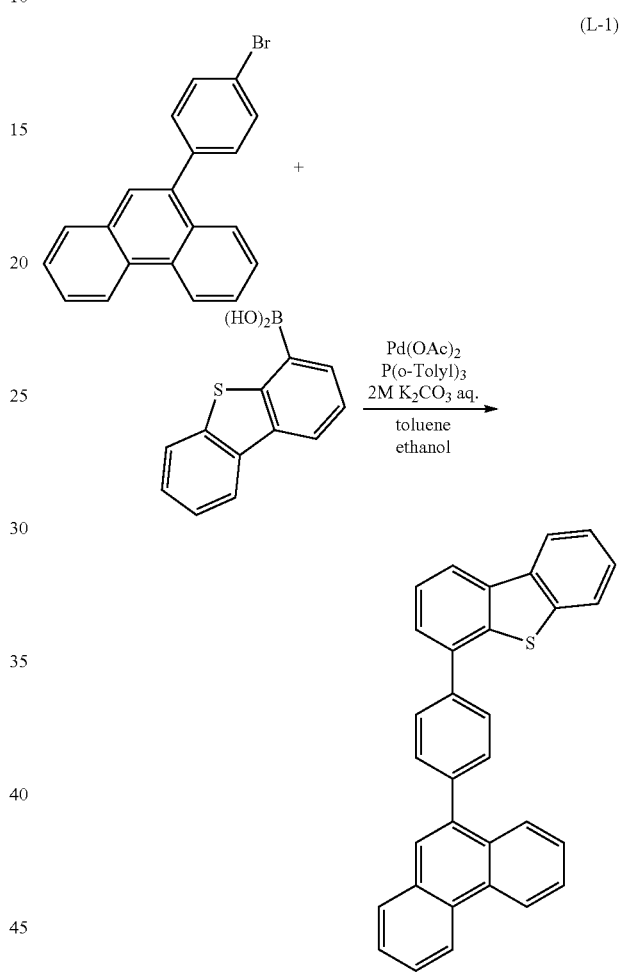

(L-1)

This compound was identified as 4-[4-(9-phenanthryl)phenyl]dibenzothiophene (abbreviation: DBTPPn-II), which was the object of the synthesis, by nuclear magnetic resonance (NMR) spectroscopy.

$^{1}$H NMR data of the obtained compound are as follows: $^{1}$H NMR (CDCl$_3$, 300 MHz): δ (ppm)=7.46-7.53 (m, 2H), 7.58-7.73 (m, 8H), 7.80 (s, 1H), 7.87-7.96 (m, 4H), 8.07 (d, J=8.1 Hz, 1H), 8.18-8.24 (m, 2H), 8.76 (d, J=8.1 Hz, 1H), 8.82 (d, J=7.8 Hz, 1H).

Reference Example 13

A method of synthesizing 4,4'-{(1,1':2',1":2",1'''-)quaterphenyl-3,3'''-yl}bisdibenzothiophene (abbreviation: mZ-DBT2-II) used in the above example will be described.

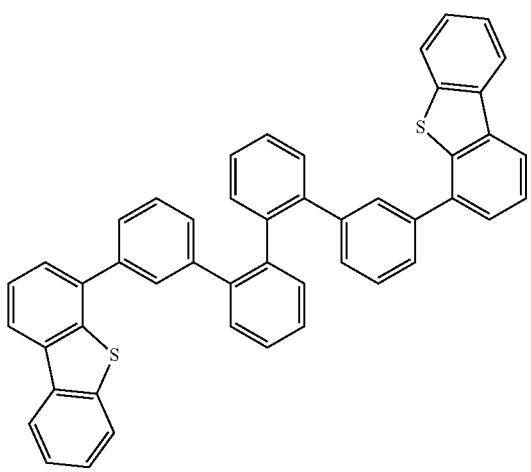

mZ-DBT2-II

In a 200 mL three-neck flask, a mixture of 1.0 g (3.2 mmol) of 2,2'-dibromobiphenyl, 2.1 g (6.7 mmol) of 3-(dibenzothiophen-4-yl)phenylboronic acid, 47 mg (40 μmol) of tetrakis(triphenylphosphine)palladium(0), 20 mL of toluene, 2 mL of ethanol, 7 mL of a 2 mol/L aqueous potassium carbonate solution was degassed while being stirred under reduced pressure, and was then reacted by being stirred and heated at 85° C. for 6 hours and then by being stirred and heated at 100° C. for 6 hours under a nitrogen atmosphere. Further, 47 mg (40 μmol) of tetrakis(triphenylphosphine)palladium(0) was added to the mixture, and the mixture was reacted by being stirred and heated at 100° C. for 2 hours under a nitrogen atmosphere.

After the reaction, 300 mL of toluene was added to this reaction mixture solution, and the organic layer of the mixture solution was filtered through Florisil (produced by Wako Pure Chemical Industries, Ltd., Catalog No. 540-00135), alumina (produced by Merck & Co., Inc., neutral), and Celite (produced by Wako Pure Chemical Industries, Ltd., Catalog No. 531-16855). The obtained filtrate was washed with water, and magnesium sulfate was added thereto so that moisture was adsorbed. This suspension was filtered to obtain a filtrate. The obtained filtrate was concentrated and purified by silica gel column chromatography. At this time, a mixed solvent of toluene and hexane (toluene:hexane=1:5) was used as a developing solvent for the chromatography. The obtained fraction was concentrated, and hexane was added thereto. The mixture was irradiated with ultrasonic waves and then recrystallized, so that the substance which was the object of the synthesis was obtained as 2.2 g of a white powder in a yield of 51%. A reaction scheme of the above synthesis method is illustrated in the following (M-1).

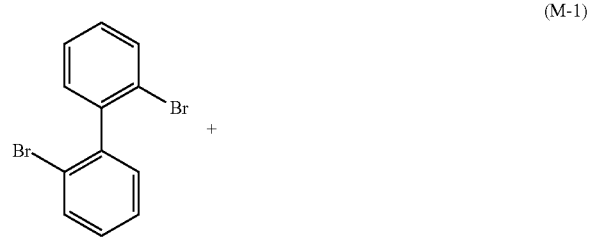

(M-1)

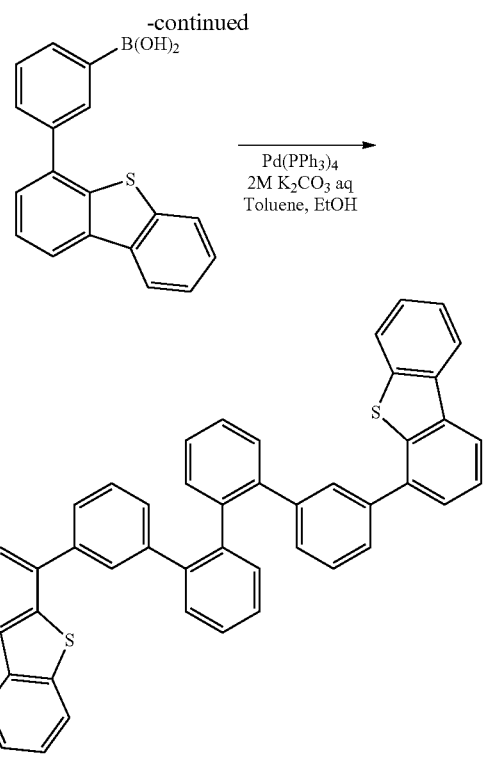

The Rf value of the substance that was the object of the synthesis was 0.25, which was found by silica gel thin layer chromatography (TLC) (with a developing solvent of ethyl acetate and hexane in a 1:10 ratio).

This compound was identified as mZ-DBT2-II, which was the object of the synthesis, by nuclear magnetic resonance (NMR) spectroscopy.

$^1$H NMR data of the obtained compound are as follows: $^1$H NMR (CDCl$_3$, 300 MHz): δ (ppm)=6.73 (td, J=0.98 Hz, 1.95 Hz, 7.4 Hz, 2H), 7.01-7.06 (m, 4H), 7.34-7.39 (m, 4H), 7.41-7.47 (m, 11H), 7.53-7.59 (m, 3H), 7.69-7.72 (m, 2H), 7.98 (dd, J=1.5 Hz, 6.8 Hz, 2H), 8.08-8.11 (m, 2H).

Reference Example 14

A method of synthesizing 4-{3-[3-(9-phenyl-9H-fluoren-9-yl)phenyl]phenyl}dibenzofuran (abbreviation: mmDBF-FLBi-II) used in the above example will be described.

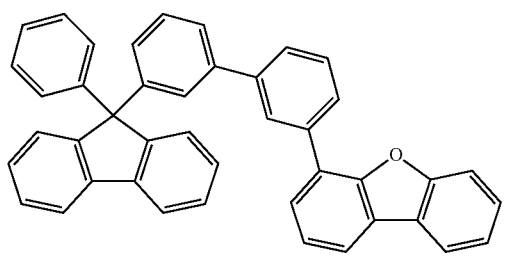

mmDBFFLBi-II

In a 200 mL three-neck flask, a mixture of 3.5 g (8.9 mmol) of 9-(3-bromophenyl)-9-phenylfluorene, 2.8 g (9.8 mmol) of 3-(dibenzofuran-4-yl)phenylboronic acid, 22 mg (0.1 mmol) of palladium(II) acetate, 89.5 mg (0.3 mmol) of tri(ortho-tolyl)phosphine, 38 mL of toluene, 3.8 mL of ethanol, 12.7 mL of a 2 mol/L aqueous potassium carbonate solution was degassed while being stirred under reduced pressure, and was then reacted by being stirred and heated at 80° C. for 15.5 hours under a nitrogen atmosphere.

After the reaction, 300 mL of toluene was added to this reaction mixture solution, and the organic layer of this mixture solution was filtered through alumina (produced by Merck & Co., Inc., neutral) and Celite (produced by Wako Pure Chemical Industries, Ltd., Catalog No. 531-16855). The obtained filtrate was washed with water, and magnesium sulfate was added thereto so that moisture was adsorbed. This suspension was filtered to obtain a filtrate. The obtained filtrate was concentrated and purified by silica gel column chromatography. At this time, a mixed solvent of toluene and hexane (toluene:hexane=2:5) was used as a developing solvent for the chromatography. The obtained fraction was concentrated, and methanol was added thereto. The mixture was irradiated with ultrasonic waves and then recrystallized to give 3.0 g of a white powder in a yield of 60%, which was the object of the synthesis. A reaction scheme of the above synthesis method is illustrated in the following (N-1).

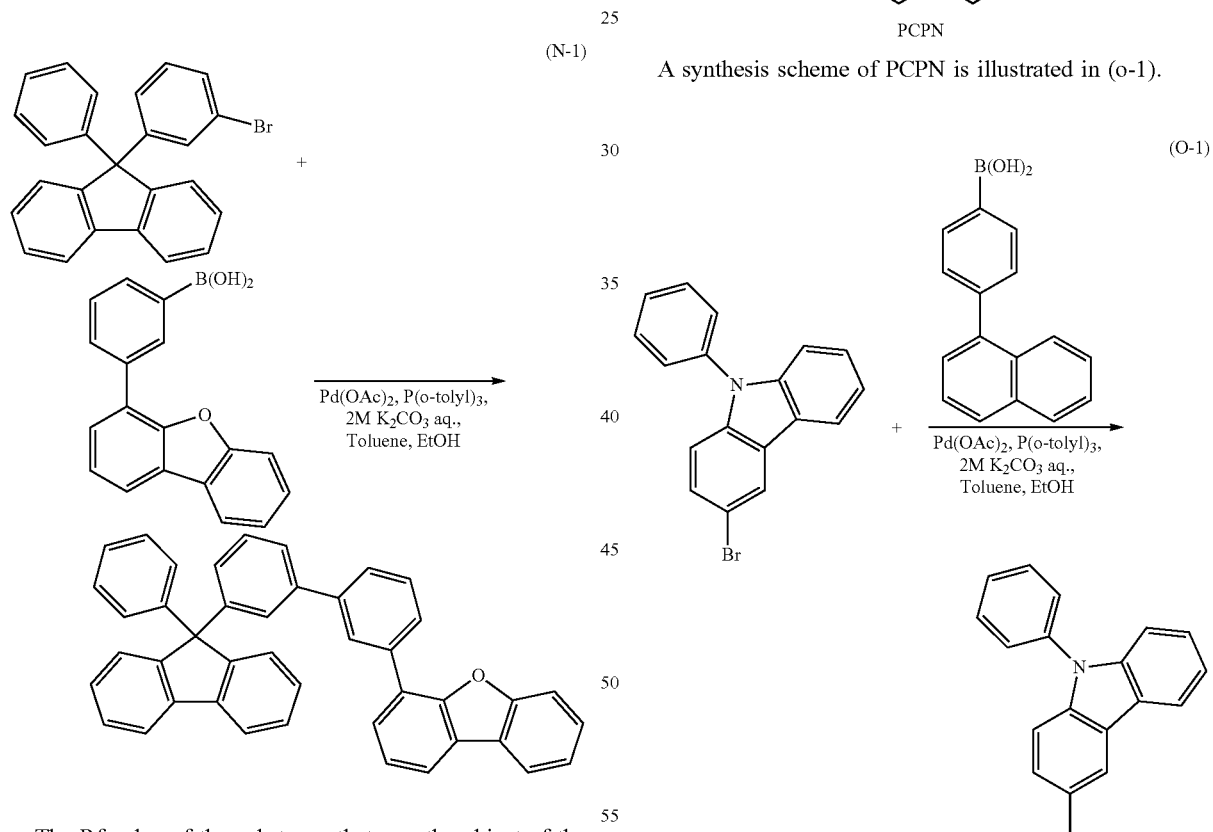

(N-1)

The Rf value of the substance that was the object of the synthesis was 0.33, which was found by silica gel thin layer chromatography (TLC) (with a developing solvent of ethyl acetate and hexane in a 1:10 ratio).

This compound was identified as mmDBFFLBi-II, which was the object of the synthesis, by nuclear magnetic resonance (NMR) spectroscopy.

$^1$H NMR data of the obtained compound are as follows:
$^1$H NMR (CDCl$_3$, 300 MHz): δ (ppm)=7.18-7.60 (m, 22H), 7.78 (d, J=6.4 Hz, 2H), 7.85 (td, 3=1.5 Hz, 7.3 Hz, 1H), 7.96 (dd, J=1.47 Hz, 7.81 Hz, 1H), 7.99-8.00 (m, 2H).

Reference Example 15

A synthesis example of preparing 3-[4-(1-naphthyl)-phenyl]-9-phenyl-9H-carbazole (abbreviation: PCPN) used in the above example will be described.

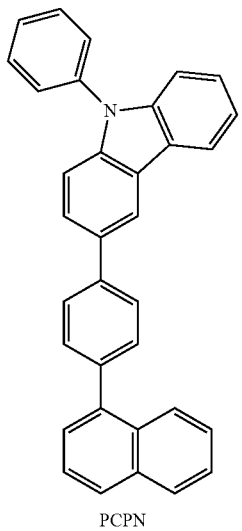

PCPN

A synthesis scheme of PCPN is illustrated in (o-1).

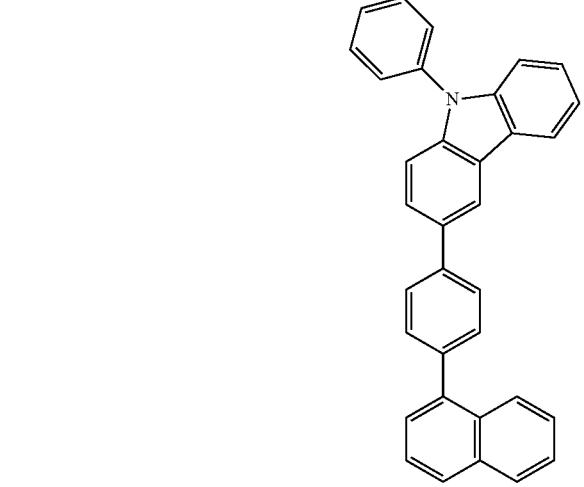

(O-1)

In a 200 mL three-neck flask, a mixture of 5.0 g (15.5 mmol) of 3-bromo-9-phenyl-9H-carbazole, 4.2 g (17.1 mmol) of 4-(1-naphthyl)phenylboronic acid, 38.4 mg (0.2 mmol) of palladium(II) acetate, 104 mg (0.3 mmol) of tri(ortho-tolyl)phosphine, 50 mL of toluene, 5 mL of ethanol, and 30 mL of a 2 mol/L aqueous potassium carbonate solution was degassed while being stirred under reduced pressure, and reacted by being stirred and heated at 85° C. for 9 hours under a nitrogen atmosphere.

After the reaction, 500 mL of toluene was added to this reaction mixture solution, and the organic layer of this mixture solution was filtered through Florisil (produced by Wako Pure Chemical Industries, Ltd., Catalog No. 540-00135), alumina, and Celite (produced by Wako Pure Chemical Industries, Ltd., Catalog No. 531-16855). The obtained filtrate was washed with water, and magnesium sulfate was added thereto so that moisture was adsorbed. This suspension was filtered to obtain a filtrate. The obtained filtrate was concentrated and purified by silica gel column chromatography. At this time, a mixed solvent of toluene and hexane (toluene:hexane=1:4) was used as a developing solvent for the chromatography. The obtained fraction was concentrated, and methanol was added thereto. The mixture was irradiated with ultrasonic waves and then recrystallized to give 6.24 g of a white powder in a yield of 90%, which was the object of the synthesis.

This compound was identified as 3-[4-(1-naphthyl)-phenyl]-9-phenyl-9H-carbazole (abbreviation: PCPN), which was the object of the synthesis, by nuclear magnetic resonance ($^1$H-NMR) spectroscopy.

$^1$H NMR data of the obtained substance are as follows: $^1$H NMR (CDCl$_3$, 300 MHz): δ (ppm)=7.30-7.35 (m, 1H), 7.44-7.67 (m, 14H), 7.76 (dd, J=8.7 Hz, 1.8 Hz, 1H), 7.84-7.95 (m, 4H), 8.04 (d, J=7.8, 1H), 8.23 (d, J=7.8, 1H), 8.46 (d, J=1.5, 1H).

EXPLANATION OF REFERENCE

100: substrate, 101: first electrode, 102: EL layer, 108: second electrode, 401: source side driver circuit, 402: pixel portion, 403: gate side driver circuit, 404: sealing substrate, 405: sealing material, 407: space, 408: wiring, 409: flexible printed circuit (FPC), 410: element substrate, 411: switching TFT, 412: current control TFT, 413: first electrode, 414: insulator, 416: EL layer, 417: second electrode, 418: light-emitting element, 423: n-channel TFT, 424: p-channel TFT, 501: substrate, 502: first electrode, 503: second electrode, 504: EL layer, 505: insulating layer, 506: partition layer, 701: hole-injection layer, 702: hole-transport layer, 703: light-emitting layer, 704: electron-transport layer, 705: electron-injection layer, 706: electron-injection buffer layer, 707: electron-relay layer, 708: composite material layer, 800: EL layer, 801: EL layer, 802: EL layer, 803: charge-generation layer, 811: lighting device, 812: lighting device, 813: desk lamp, 1100: substrate, 1101: first electrode, 1103: second electrode, 1111: hole-injection layer, 1111a: first hole-injection layer, 1111b: second hole-injection layer, 1112: hole-transport layer, 1112a: first hole-transport layer, 1112b: second hole-transport layer, 1113: light-emitting layer, 1113a: first light-emitting layer, 1113b: second light-emitting layer, 1114a: first electron-transport layer, 1114b: second electron-transport layer, 1115: electron-injection layer, 1115a: first electron-injection layer, 1115b: second electron-injection layer, 1116: electron-relay layer, 7100: television device, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7301: housing, 7302: housing, 7303: joint portion, 7304: display portion, 7305: display portion, 7306: speaker portion, 7307: recording medium insertion portion, 7308: LED lamp, 7309: operation key, 7310: connection terminal, 7311: sensor, 7312: microphone, 7400: cellular phone, 7401: housing, 7402: display portion, 7403: operation button, 7404: external connection port, 7405: speaker, 7406: microphone, 7501: lighting portion, 7502: shade, 7503: adjustable arm, 7504: support, 7505: base, and 7506: power switch.

This application is based on Japanese Patent Application serial no. 2010-225037 filed with Japan Patent Office on Oct. 4, 2010 and Japanese Patent Application serial no. 2011-122827 filed with Japan Patent Office on May 31, 2011, the entire contents of which are hereby incorporated by reference.

The invention claimed is:

1. A light-emitting element comprising:

a pair of electrodes;

a light-emitting layer between the pair of electrodes; and a layer including a composite material between the light-emitting layer and one of the pair of electrodes, wherein the composite material comprising:

a heterocyclic compound represented by a general formula (G1):

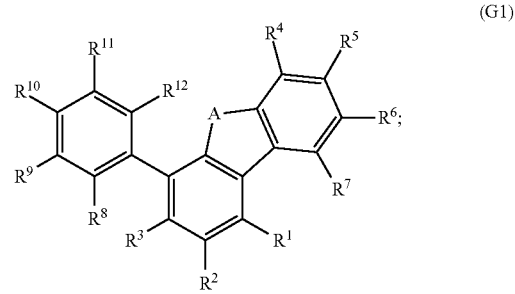

and a transition metal oxide, wherein the transition metal oxide is molybdenum oxide, wherein A represents sulfur, wherein $R^1$ to $R^7$ separately represent one of hydrogen, an alkyl group comprising 1 to 4 carbon atoms, and an aryl group comprising 6 to 25 carbon atoms in a ring, wherein $R^8$, $R^9$, $R^{11}$ and $R^{12}$ represent hydrogen, and wherein $R^{10}$ represents a substituted or unsubstituted fluorenyl group.

2. A light-emitting element comprising:

a pair of electrodes;

a light-emitting layer between the pair of electrodes; and a layer including a composite material between the light-emitting layer and one of the pair of electrodes, wherein the composite material comprising:

a heterocyclic compound represented by a general formula (G1):

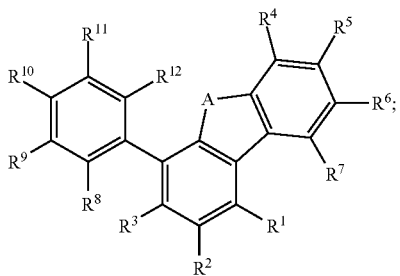

(G1)

and
a transition metal oxide,
wherein the transition metal oxide is vanadium oxide or molybdenum oxide,
wherein A represents one of oxygen and sulfur,
wherein $R^1$ to $R^7$ separately represent one of hydrogen, an alkyl group comprising 1 to 4 carbon atoms, and an aryl group comprising 6 to 25 carbon atoms in a ring,
wherein $R^8$, $R^9$, $R^{11}$ and $R^{12}$ represent hydrogen, and
wherein $R^{10}$ represents a substituted or unsubstituted fluorenyl group.

3. The light-emitting element according to claim 1 or 2, wherein the heterocyclic compound has a dibenzothiophene skeleton.

4. The light-emitting element according to claim 1 or 2, wherein the layer is in contact with the one of the pair of electrodes.

5. The light-emitting element according to claim 1 or 2, further comprising:
a second light-emitting layer between the other of the pair of electrodes and the light-emitting layer; and
a second layer including the composite material between the light-emitting layer and the second light-emitting layer.

6. The light-emitting element according to claim 1 or 2, wherein the heterocyclic compound and the transition metal oxide are mixed.

7. A light-emitting device comprising the light-emitting element according to claim 1 or 2.

8. The light-emitting element according to claim 1 or 2, wherein an absorption of the composite material at the visible light region is lower than that of the heterocyclic compound.

* * * * *